United States Patent
Lee et al.

(10) Patent No.: US 10,823,779 B2
(45) Date of Patent: Nov. 3, 2020

(54) APPARATUS AND METHOD FOR MANUFACTURING SUBSTRATES

(71) Applicant: Samsung Electronics Co., Ltd., Suwon-si (KR)

(72) Inventors: Youngchul Lee, Asan-si (KR); Semin Kwon, Asan-si (KR); JinHwan Lee, Cheonan-si (KR); Jea-Muk Oh, Asan-si (KR); Kyungsook Lee, Daejeon (KR); Nam-Hong Lee, Cheonan-si (KR)

(73) Assignees: Samsung Electronics Co., Ltd. (KR); Semes Co., Ltd. (KR)

( * ) Notice: Subject to any disclaimer, the term of this patent is extended or adjusted under 35 U.S.C. 154(b) by 240 days.

(21) Appl. No.: 15/964,842

(22) Filed: Apr. 27, 2018

(65) Prior Publication Data

US 2018/0246164 A1   Aug. 30, 2018

Related U.S. Application Data

(60) Continuation of application No. 15/015,582, filed on Feb. 4, 2016, now Pat. No. 9,995,787, which is a
(Continued)

(30) Foreign Application Priority Data

| Apr. 2, 2012 | (KR) | 10-2012-0033785 |
| Apr. 2, 2012 | (KR) | 10-2012-0033786 |
| Jul. 24, 2012 | (KR) | 10-2012-0080715 |

(51) Int. Cl.
   *G01R 31/26* (2020.01)
   *H05K 13/02* (2006.01)
(Continued)

(52) U.S. Cl.
   CPC ....... *G01R 31/2893* (2013.01); *G01R 1/0433* (2013.01); *G01R 31/2808* (2013.01)

(58) Field of Classification Search
   CPC ...... G01R 31/26; G01R 31/281; G01R 31/31; G01R 31/2805; G01R 31/2806; G01R 31/2808; G01R 31/2889
   See application file for complete search history.

(56) References Cited

U.S. PATENT DOCUMENTS

| 4,725,182 A | 2/1988 | Sakamoto et al. |
| 5,094,584 A | 3/1992 | Bullock |
(Continued)

FOREIGN PATENT DOCUMENTS

| CN | 1975404 | 6/2007 |
| JP | 59181631 | 10/1984 |
(Continued)

OTHER PUBLICATIONS

Chinese Office Action dated Mar. 5, 2019 issued in corresponding Chinese Application No. 201710364216.
(Continued)

*Primary Examiner* — Neel D Shah
(74) *Attorney, Agent, or Firm* — Onello & Mello, LLP

(57) ABSTRACT

A substrate manufacturing apparatus includes a test apparatus including a test handler module for performing a test process on a substrate. The test handler module may include a conveyor unit to transfer a substrate, a handler unit for performing a test process on the substrate, and a transfer unit for transferring the substrate between the conveyor unit and the handler unit. The conveyor unit may include a feed conveyor and a discharge conveyor spaced apart from the feed conveyor.

20 Claims, 45 Drawing Sheets

Related U.S. Application Data division of application No. 13/799,146, filed on Mar. 13, 2013, now Pat. No. 9,285,416.

(51) Int. Cl.
  *B65G 1/04* (2006.01)
  *G01R 31/28* (2006.01)
  *G01R 1/04* (2006.01)

(56) References Cited

U.S. PATENT DOCUMENTS

| | | | |
|---|---|---|---|
| 5,510,724 | A | 4/1996 | Itoyama et al. |
| 6,046,421 | A | 4/2000 | Ho |
| 6,163,146 | A * | 12/2000 | Suzuki ............... G01R 31/316 324/756.02 |
| 6,218,852 | B1 | 4/2001 | Smith et al. |
| 6,292,003 | B1 | 9/2001 | Fredrickson et al. |
| 6,411,079 | B1 | 6/2002 | Nishikawa |
| 6,469,496 | B1 | 10/2002 | Khouw et al. |
| 6,547,571 | B2 | 4/2003 | Allen et al. |
| 6,970,007 | B2 | 11/2005 | Miyakita |
| 7,656,180 | B2 | 2/2010 | Lee et al. |
| 8,406,503 | B2 | 3/2013 | Ueda |
| 2005/0001278 | A1 | 1/2005 | Chen et al. |
| 2007/0007645 | A1 | 1/2007 | Yoon |
| 2007/0075719 | A1 | 4/2007 | Chung et al. |
| 2007/0126454 | A1 | 6/2007 | Han |
| 2007/0228926 | A1 | 10/2007 | Teo et al. |
| 2008/0139024 | A1 * | 6/2008 | Lee ................... G01R 31/2817 439/153 |
| 2008/0273299 | A1 | 11/2008 | Tsai et al. |
| 2010/0115763 | A1 * | 5/2010 | Kim ..................... H01L 24/81 29/740 |
| 2010/0189340 | A1 | 7/2010 | Ueda |
| 2010/0253362 | A1 | 10/2010 | Tan et al. |
| 2010/0289156 | A1 | 11/2010 | Iguchi et al. |
| 2011/0102997 | A1 | 5/2011 | Schuette |
| 2011/0232082 | A1 | 9/2011 | Kim et al. |
| 2012/0087099 | A1 * | 4/2012 | Moon ..................... H01L 23/13 361/783 |
| 2012/0146673 | A1 | 6/2012 | Kim et al. |

FOREIGN PATENT DOCUMENTS

| | | |
|---|---|---|
| JP | 10189628 | 7/1998 |
| JP | 2007110169 | 4/2007 |
| JP | 2010199564 | 9/2010 |
| KR | 20100049376 | 5/2010 |
| KR | 101133936 | 4/2012 |

OTHER PUBLICATIONS

"Apparatus and Method for Manufacturing Substrates" Specification, Drawings, and Prosecution History of U.S. Appl. No. 13/799,146, filed May 13, 2013, now U.S. Pat. No. 9,285,416, issued Mar. 15, 2016 by Youngchul Lee, et al., which is stored in the United States Patent and Trademark Office (USPTO).

"Apparatus and Method for Manufacturing Substrates" Specification, Drawings, and Prosecution History of U.S. Appl. No. 15/015,582, filed Feb. 4, 2016, by Youngchul Lee, et al., which is stored in the United States Patent and Trademark Office (USPTO).

* cited by examiner

APPARATUS AND METHOD FOR MANUFACTURING SUBSTRATES

CROSS-REFERENCE TO RELATED APPLICATIONS

This U.S. Continuation Patent Application claims priority to U.S. patent application Ser. No. 15/015,582, filed on Feb. 4, 2016, which is a Divisional of U.S. patent application Ser. No. 13/799,146, filed on Mar. 13, 2013, now U.S. Pat. No. 9,285,416, issued on Mar. 15, 2016, which claims priority under 35 USC § 119 to Korean Patent Application No. 10-2012-0033785, filed on Apr. 2, 2012, No. 10-2012-0033786, filed on Apr. 2, 2012, and No. 10-2012-0080715, filed on Jul. 24, 2012, the entireties of which are hereby incorporated by reference.

BACKGROUND

Exemplary embodiments in accordance with principles of inventive concepts relate to substrate manufacturing methods and apparatuses and, more particularly, to a substrate manufacturing method and a substrate manufacturing apparatus, including an apparatus for performing a test process on a printed circuit board (PCB).

The use of high-capacity storage devices employing nonvolatile memory devices has been increasing with the advance in semiconductor manufacturing technologies. A solid-state drive (SSD) is an example of high-capacity storage device that may employ both a volatile memory and a nonvolatile memory.

An SSD may be fabricated by mounting various types of devices (e.g., an integrated circuit device used as a controller, a volatile memory device used as a buffer memory, a nonvolatile memory device used as a high-capacity storage device, etc.) on a PCB.

SUMMARY

Exemplary embodiments in accordance with principles of inventive concepts include a substrate manufacturing apparatus and method.

In accordance with principles of inventive concepts, a substrate manufacturing apparatus includes a test apparatus including a test handler module for performing a test process on a substrate, wherein the test handler module includes a conveyor unit to transfer a substrate, a handler unit to perform the test process on a plurality of unit substrates on the substrate, and a transfer unit to transfer the substrate between the conveyor unit and the handler unit, wherein the conveyor unit includes a feed conveyor and a discharge conveyor spaced apart from the feed conveyor.

In an exemplary embodiment in accordance with principles of inventive concepts, a substrate manufacturing apparatus includes a feed conveyor that extends parallel to a first direction, and a discharge conveyor is spaced apart from the feed conveyor in a second direction orthogonal to the first direction, when viewed from the top, and the discharge conveyor extends parallel to the first direction.

In an exemplary embodiment in accordance with principles of inventive concepts, a substrate manufacturing apparatus includes a loader module including a discharge conveyor and an unloader module including a carry-out conveyor, wherein the loader module, the test handler module, and the unload module are sequentially arranged in the first direction; the feed conveyor is provided to directly receive a substrate from the carry-out conveyor; and the discharge conveyor is provided to directly take over the substrate to the unload conveyor.

In an exemplary embodiment in accordance with principles of inventive concepts, a substrate manufacturing apparatus includes a feed conveyor that is closer to the loader module than the discharge conveyor, and a discharge conveyor is closer to the unloader module than the feed conveyor.

In an exemplary embodiment in accordance with principles of inventive concepts, a substrate manufacturing apparatus includes a feed conveyor that includes a winding portion that is downwardly concave, wherein a transfer unit includes a feed lift member to face the winding portion of the feed conveyor, wherein a transfer robot includes a load arm to receive a substrate from the feed lift member, and wherein a feed lift member is provided to lift the substrate from the feed conveyor through the winding portion of the feed conveyor.

In an exemplary embodiment in accordance with principles of inventive concepts, substrate manufacturing apparatus includes a transfer unit that includes a fixed plate; a load arm supported on the fixed plate; and an unload arm supported on the fixed plate, wherein the load arm and the unload arm are spaced apart from each other in the second direction.

In an exemplary embodiment in accordance with principles of inventive concepts, a substrate manufacturing apparatus includes a transfer unit that includes a transfer robot including a pickup head, wherein the pickup head comprises: a plate; and a contact member protruding downwardly from a bottom face of the plate to contact a substrate, wherein the contact member includes: a front contact portion in a front edge area of the plate; and a side contact portion in both side edge areas of the plate, and wherein a backwardly and downwardly open insert space is formed at a lower portion of the plate by the front contact portion and the side contact portion.

In an exemplary embodiment in accordance with principles of inventive concepts, a substrate manufacturing apparatus includes a handler unit that comprises: a housing having an internal space; a test chamber disposed within the internal space and in which a test process may be performed; and a test instrument combined with a socket of the test chamber, wherein a circulation space is provided in the internal space of the housing to surround the test chamber, wherein an opening is formed at a side face of the test chamber to communicate with the circulation space, and wherein the handler unit further comprises a temperature controller to control the temperature of a gas in the circulation space.

In an exemplary embodiment in accordance with principles of inventive concepts, a substrate manufacturing apparatus includes a handler unit that comprises a test chamber to perform a test process, wherein the test chamber comprises: a body having an internal space; a door to open and close the internal space; a socket pad electrically connectable to a substrate; and a support to support the substrate inside the body during a test process, and wherein the support is fixedly coupled to the door and the door is slidable from the body.

In an exemplary embodiment in accordance with principles of inventive concepts, a substrate manufacturing apparatus includes a transfer unit that comprises: a transfer robot to transfer a substrate to a test chamber; and a door opener to open and close the internal space, wherein the door opener is mounted on the transfer robot.

In an exemplary embodiment in accordance with principles of inventive concepts, a substrate manufacturing apparatus includes a door that is provided with a doorknob where a through-hole is formed, and wherein the door opener comprises: a latch that is insertable into the through-hole of the doorknob; and a latch driver to move the latch between a locking position where the latch is inserted into the doorknob and a release position where the latch is separated from the doorknob.

In an exemplary embodiment in accordance with principles of inventive concepts, a substrate manufacturing apparatus includes a plurality of sets of handler units provided in a first direction, wherein a plurality of handler units are provided to the respective sets of handler units in a second direction, and wherein a transfer unit is disposed in front of respective sets of handler units.

In an exemplary embodiment in accordance with principles of inventive concepts, a substrate manufacturing apparatus includes a loader module that includes an electric test unit to test a substrate; an input unit to convey a substrate to the electric test unit; and an output unit to receive the substrate from the electric test unit.

In an exemplary embodiment in accordance with principles of inventive concepts, a substrate manufacturing apparatus includes: a first apparatus, a second apparatus, wherein the first apparatus, the test apparatus, and the second apparatus are sequentially disposed in line, wherein the first apparatus comprises: a mount module to mount a device on a substrate; and a reflow module to perform a reflow process on the substrate on which the device is mounted, and wherein the second apparatus comprises a separating module to separate the plurality of unit substrates.

In an exemplary embodiment in accordance with principles of inventive concepts, a substrate manufacturing method includes: moving a substrate including a plurality of unit substrates, where a test terminal is formed, along a feed conveyor; lifting the substrate at the feed conveyor such that the substrate is disposed inside a test chamber to insert the test terminal into a socket of the test chamber; performing a test process on the substrate inside the test chamber; and placing the substrate tested inside the test chamber on a discharge conveyor.

In an exemplary embodiment in accordance with principles of inventive concepts, a substrate manufacturing method includes a feed conveyor and discharge conveyor provided such that they extend parallel to a first direction, and wherein the feed conveyor and the discharge conveyor are spaced apart from each other in a second direction orthogonal to the first direction when viewed from the top.

In an exemplary embodiment in accordance with principles of inventive concepts, a substrate manufacturing method includes the substrate being lifted from a feed conveyor by a feed lift member to be conveyed to a load arm of a transfer robot and transferred into a test chamber by the load arm, and wherein the substrate is conveyed to a discharge lift member from the test chamber by an unload arm of the transfer robot and placed on the discharge conveyor by the discharge lift member.

In an exemplary embodiment in accordance with principles of inventive concepts, a substrate manufacturing method includes the substrate being transferred into a test chamber by a load arm of a transfer robot, wherein the load arm includes a pickup head having a lower portion where a backwardly and downwardly open insert space is formed; wherein an edge region of the substrate is in contact with a bottom face of a contact member surrounding the insert space to define the insert space, and the load arm supports the substrate while the device mounted on the substrate remains within the insert space.

In an exemplary embodiment in accordance with principles of inventive concepts, a substrate manufacturing method includes the substrate being provided in plurality, wherein the substrates have the same length of horizontal sides, and wherein some of the substrates have different lengths of vertical sides.

In an exemplary embodiment in accordance with principles of inventive concepts, a substrate manufacturing method includes the substrate being an array printed circuit board where a plurality of unit substrates are formed, wherein a test terminal is formed in a front edge region of the array printed circuit board, and wherein each of the unit substrates is electrically connected to the test terminal through lines formed on the array printed circuit board.

In an exemplary embodiment in accordance with principles of inventive concepts, a method of manufacturing an electronic component includes conveying a substrate that includes a plurality of unit substrates to a test station; loading the substrate into the test chamber; the test chamber performing a test upon unit substrates on the substrate; and conveying the substrate away from the test chamber after performing the test.

In an exemplary embodiment in accordance with principles of inventive concepts, a method of manufacturing an electronic component includes the step of marking a unit substrate to indicate whether it passed a test.

In an exemplary embodiment in accordance with principles of inventive concepts, a method of manufacturing an electronic component includes the step of assembling a plurality of unit substrates on a substrate, each unit substrate comprising an electronic component, before conveying the substrate to the test station.

In an exemplary embodiment in accordance with principles of inventive concepts, a method of manufacturing an electronic component includes the step of separating unit substrates from one another after performing the test.

In an exemplary embodiment in accordance with principles of inventive concepts, a method of manufacturing an electronic component includes the step of assembling a plurality of unit substrates including the step of loading a controller on each unit substrate.

In an exemplary embodiment in accordance with principles of inventive concepts, a method of manufacturing an electronic component includes the step of assembling a plurality of unit substrates including the step of loading non-volatile memory on each unit substrate.

In an exemplary embodiment in accordance with principles of inventive concepts, a method of manufacturing an electronic component includes the step of assembling a plurality of unit substrates including the step of assembling a solid state drive (SSD) within each unit substrate.

In an exemplary embodiment in accordance with principles of inventive concepts, a transfer unit further comprises a stopper member, including a blocking plate and driver to elevate the blocking plate, to stop the movement of the substrate at the feed conveyor.

In an exemplary embodiment in accordance with principles of inventive concepts, a handler unit comprises a test chamber to perform a test process, wherein the test chamber comprises: a body having an internal space; a door to open and close the internal space; a socket pad electrically connectable to a substrate; and a support to support the substrate in the internal space during a test process, and wherein the support is fixedly coupled to the door and the door is slidable from the body.

In an exemplary embodiment in accordance with principles of inventive concepts, a support includes an alignment pin insertable into a through-hole formed at the substrate.

In an exemplary embodiment in accordance with principles of inventive concepts, a substrate manufacturing apparatus includes a plurality of stacked electric test units, wherein the input unit comprises: a carry-in conveyor; an input holder to hold the carry-in conveyor; and an input elevation member to elevate the input holder to a height corresponding to that of a selected one of the plurality of electric test units, and wherein the output unit comprises: a carry-out conveyor; an output holder to hold the carry-out conveyor; and an output elevation member to elevate the output holder to a height corresponding to a selected one of the plurality of electric test units.

In an exemplary embodiment in accordance with principles of inventive concepts, in a substrate manufacturing apparatus a loader module comprises a buffer magazine to store a failed substrate, and wherein the input unit further comprises a gripper member mounted on the input holder to transfer a substrate to the buffer magazine.

In an exemplary embodiment in accordance with principles of inventive concepts, in a substrate manufacturing apparatus, the substrate is an array printed circuit board.

In an exemplary embodiment in accordance with principles of inventive concepts, a substrate manufacturing method comprises: opening a door of the test chamber with an opener mounted on the transfer robot before transferring the substrate into the test chamber.

In an exemplary embodiment in accordance with principles of inventive concepts, in a substrate manufacturing method a unit substrate is a solid-state drive (SSD).

BRIEF DESCRIPTION OF THE DRAWINGS

Inventive concepts will become more apparent in view of the attached drawings and accompanying detailed description. The embodiments depicted therein are provided by way of example, not by way of limitation. The drawings are not necessarily to scale, emphasis instead being placed upon illustrating aspects of inventive concepts.

DETAILED DESCRIPTION

Figure 1:
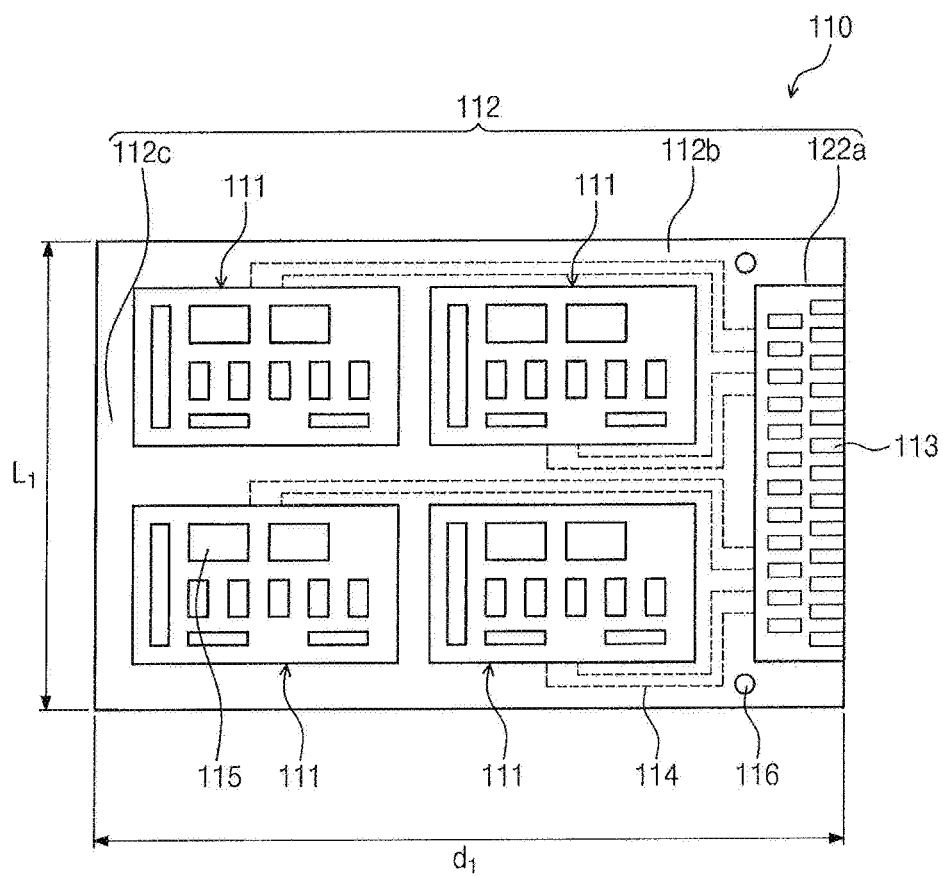
FIG. 1 illustrates an exemplary embodiment of a substrate in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

An exemplary embodiment of a substrate in accordance with principles of inventive concepts is illustrated in the schematic diagram of FIG. 1. A substrate 110 may be an array printed circuit board (hereinafter referred to as "array PCB"), for example, and may have a substantially rectangular shape. The array PCB 110 may include a plurality of unit substrates 111. Each of the unit substrates 111 may also be rectangular. In an exemplary embodiment in accordance with principles of inventive concepts, each of the unit substrates 111 may be a solid state drive (SSD). An integrated circuit device used as a controller, a volatile memory device used as a buffer memory, and a nonvolatile memory device used as a high-capacity storage device as well as various types of devices 115 may be mounted on each of the unit substrates 111. The unit substrates 111 are provided in a center area of the array PCB 110. In an exemplary embodiment in accordance with principles of inventive concepts, four unit substrates 111 may be provided and the unit substrates 111 may be provided in two rows of two.

In an exemplary embodiment in accordance with principles of inventive concepts array PCB 110 has edge areas 112. The edge areas 112 may include a front edge area 112a, two side edge areas 112b, and a back edge area 113c, for example. In an exemplary embodiment in accordance with principles of inventive concepts the front edge area 112a and the back edge area 112c correspond to horizontal sides of the array PCB 110, and the two side edge areas 112b correspond to vertical sides of the array PCB 110. Test terminals 113 may be provided in the front edge area 112a of the array PCB 110 and through-holes 116 may be formed at both sides of the test terminals 113. Lines 114 may be formed on the array PCB 110 to electrically connect devices 115 mounted on each of the unit substrates 111 to the test terminals 113.

Figure 2:
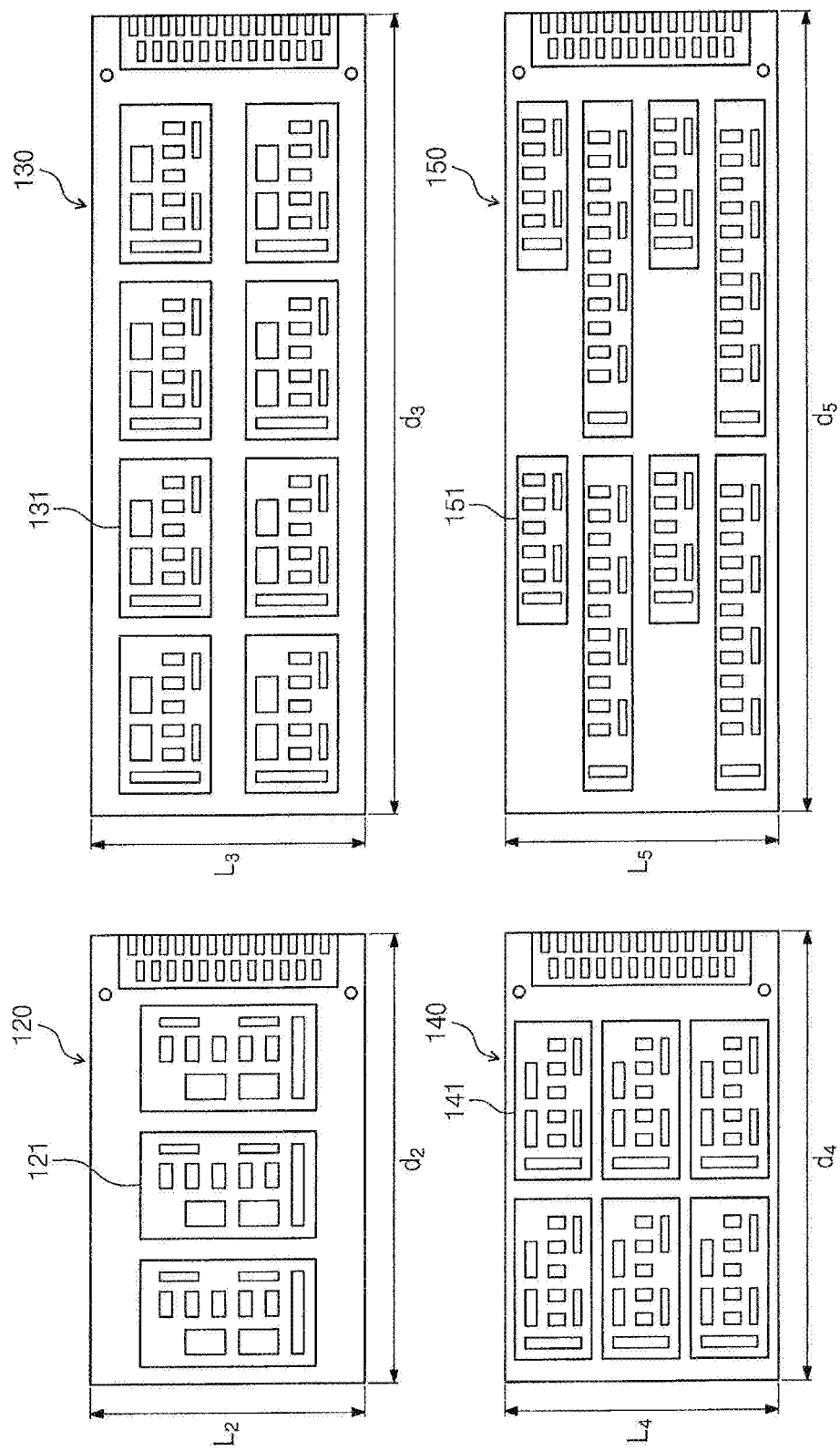
FIG. 2 illustrates other exemplary embodiments of the substrate illustrated in FIG. 1.

As illustrated by the various exemplary embodiments of array PCBs in accordance with principles of inventive concepts illustrated in FIG. 2, the number and arrangement of unit substrates provided on an array PCB may vary. For example, an array PCB 120 may include three unit substrates 121, and the unit substrates 121 may be provided in a row. Alternatively, an array PCB 130 may include eight unit substrates 131, and the unit substrates 131 may be provided in two rows of four. Alternatively, an array PCB 140 may include six unit substrates 141, and the unit substrates 141 may be provided in three rows of two. The unit substrates 111, 121, 131, and 141 provided on the array PCB 110, 120, 130, and 140 may be all the same type. Alternatively, some of unit substrates 151 provided on an array PCB 150 may be different types.

In an exemplary embodiment, some of array PCBs may have the same vertical and horizontal lengths. Some of array PCBs may have equal-length horizontal sides, while their vertical sides have different lengths. For example, the array PCBs 110, 120, 130, 140, and 150 may be provided such that their horizontal sides have the same length (L1=L2=L3=L4=L5). In addition, the array PCBs 110, 120, and 140 may be provided such that their vertical sides have the same length, the array PCBs 130 and 150 may be provided such that their vertical sides have the same lengths, and the array PCB 130 may be provided such that its vertical sides have different lengths (d1=d2=d4<d3=d5).

In exemplary embodiments in accordance with principles of inventive concepts set forth below, there will be described an exemplary embodiment in which a substrate manufacturing apparatus performs a process on an array PCB 110. The substrate manufacturing apparatus may also perform such a process on the different types of array PCBs, including array PCBs 120, 130, 140, and 150. In addition, in an exemplary embodiment in accordance with principles of inventive concepts the substrate manufacturing apparatus may concurrently perform a process on the different types of array PCBs 120, 130, 140, and 150.

Figure 3:
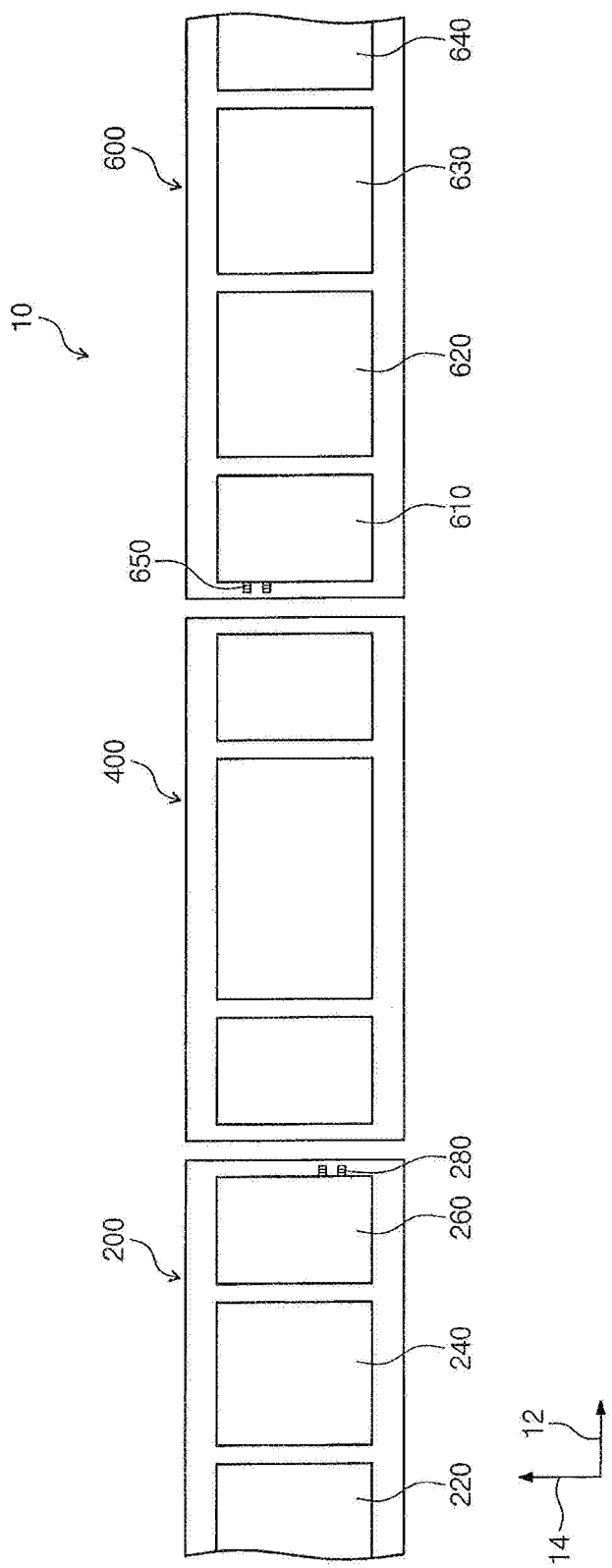
FIG. 3 is a top plan view illustrating a schematic configuration of a substrate manufacturing apparatus in accordance with principles of inventive concepts.

FIG. 3 is a top plan view illustrating a schematic configuration of a substrate manufacturing apparatus 10 according to an exemplary embodiment in accordance with principles of inventive concepts.

Referring to FIG. 3, an exemplary substrate manufacturing apparatus 10 in accordance with principles of inventive concepts includes a first apparatus 200, a test apparatus 400, and a second apparatus 600. The first apparatus 200, the test apparatus 400, and the second apparatus 600 may be sequentially arranged in a row, for example. The first apparatus 200, the test apparatus 400, and the second apparatus 600 are in-line connected to each other. In accordance with principles of inventive concepts, a substrate 110 may be successively fed to the first apparatus 200, the test apparatus 400, and the second apparatus 600.

Hereinafter, an arrangement direction of the first apparatus 200, the test apparatus 400, and the second apparatus 600 will be referred to as a first direction 12. When viewed from the top, a direction perpendicular to the first direction 12 will be referred to as a second direction 14 and a direction perpendicular to the first direction 12 and the second direction 14 will be referred to as a third direction 16.

In accordance with principles of inventive concepts, first apparatus 200 performs a first process on an array PCB 110, the test apparatus 400 performs a test process on the array PCB 110, and the second apparatus 600 performs a second process on the array PCB 110. The first process, the test process, and the second process may be processes that are sequentially performed on the array PCB 110. The first process may include an assembly process to assemble devices 115 on each unit substrate 111 and the second process may include separating unit substrates, for example, by a cutting process to individualize a plurality of unit substrates 110 on the array PCB 110, for example.

In accordance with principles of inventive concepts, the first apparatus 200 may include a mount module 220, a reflow module 240, and an unloader module 260. The mount module 220, the reflow module 240, and the unloader module 260 may be sequentially disposed in the first direction 12. The unloader module 260 may be disposed adjacent to the test apparatus 400. In an exemplary embodiment in accordance with principles of inventive concepts, mount module 220 mounts the devices 115 on each of the unit substrates 111 of the array PCB 110. The reflow module 240 may bond solder balls of the respective devices 115 to a pad of the PCB 110 through heating, for example. The unloader module 260 hands over the assembled array PCB 110 to the test apparatus 400. The mount module 220, the reflow module 240, and the unloader module 260 may each include a conveyor member 280, for example. The conveyor member 280 sequentially conveys the array PCB 110 to the mount module 220, the reflow module 240, and the unloader module 260 and then conveys the assembled and reflow-completed array PCB 110 to the test apparatus 400.

The second apparatus 600 may include a loader module 610, a cutting module 620, a labeling module 630, and a casing module 640. In an exemplary embodiment in accordance with principles of inventive concepts, the loader module 610, the cutting module 620, the labeling module 630, and the casing module 640 are sequentially disposed in the first direction 12. The loader module 610 may be disposed adjacent to the test apparatus 400, for example, and may receive array PCB 110 from the test apparatus 400. The cutting module 620 performs a cutting process to separate the respective unit substrates 110 from the array PCB 110. In an exemplary embodiment in accordance with principles of inventive concepts, labeling module 630 performs a labeling process to label the respective unit substrates 110 and casing module 640 performs a casing process to case the respective unit substrates 110. The loader module 610, the cutting module 620, the labeling module 630, and the casing module 640 may each include a conveyor member 650. The conveyor member 650 receives the array PCB 110 from the test apparatus 400 and sequentially conveys the array PCB 110 or the unit substrates 110 to the loader module 610, the cutting module 620, the labeling module 630, and the casing module 640.

In an exemplary embodiment in accordance with principles of inventive concepts, test apparatus 400 includes a loader module 1200, a test handler module 1300, and an unloader module 1800. The loader module 1200, the test handler module 1300, and the unloader module 1800 may be sequentially provided in a row in the first direction 12. The loader module 1200 is disposed adjacent to the first apparatus 200, and the unloader module 1800 is disposed adjacent to the second apparatus 600.

Figure 4:
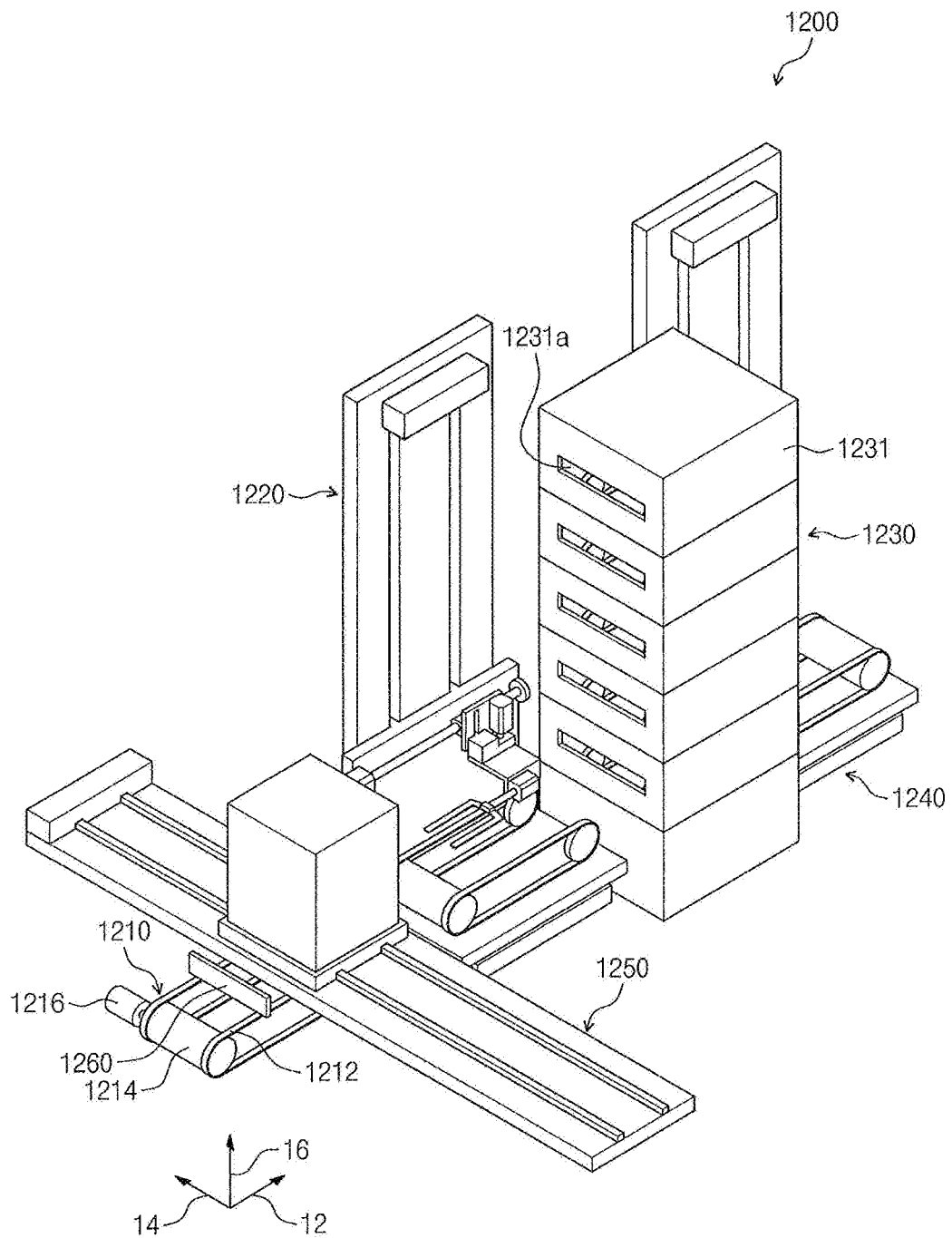
FIG. 4 is a perspective view illustrating an exemplary embodiment of a loader module in FIG. 3.

An exemplary embodiment of a loader module 1200 in accordance with principles of inventive concepts is illustrated in the perspective view of FIG. 4. Loader module 1200 includes an input conveyor 1210, an input unit 1220, an electric test unit 1230 (which may carry out a variety of electric tests, including electronic and electrical tests, for example), an output unit 1240, and a buffer magazine unit 1250. The input conveyor 1210, the input unit 1220, the electric test unit 1230, and the output unit 1240 may be sequentially disposed in first direction 12.

The input conveyor 1210 is aligned with a conveyor member 280 of a first apparatus 200. The input conveyor 1210 may be provided to directly receive an array PCB 110 from the conveyor member 280. The input conveyor 1210 may include a pair of belts 1212, a pair of rollers 1214, and a driver 1216. The pair of belts 1212 may be disposed to be spaced apart from each other in the second direction 14. The pair of rollers 1214 are spaced apart from each other in the first direction 12. Each of the belts 1212 is disposed to cover the pair of rollers 1214. The driver 1216 provides a rotational force to one of the rollers 1214. The driver 1216 may include a motor.

A front edge area 112a of the array PCB 110 may be input to the test apparatus from the first apparatus, prior to a back edge area 112c of the array PCB 110. In addition, a side edge area 112b of the array PCB 110 may come in contact with the belt 1212.

The electric test unit 1230 may test, for example, whether the array PCB 110 had been properly assembled. A plurality of electric test units 1230 may be stacked in a third direction 16 and each of them may have the same configuration.

Figure 5:
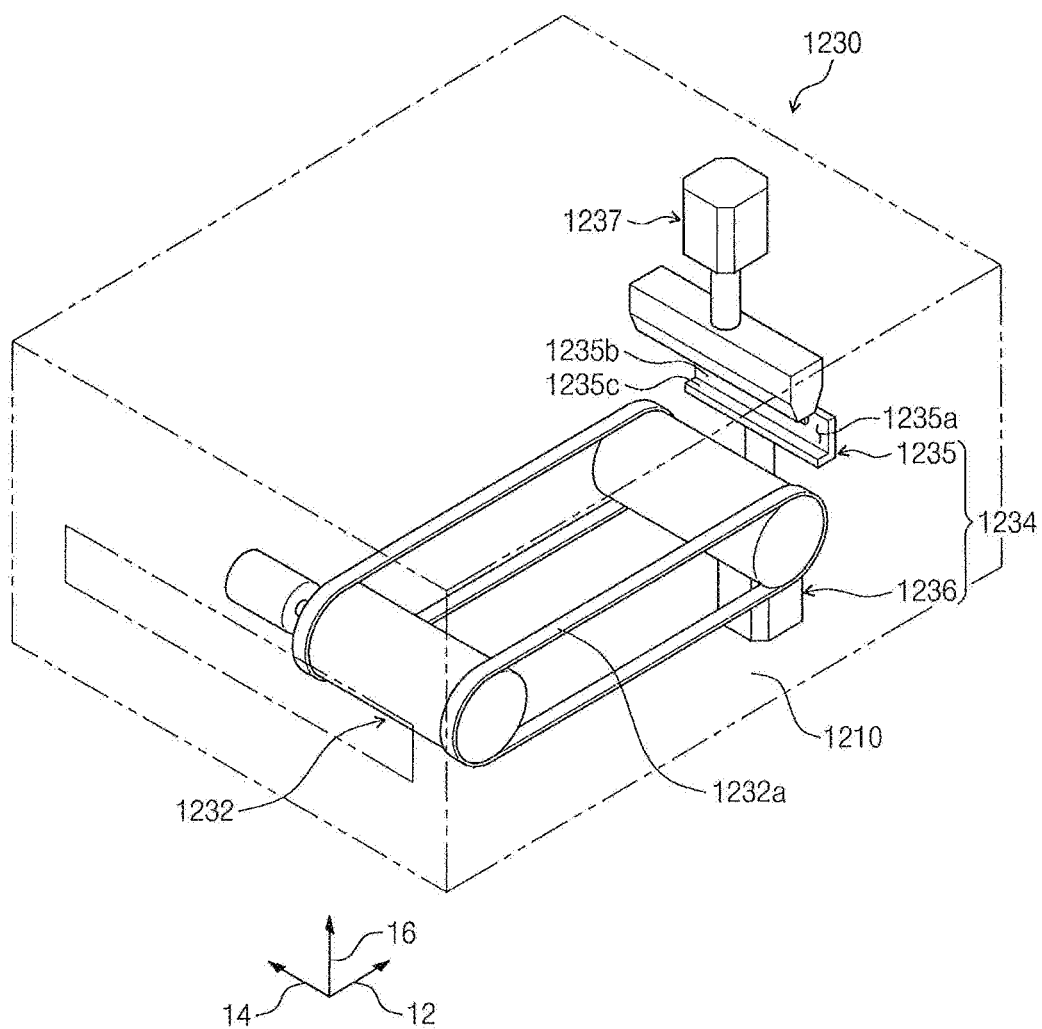
FIG. 5 is a perspective view illustrating an exemplary embodiment of an electric test unit in FIG. 4.

An exemplary embodiment of an electric test unit 1230 in accordance with principles of inventive concepts is illustrated in the perspective view of FIG. 5. Electric test unit 1230 includes a housing 1231, a test conveyor 1232, a stopper member 1234, and a test instrument 1237.

In this exemplary embodiment, housing 1231 has a substantially rectangular parallelepiped shape. Apertures 1231a (see FIG. 6, for example) are formed at a front face and a back surface of the housing 1231. In operation, array PCB 110 enters and leaves through the apertures 1231a. The test conveyor 1232, the stopper member 1234, and the test instrument 1237 are disposed inside the housing 1231.

The test conveyor 1232 may include a similar structure to the input conveyor 1210. The test conveyor 1232 may be provided to transfer the array PCB 110 in a first direction.

The stopper member 1234 stops an array PCB that is being transferred by the test conveyor 1232. The stopper member 1234 includes a blocking plate 1235 and a driver 1236. The blocking plate 1235 has a substantially thin-plate shape. A groove 1235a may be formed on a surface of the blocking plate 1235 which faces the test conveyor 1232 and, as a result, the blocking plate 1235 may have a substantially L shape. The groove 1235a may be defined by a side face 1235b and a bottom face 1235c, for example.

In an exemplary embodiment in accordance with principles of inventive concepts, while the array PCB 110 is stopped by the stopper member 1234, a front edge area 112a of the array PCB 110 is located at the groove 1235a, the side face 1235b defining the groove 1235a is in contact with a front face of the array PCB 110, and the bottom face 1235c defining the groove 1235a supports the bottom face of the array PCB 110. In an exemplary embodiment, the bottom face 1235c may support the front edge area 112a in the array PCB 110.

In an exemplary embodiment in accordance with principles of inventive concepts, the driver 1236 may include a cylinder. The driver 1236 may allow the blocking plate 1235 to travel between a standby position and a blocking position. The standby position may be a position where the array PCB 110 that is being conveyed by a test conveyor 1232 and the blocking plate 1235 do not interfere with each other, for example. The blocking position may be a position where the blocking plate 1235 is in contact with the array PCB 110 that is being conveyed by the test conveyor 1232. In an exemplary embodiment, the blocking position may be higher than the standby position. In such an embodiment, the driver 1236 may allow the blocking plate 1235 to travel in a third direction 16.

In the foregoing exemplary embodiment, the stopper member 1234 is disposed below the test conveyor 1232. However, in accordance with principles of inventive concepts, the stopper member 1234 may also be disposed between belts 1232a of the test conveyor 1232, for example. In the foregoing exemplary embodiment, the bottom face 1235c defining the groove 1234a supports the bottom face of the array PCB 110. However, in accordance with principles of inventive concepts, the blocking plate 1235 may also be a flat plate.

In an exemplary embodiment in accordance with principles of inventive concepts, test instrument 1237 includes a contactor 1238 and a driver 1239. The test instrument 1237 may test an assembly, for example, by testing electrical connections between devices 115 and the array PCB 110. In an exemplary embodiment in accordance with principles of inventive concepts, contactor 1238 is disposed above the stopper member 1234 and includes test pins (e.g., 1238a in FIG. 6) that are in contact with test terminals 113 of the array PCB 110. The test pins 1238a may be provided at a position which vertically faces the groove 1235a of the blocking plate 1235, for example.

The driver 1239 allows the contactor 1238 to travel between a test position and a standby position. The driver 1239 may include a cylinder. The test position may be a position where the test pin 1238a is in contact with the test terminal 113 of the array PCB stopped, and thereby positioned, by the stopper member 1234. The standby position may be a position where the contactor 1237 does not interrupt the travel of the array PCB 110. In an exemplary embodiment, the standby position may be higher than the contact position. In this case, the driver 1239 may allow the contactor 1238 to travel in the third direction 16.

Figure 6:
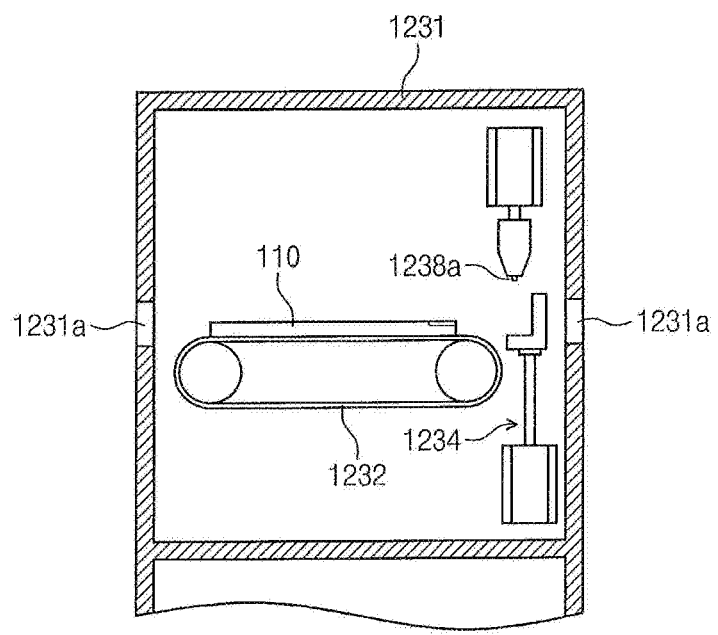
FIGS. 6 to 8 illustrate steps of performing electric test on an array printed circuit board in the electric test unit illustrated in FIG. 4 in accordance with principles of inventive concepts.
Figure 7:
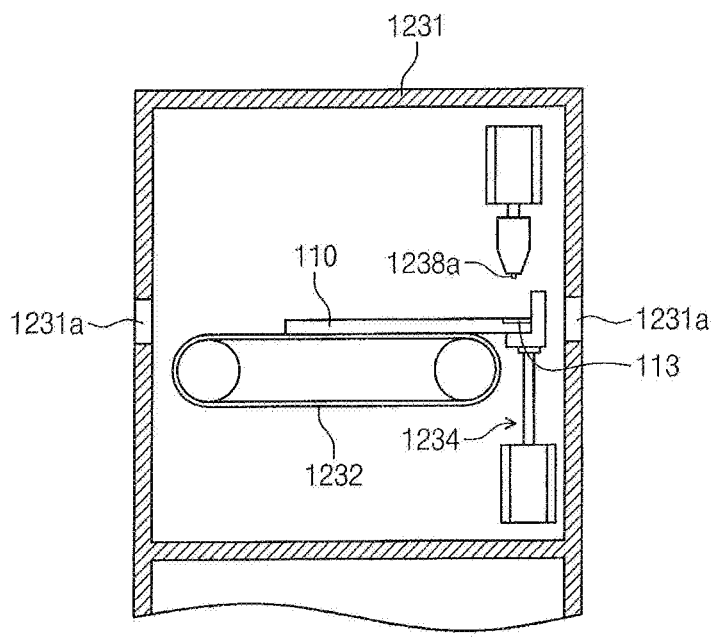
Figure 8:
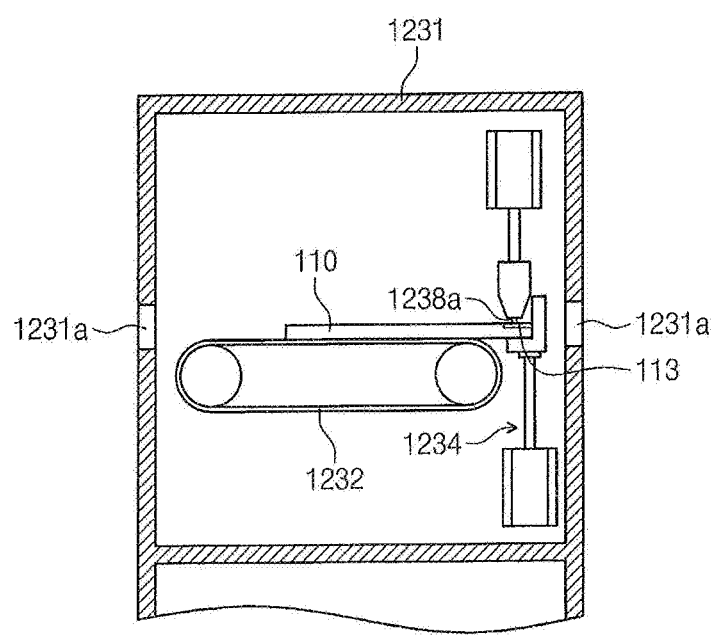

FIGS. 6 to 8 illustrate exemplary steps of performing electric test on the array PCB 110 in the electric test unit 1230 in accordance with principles of inventive concepts. As shown in FIG. 6, the stopper member 1234 travels from a standby position to a blocking position. Next, as shown in FIG. 7, the stopper member 1234 stops the array PCB 110 that is being conveyed along the test conveyor 1232. The stopper member 1234 supports an area of the array PCB 110 in which the test terminals 113 are provided. And then, as shown in FIG. 8, the contactor 1238 descends to a test position and the test pin 1238a comes in contact with the test terminal 113 of the array PCB 110. An electrical signal is applied to the array PCB 110 through the test pin 1238a to perform the electric test. After the electric test is completed, an array PCB that passes the test may travel to the output unit 1240 while an array PCB 110 that fails may travel to the input unit 1220.

The buffer magazine unit 1250 stores the failed array PCB 110 in the electric test unit 1230. The buffer magazine unit 1250 may be disposed above the input conveyor 1210.

Figure 9:
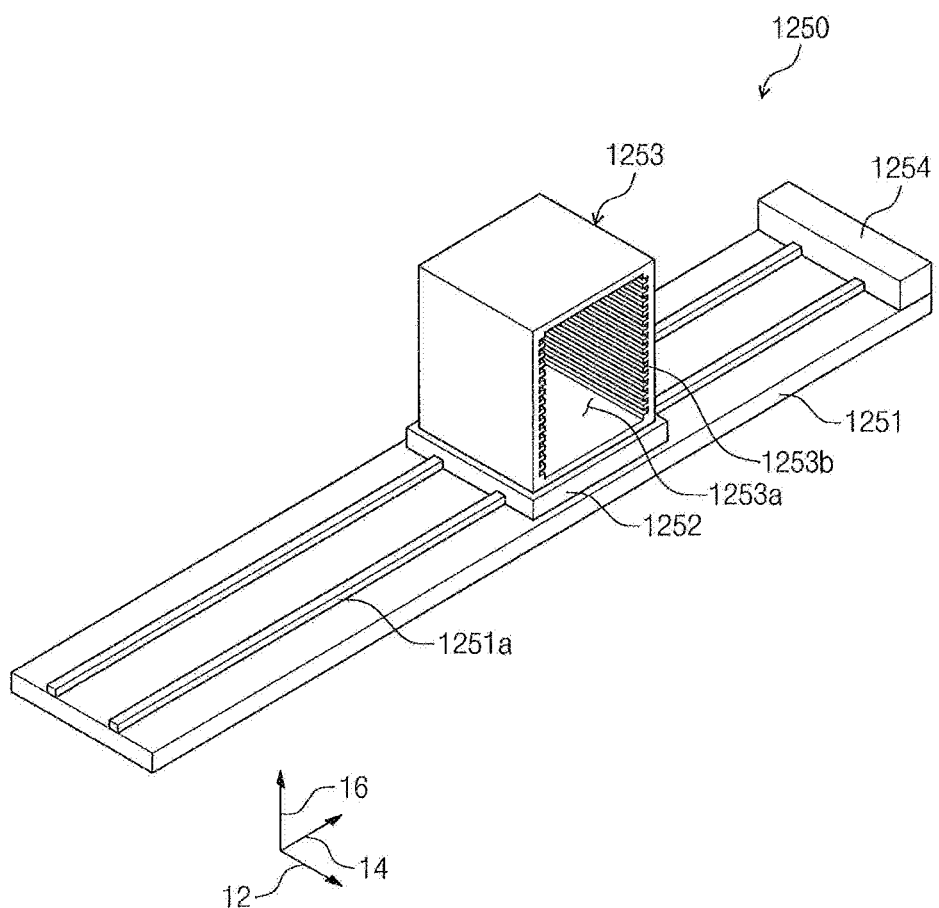
FIG. 9 illustrates an exemplary embodiment of a buffer magazine unit in FIG. 4.

FIG. 9 illustrates an exemplary embodiment of a buffer magazine unit in accordance with principles of inventive concepts. Buffer magazine unit 1250 includes a base 1251, a support block 1252, a buffer magazine, and a driver 1254.

In an exemplary embodiment in accordance with principles of inventive concepts, base 1251 has a substantially rectangular plate shape and extends parallel to second direction 14. A guide rail 1251a is formed on a top surface of the base 1251. The guide rail 1251a guides the travel of the buffer magazine 1253. The guide rail 1251a extends parallel to the second direction 14. The support block 1252 is mounted on the guide rail 1251a. The driver 1254 allows the support block 1252 to travel along the guide rail 1251a in the second direction 14. The buffer magazine 1253 is loaded on the support block 1252. The buffer magazine 1253 may be loaded on the support block 1252 by a worker or robot (not shown), for example. In an exemplary embodiment, the buffer magazine 1253 is provided removably from the support block 1252.

In an exemplary embodiment in accordance with principles of inventive concepts, buffer magazine 1253 has a substantially rectangular parallelepiped shape and includes a space 1253*a* in which the array PCB 110 is loaded. A surface facing the electric test unit 1230 in the space 1253*a* of the buffer magazine 1253 is open. Slots 1253*b* are formed on both inner side faces of the buffer magazine 1253. In operation, side edge area 112*b* of the array PCB 110 is inserted into the slots 1253*b*. The slot 1253*b* is provided in plurality in a third direction 16. In an exemplary embodiment in accordance with principles of inventive concepts, buffer magazine 1253 may be provided in plurality. A completely loaded buffer magazine 1253 may be taken out of the base 1251 by a worker or robot, for example.

In another exemplary embodiment in accordance with principles of inventive concepts, a base and a driver may not be provided at a buffer magazine unit. In such an embodiment, the buffer magazine unit may include a support block and a buffer magazine and the buffer magazine may be loaded on the support block.

In operation, input unit 1220 may directly transfer the array PCB 110 to a test conveyor 1232 of a selected one of the stacked electric test units 1230 from the input conveyor 1210 and may transfer a failed array PCB to the buffer magazine 1253. The input unit 1220 is disposed between the input conveyor 1210 and the electric test unit 1230.

Figure 10:
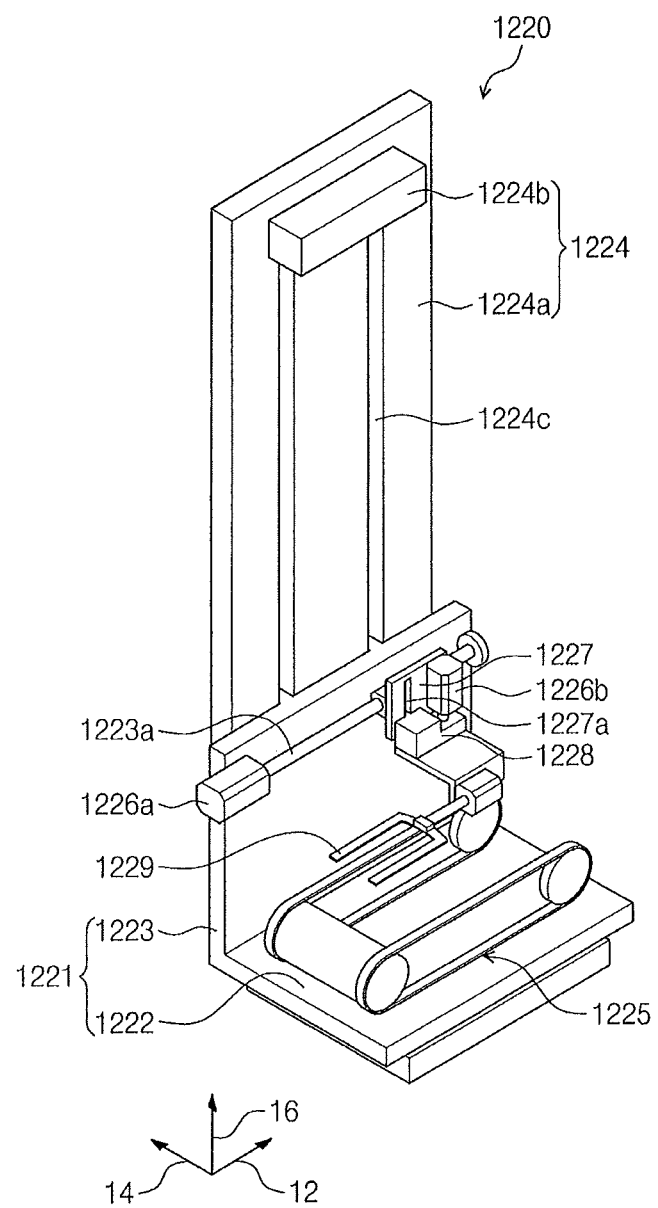
FIG. 10 is a perspective view illustrating an exemplary embodiment of an input unit in FIG. 4.

FIG. 10 is a perspective view illustrating an exemplary embodiment of an input unit in accordance with principles of inventive concepts. Input unit 1220 includes an input holder 1221, an input elevation member 1224, a carry-in conveyor 1225, and a gripper member 1226.

The input holder 1221 includes a bottom plate 1222 and a side plate 1223, and holds the carry-in conveyor 1225 and the gripper member 1226. The side plate 1223 and the bottom plate 1222 may each be provided in the form of rectangular plate. The side plate 1223 is disposed substantially parallel to a plane defined by a first direction 12 and a third direction 16. The bottom plate 1222 is disposed parallel to a plane defined by the first direction 12 and a second direction 14. The bottom plate 1222 may be provided to protrude from the lower end of the side plate 1223 toward the second direction 14, for example.

In an exemplary embodiment in accordance with principles of inventive concepts, a carry-in conveyor 1225 is mounted on the bottom plate 1222. When viewed from the top, the carry-in conveyor 1225 is arranged in line with an input conveyor 1210 and a test conveyor 1232. In operation, carry-in conveyor 1225 directly receives the array PCB 110 from the input conveyor 1210 and directly transfers the array PCB 1210 to a test conveyor 1232 of a selected one of the electric test units 1230. A carry-out conveyor 1225 may include a similar structure to the input conveyor 1210, for example.

In an exemplary embodiment in accordance with principles of inventive concepts, gripper member 1226, which transports failed array PCBs 110 to buffer magazine, is provided on the side plate 1223. The gripper member 1226 includes a horizontally movable block 1227, a vertically movable block 1228, a gripper 1229, a horizontal driver 1226*a*, and a vertical driver 1226*b*. The side plate 1223 is provided with a rail 1223*a*. The rail 1223*a* extends in a first direction 12. The vertically movable block 1227 is mounted on the rail 1223*a*, and the horizontally movable block 1227 moves along the rail 1223*a* in the first direction 12. The horizontally movable block 1227 is provided with a guide rail 1227*a*. The guide rail 1227*a* extends in a third direction 16. The vertically movable block 1228 is mounted on the guide rail 1227*a*. In operation vertical driver 1226*b* moves the vertically movable block 1228 along the guide rail 1227*a* in the third direction 16. The gripper 1229 is disposed above the carry-in conveyor 1225. The gripper 1229 is provided to grip the array PCB 110 loaded on the carry-in conveyor 1225.

The input elevation member 1224 includes a base 1224*a* and a driver 1224*b*. The base 1224*a* extends in the third direction 16. The base 1224*a* may have a length corresponding to that of the electric test unit 1230, for example. A guide rail 1224*c* is provided on one side face of the base 1224*a*. The input holder 1221 is allowed to move along the guide rail 1224*c* in the third direction 16 by the driver 1224*b*. The driver 1224*c* may include a motor.

The output unit 1240 transports the array PCB 110 to a test handler module 1300 from the test conveyor 1232. In an exemplary embodiment in accordance with principles of inventive concepts, output unit 1240 is disposed between the test instrument 1237 and the test handler module 1300.

Figure 11:
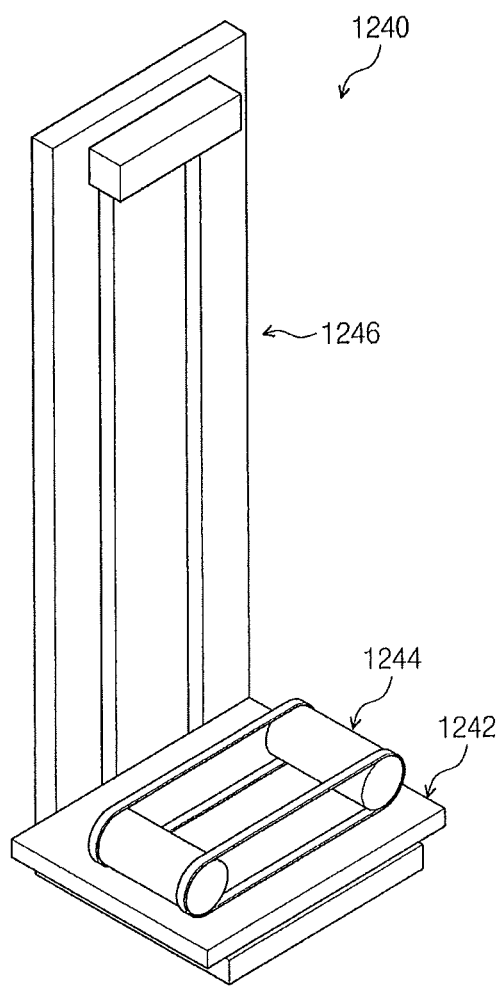
FIG. 11 is a perspective view illustrating an exemplary embodiment of an output unit in FIG. 4.

FIG. 11 is a perspective view illustrating an exemplary embodiment of an output unit in accordance with principles of inventive concepts. Output unit 1240 includes an output holder 1242, a carry-out conveyor 1244, and an output elevation member 1246.

The carry-out conveyor 1244 and the output elevation member 1246 may include the substantially similar structures to the carry-in conveyor 1225 and the input elevation member 1224, respectively, for example. The output holder 1242 supports the carry-output conveyor 1244. The output holder 1242 has the shape of a substantially rectangular plate. The output holder 1242 may be disposed parallel to a plane defined by the first direction 12 and the second direction 14, for example.

The carry-out conveyor 1244 is provided on the output holder 1242. When viewed from the top, the carry-out conveyor 1244 is arranged in line with the test conveyor 1232. In an exemplary embodiment in accordance with principles of inventive concepts, carry-out conveyor 1244 may directly receive an array PCB 110 from the test conveyor 1232 and directly transfer the array PCB 110 to the test handler module 1300. The carry-out conveyor 1244 may include a similar structure to that of the input conveyor 1210, for example.

The loader module 1200 may include a reader 1260, which may be disposed in front of the input unit 1220. The reader 1260 may read test data on the array PCB 110 transported to the loader module 1200 and transmit the read test data to a controller 800, for example.

Figure 12:
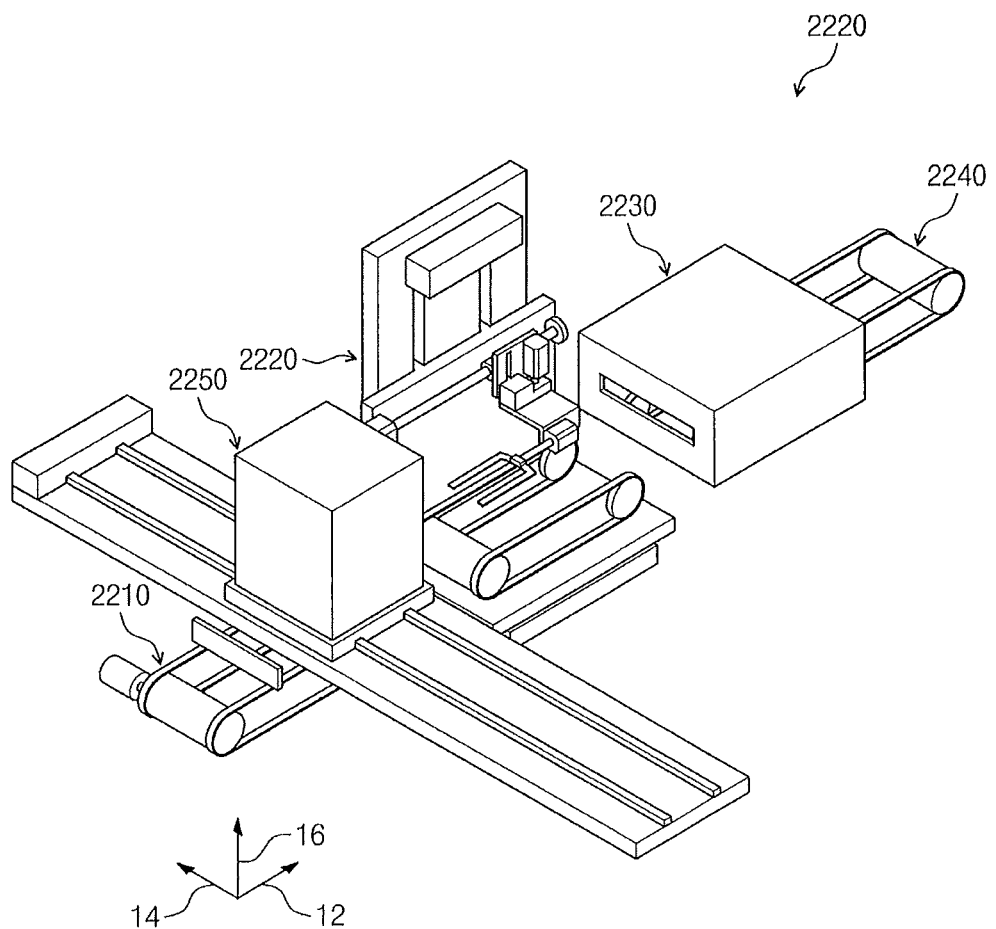
FIG. 12 illustrates another exemplary embodiment of the loader module in FIG. 3.

FIG. 12 illustrates another exemplary embodiment of a loader module in accordance with principles of inventive concepts. Loader module 2220 includes an input conveyor 2210, an input unit 2220, an electric test unit 2230, an output unit 2240, and a buffer magazine unit 2250. The input conveyor 2210, the input unit 2220, the electric test unit 2230, and the buffer magazine unit 2250 may have substantially similar structures to that of the input conveyor 1210, the input unit 1220, the electric test unit 1230, and the buffer magazine unit 1250 in FIG. 4, respectively. In this exemplary embodiment in accordance with principles of inventive concepts, the loader module 2220 includes only one electric test unit 2230. The output unit 2240 includes a carry-out conveyor 2244. The output unit 2240 may be provided without the output holder 1242 and the output elevation member 1246 in FIG. 4.

Figure 13:
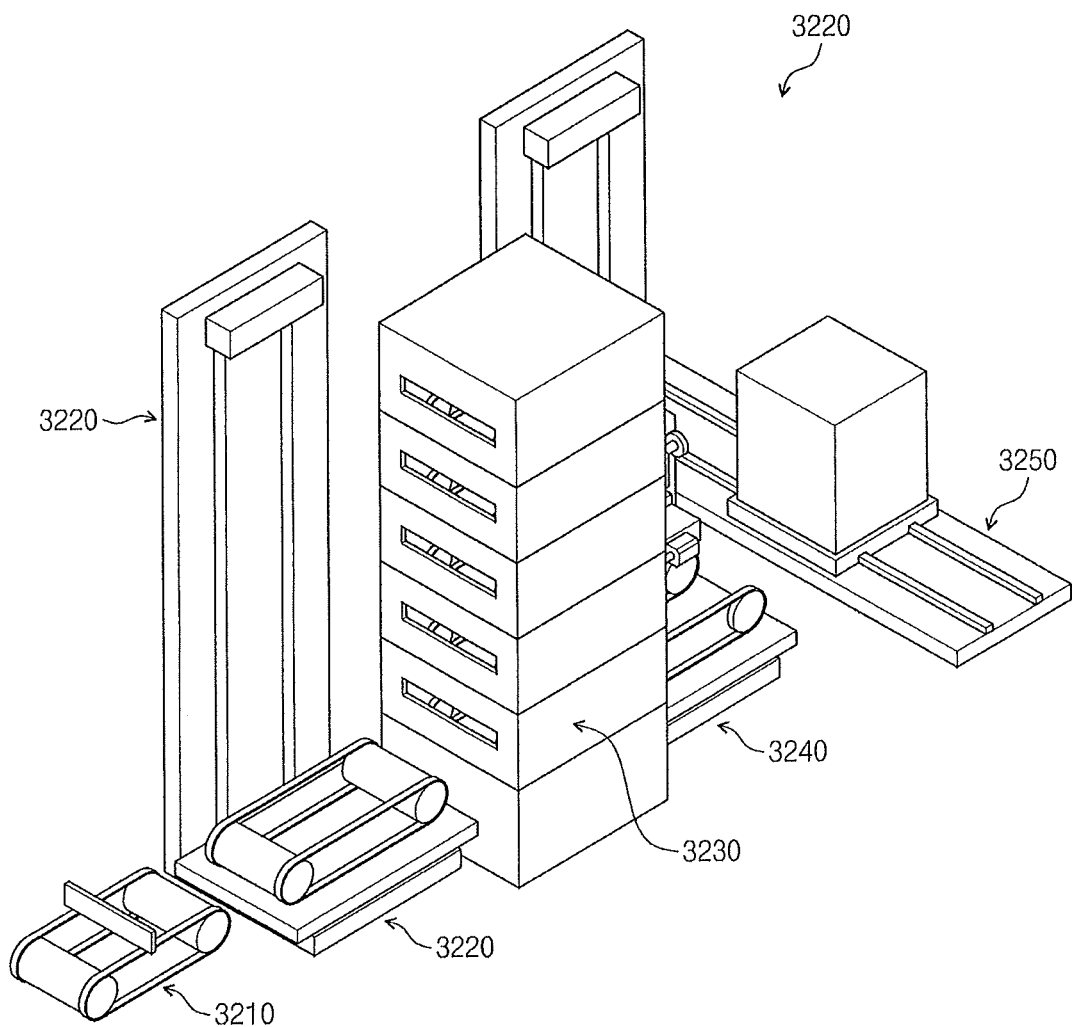
FIG. 13 illustrates another exemplary embodiment of the loader module in FIG. 3.

FIG. 13 illustrates another exemplary embodiment of a loader module in accordance with principles of inventive concepts. Loader module 3220 includes an input conveyor 3210, an input unit 3220, an electric test unit 3230, an output unit 3240, and a buffer magazine unit 3250. The input conveyor 3210, the electric test unit 3230, and the buffer magazine unit 3250 may have substantially similar structures to that of the input conveyor 1210, the electric test unit 1230, and the buffer magazine unit 1250 in FIG. 4, respectively. The buffer magazine unit 3250 may be provided in rear of the output unit 3240. In such an embodiment, the input unit 3220 may have a structure substantially similar to that of output unit 1240 in FIG. 4 and the output unit 3240 may have a structure substantially similar to that of input unit 1220 in FIG. 4.

Figure 14:
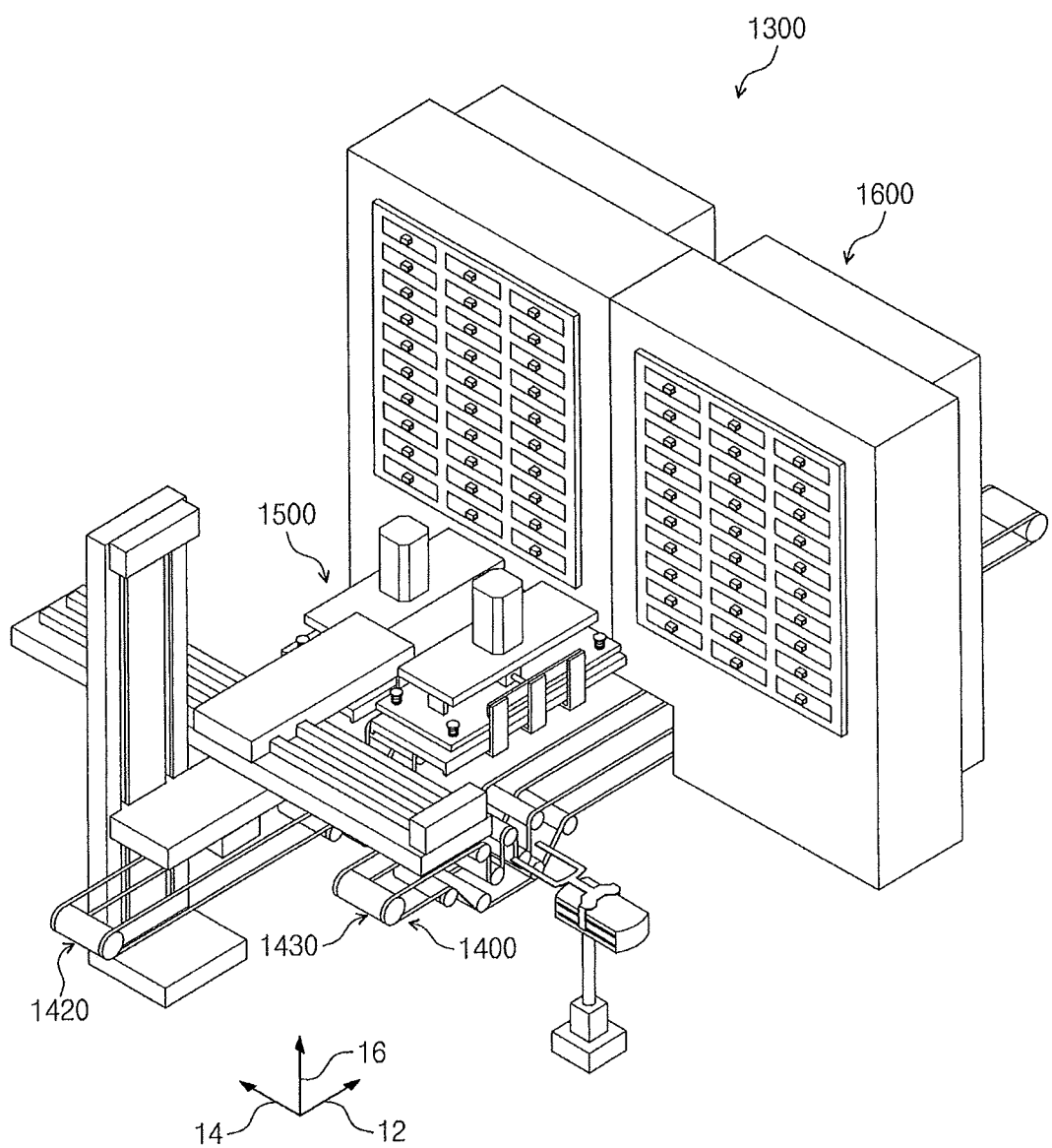
FIG. 14 is a perspective view illustrating an exemplary embodiment of a test handler module in FIG. 3.
Figure 15:
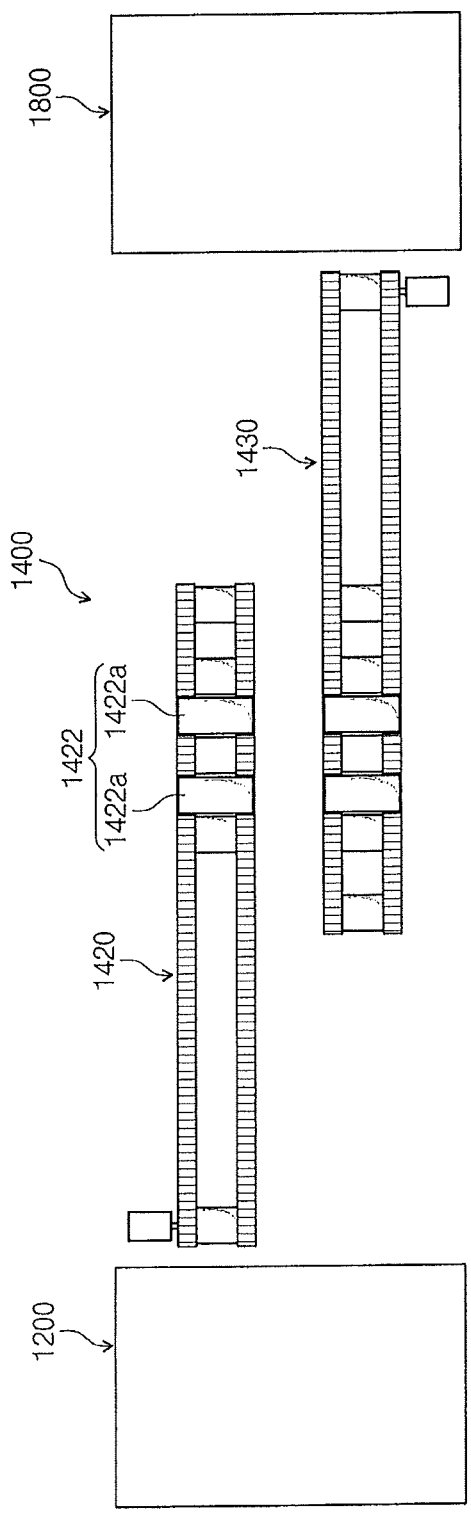
FIG. 15 is a top plan view illustrating an exemplary embodiment of a conveyor unit in FIG. 14.

FIG. 14 is a perspective view illustrating an exemplary embodiment of a test handler module in accordance with principles of inventive concepts. FIG. 15 is a top plan view illustrating an exemplary embodiment of a conveyor unit in accordance with principles of inventive concepts of FIG. 14.

Referring to the exemplary embodiment of FIGS. 14 and 15, a test handler module 1300 includes a conveyor unit 1400, a transport unit 1500, and a handler unit 1600. The conveyor unit 1400 includes a feed conveyor 1420 and a discharge conveyor 1430.

The feed conveyor 1420 directly receives an array PCB 110 from the carry-out conveyor 1244. The feed conveyor 1420 transports an array PCB 110 that is not tested yet in the handler unit 1600. The discharge conveyor 1430 transports an array PCB 110 that is tested in the handler unit 1600. The discharge conveyor 1430 directly transfers the array PCB 110 to an unload conveyor 1822 of an unloader module 1800. The feed conveyor 1420 extends in a first direction 12. When viewed from the top, the feed conveyor 1420 extends to a position adjacent to the carry-out conveyor 1244. The discharge conveyor 1430 is spaced apart from the feed conveyor 1420 in a second direction 14. The discharge conveyor 1430 extends in the first direction 12. The discharge conveyor 1430 extends to a position adjacent to an output conveyor 1840 of the unloader module 1800. The feed conveyor 1420 is provided to be closer to the loader module 1200 than the discharge conveyor 1430, and the discharge conveyor 1430 is provided to be closer to the unloader module 1800 than the feed conveyor 1420.

The feed conveyor 1420 may include a structure substantially similar to that of input conveyor 1210. In an exemplary embodiment, feed conveyor 1420 includes a winding portion 1422 that allows the array PCB 110 to be lifted from the feed conveyor 1420 by a feed lift member 1520 which will be described later. The winding portion 1422 is provided in a region facing the feed lift member 1520 and is formed to be more recessed downwardly than the other regions of the feed conveyor 1420. The winding portion 1422 includes a pair of grooves 1422a disposed adjacent to each other. The pair of grooves 1422a may be formed by changing a moving path of the feed conveyor 1420, for example. The change of the moving path of the feed conveyor 1420 is achieved by providing an idle roller 1426 below a driving roller 1424. The discharge conveyor 1430 may include substantially the same structure as the feed conveyor 1420.

The handler unit 1600 tests an operating state of the array PCB 110. For example, the handler unit 1600 may apply a signal to respective unit boards 110 of the array PCB 110 and test whether operating states of the unit boards 110 are good or bad, as indicated by a signal output from the unit boards 110.

Figure 16:
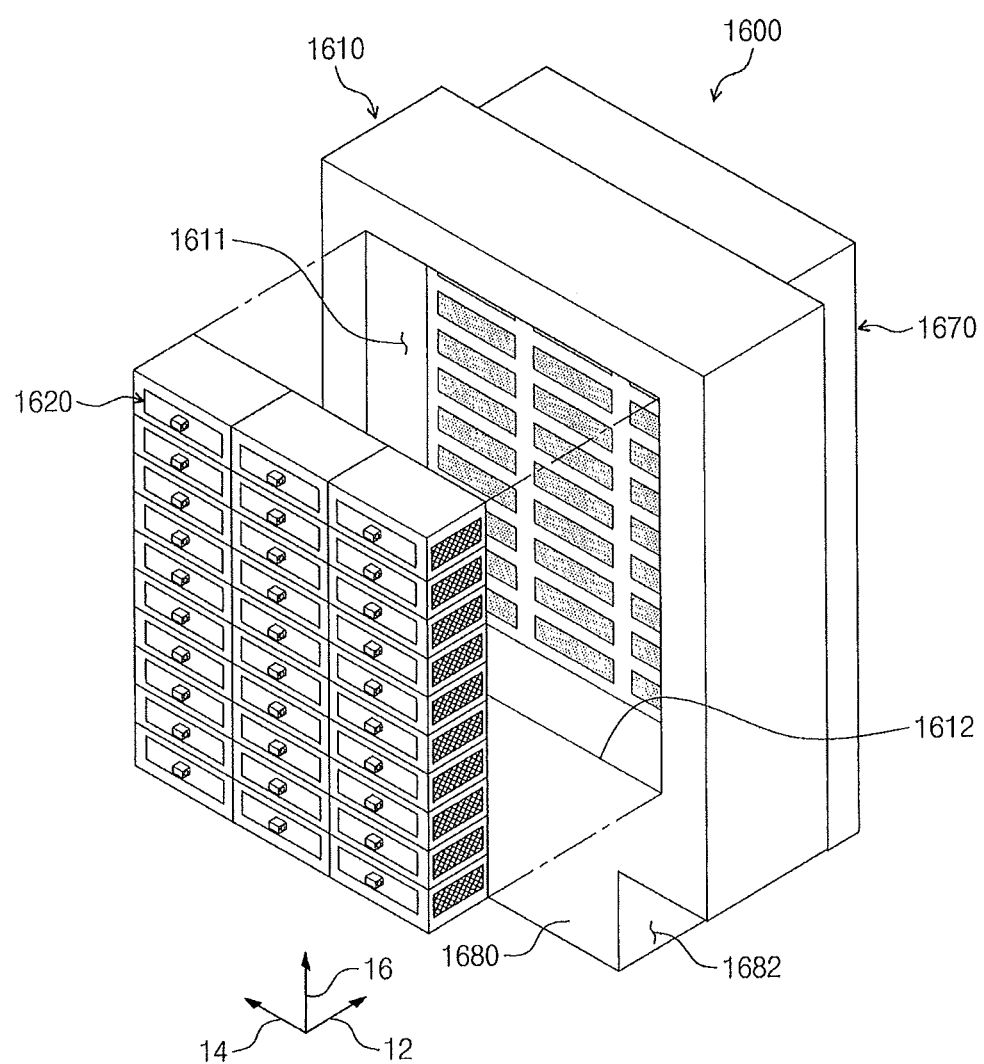
FIG. 16 is a perspective view illustrating a state where a housing and test chambers are separated from each other in the handler unit in FIG. 14.
Figure 17:
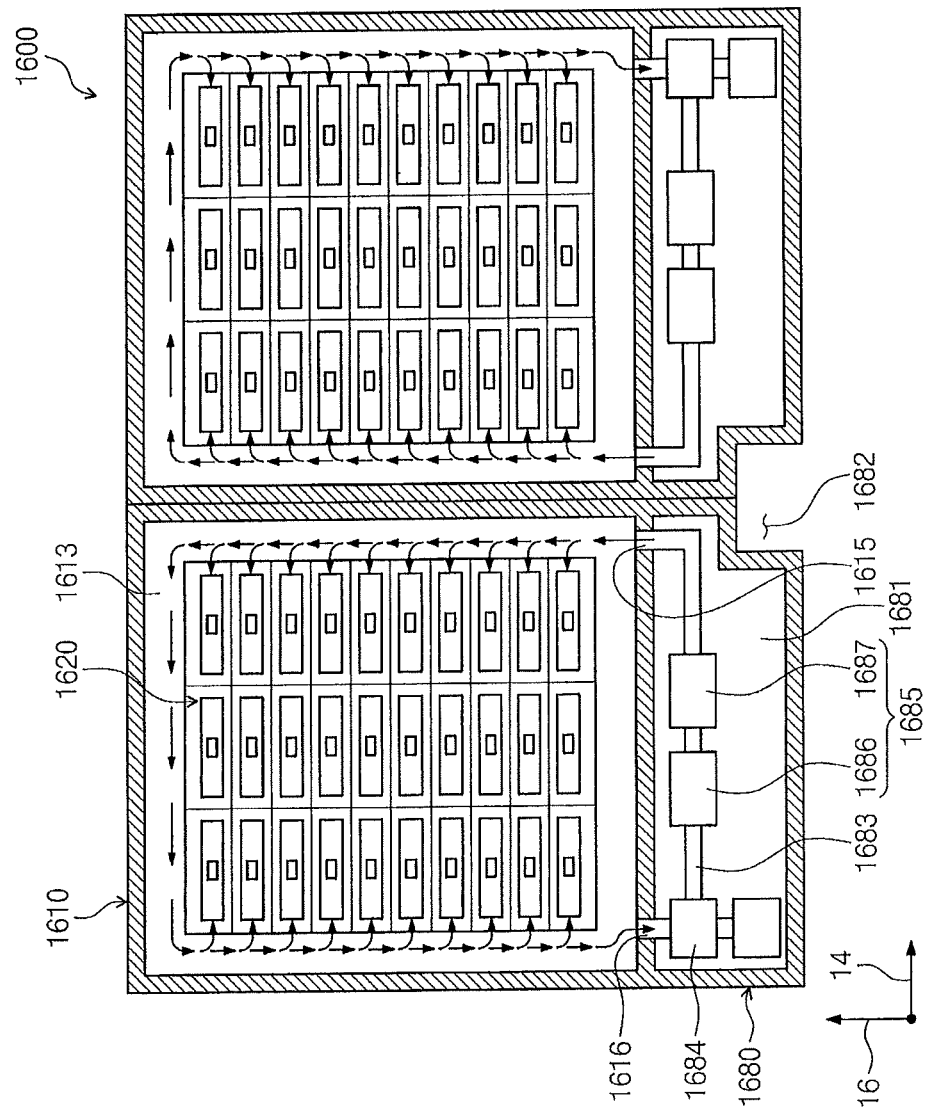
FIG. 17 is a perspective view illustrating the inside of the handler unit in FIG. 14.
Figure 18:
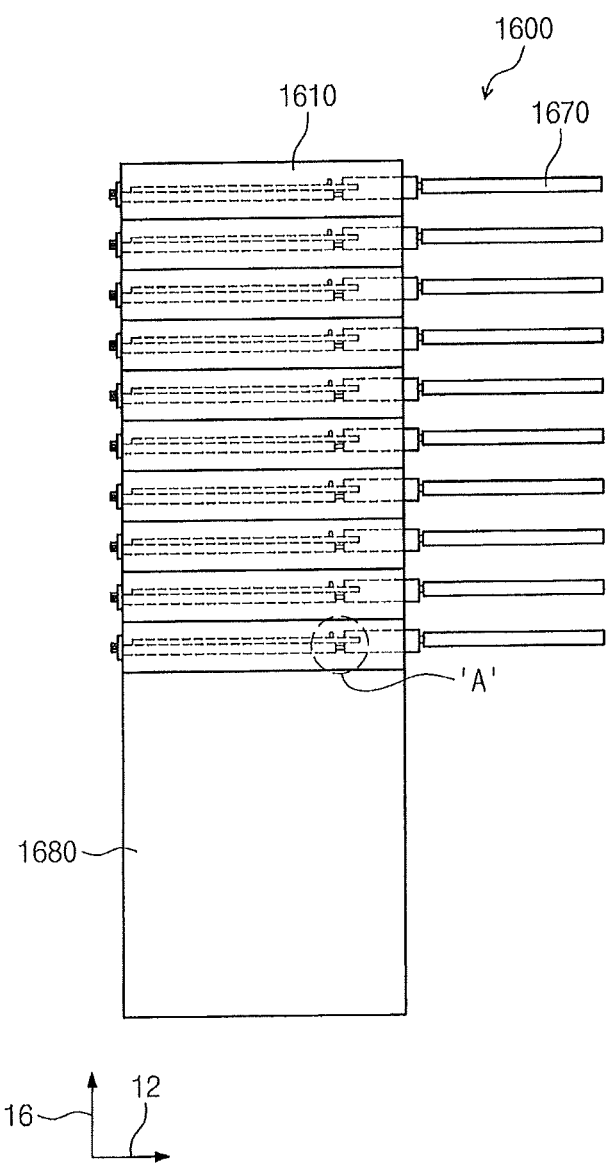
FIG. 18 is a side view of the handler unit in FIG. 14.

FIGS. 16 to 18 illustrate an exemplary embodiment of a handler unit in accordance with principles of inventive concepts. FIG. 16 is a perspective view illustrating the handler unit in a state where a housing and test chambers are separated from each other in the handler unit. FIG. 17 is a perspective view illustrating the inside of the exemplary embodiment of handler unit. FIG. 18 is a side view of the handler unit. One handler unit is shown in FIGS. 16 and 18, and two handler units arranged in a second direction are shown in FIG. 17.

Referring to FIGS. 16 to 18, an exemplary embodiment of a handler unit 1600 in accordance with principles of inventive concepts includes a housing 1610, a test chamber 1620, a test instrument 1670, and a temperature control chamber 1680.

The housing 1610 has a substantially rectangular parallelepiped tube shape. The housing 1610 has an internal space 1611 in which test chambers 1620 may be disposed. The test chambers 1620 may be disposed at the center of the internal space 1611, for example. The internal space 1611 has a front face within which an opening 1612 is formed. The test chambers 1620 may be inserted into the internal space 1611 through the opening 1612. When the test chambers 1620 are inserted into the housing 1610, the opening 1612 is blocked by the test chambers 1620. When the test chambers 1620 are combined with the housing 1610, a circulation space 1613 is formed between the test chambers 1620 and the housing 1610 to surround the test chambers 1620.

In an exemplary embodiment in accordance with principles of inventive concepts, temperature control chamber 1680 is disposed below the housing 1610. The temperature control chamber 1680 controls the temperature of gas supplied to the internal space 1611 of the housing 1610, thereby maintaining the inside of the test chamber 1620 at a temperature suitable for testing. The temperature control chamber 1680, which has a substantially rectangular parallelepiped shape, has an internal space 1681 sealed from the outside. In an exemplary embodiment, the lower end of one side of the temperature control chamber 1680 is provided with a path 1682 along which a feed conveyor 1420 or a discharge conveyor 1430 may pass. In another exemplary embodiment in accordance with principles of inventive concepts, the temperature control chamber 1680 may be disposed above the feed conveyor 1420 and the discharge conveyor 1430 to be spaced apart therefrom.

A pipe 1683 may be included inside the temperature control chamber 1680. One end of the pipe 1683 is combined with an outlet 1616 provided at a bottom surface of the housing 1610, and the other end thereof is combined with an inlet 1615 provided at the bottom surface of the housing 1610. The outlet 1616 and the inlet 1615 are provided opposite to each other beneath the test chambers 1620 in the internal space 1611 of the housing 1610. The outlet 1616 and the inlet 1615 are provided to be each connected to the circulation space 1613. A blower 1684 sucks a gas in the internal space 1611 of the housing 1610 into the pipe 1683 through the outlet 1616 and discharges the gas to the internal space 1611 of the housing 1610 through the inlet 1615. The blower 1684 may be operated by a driver 1688 such as a motor, for example. In an exemplary embodiment in accordance with principles of inventive concepts, temperature control member 1685, which may include a heater 1685, is installed on the pipe 1683. In operation, heater 1686 may heat a gas flowing through the pipe 1686 to a temperature suitable for a test process. Temperature control member

1685 may also include a cooler 1687 installed on the pipe 1683 to cool gas flowing through pipe 1686 to a temperature suitable for a test process.

The test chamber 1620 is provided in plurality. In an exemplary embodiment, the test chamber 1620 may be provided in M×N arrangement (M and N each being a positive integer) on a plane defined by a second direction 14 and a third direction 16. For example, 48 test chambers 1620 may be provided and disposed in 3×16 arrangement on a plane defined by the second direction 14 and the third direction 16. All the chambers 1620 may include the same structure, for example.

Figure 19:
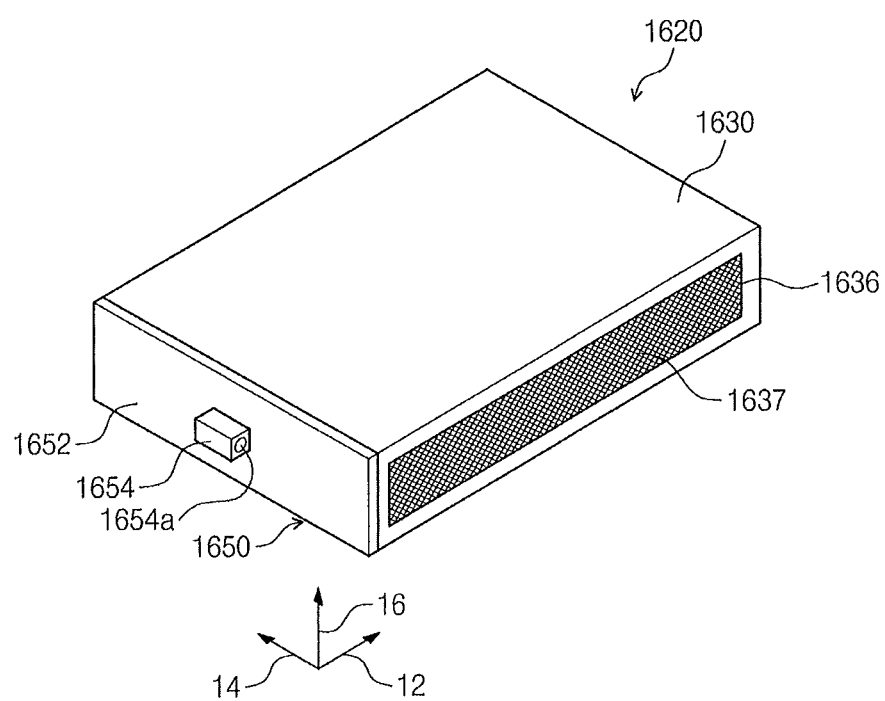
FIG. 19 is a perspective view illustrating a state where a door is closed inside the test chamber in FIG. 14.
Figure 20:
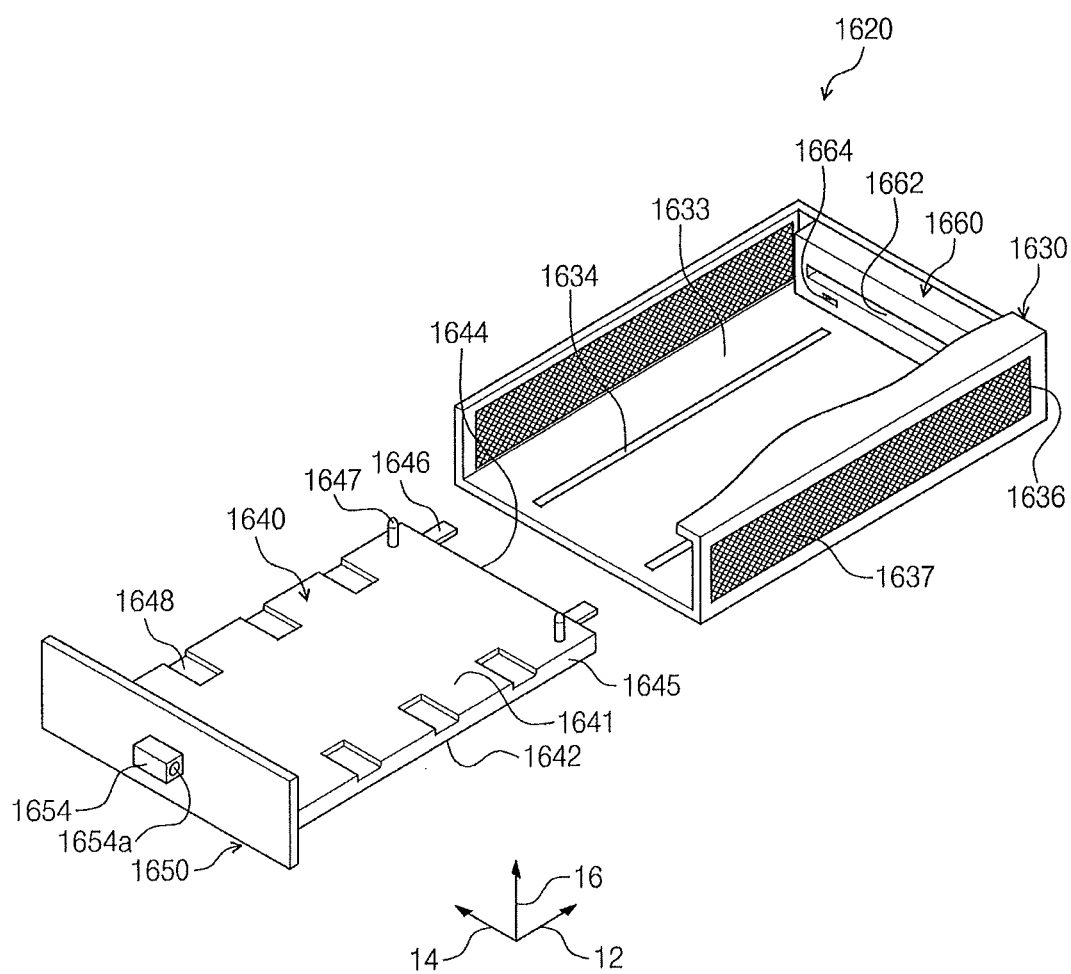
FIG. 20 is a perspective view illustrating a state where a door is opened inside the test chamber in FIG. 14.

An exemplary embodiment of a test changer in accordance with principles of inventive concepts, such as the test chamber 1620 of FIG. 16, is illustrated in greater detail in FIGS. 19 and 20. FIG. 19 is a perspective view illustrating a state in which a door is closed inside the test chamber in FIG. 14, and FIG. 20 is a perspective view illustrating a state in which a door is opened inside the test chamber in FIG. 14.

Referring to FIGS. 19 and 20, a test chamber 1620 has a substantially rectangular parallelepiped open, or tubular, shape. The test chamber 1620 includes a body 1630, a support 1640, a door 1650, and a socket 1660. The body 1630 includes a test space 1631 with an open front face. A bottom surface 1633 defining the test space 1631 of the body 1630 includes a guide rail 1634. The guide rail 1634 may be provided such that its length direction is parallel to a first direction 12. Two guide rails 1634 may be provided to be spaced apart from each other in a second direction 14. The guide rail 1634 guides the movement of the support 1640.

In an exemplary embodiment in accordance with principles of inventive concepts, vents 1636 are formed in both sidewalls of the body 1630. Vent 1636 may be of a size that substantially corresponds to the size of test space 1631 of the body 1630, for example. The vent 1636 allows a temperature-controlled gas in a circulation space 1613 of a housing 1610 to flow to the test space 1631 in the body 1630. The vent 1636 may include a mesh cover 1637 arranged in the form of lattice, for example.

The door 1650 opens and closes the open front surface of the body 1630. The door 1650 may be a sliding door, for example. An outer face 1652 of the door 1650 is provided with a doorknob 1654. The doorknob 1654 may be used when the door opener 1580 opens or closes the door 1650. A through-hole 1654a is formed at the doorknob 1654 in a direction parallel to the second direction 14.

The support 1640 supports the array PCB 110 within the test space 1631 during a test process. The support 1640 may be fixedly coupled to the door 1650 to move with the door 1650, for example. In an exemplary embodiment in accordance with principles of inventive concepts, the support 1640 is coupled with a lower end of the door 1650. The support 1640 may be coupled with the guide rail 1634 of the body 1630 to move along the guide rail 1634.

A back face 1644 of the support 1640 is provided with a support alignment pin 1646. The support alignment pin 1646 guides the support 1640 to be aligned with the socket 1660 during a test process. The support alignment pin 1646 may protrude in the first direction 12. The number of support alignment pins 1646 may match the number of alignment grooves 1664 of the socket 1660.

In an exemplary embodiment in accordance with principles of inventive concepts, board alignment pin 1647 is provided in a front area of a top surface 1641 of the support 1640. The board alignment pin 1647 may protrude upwardly from the support 1640, for example. The board alignment pin 1647 may be insertable into a through-hole 116 formed at an array PCB 110 and there may be as many board alignment pins 1647 as through-holes 116 formed at the array PCB 110, for example.

Grooves 2648 are formed in lateral areas of the top surface of the support 1640. In the lateral area, the groove 1648 extends to a lateral face 1645 adjacent to the lateral area. The groove 1648 acts as a path along which a clamp 1569 of a transfer robot 1540 travels when the transfer robot 1540 loads or unloads the array PCB 110 on or from the support 1640. The clamp 1569 will be explained in detail later. There may be the same number of grooves 1648 as clamps 1569, at positions corresponding to clamps 1569, for example. In another exemplary embodiment in accordance with principles of inventive concepts, the support 1640 may be provided without the groove 1648 and the transfer robot 1540 may load the array PCB 110 on the support 1640 while the board alignment pin 1647 is inserted into the array PCB 110.

Figure 21:
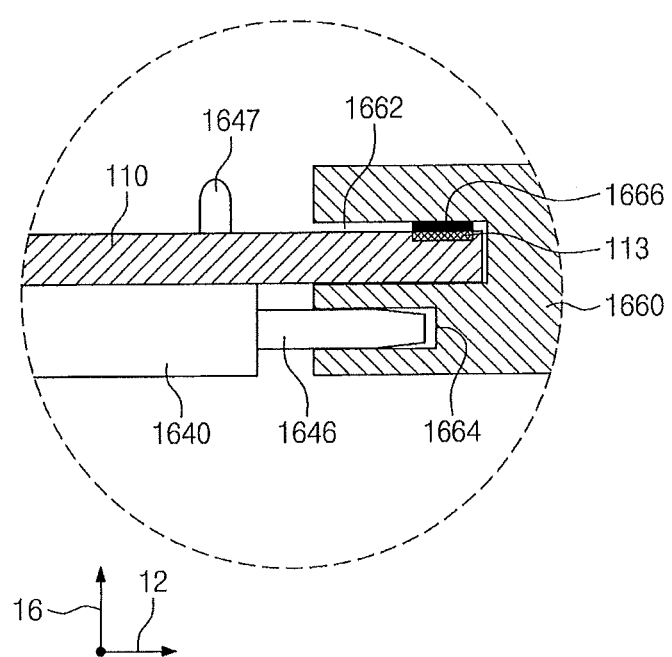
FIG. 21 is an enlarged view of an 'A' area in FIG. 18.

The socket 1660 is mounted in the test space 1631 of the body 1630. FIG. 21 is an enlarged view of an area 'A' in FIG. 18. Socket 1660 includes a pad 1666 which may be made of a conductive material. A test terminal 113 of the array PCB 110 is in contact with the pad 1666 during a test process.

In an exemplary embodiment, a test groove 1662 and an alignment groove 1664 are formed at the socket 1660. The test groove 1662 extends in a second direction 14. The test groove 1662 may have a length corresponding to that of a horizontal side of the array PCB 110. There may be multiple pads 1666 extending in the direction of test groove 1662. In an exemplary embodiment in accordance with principles of inventive concepts, the pad 1666 may be provided on a top surface among surfaces defining the test groove 1662. The alignment groove 1664 is provided below the test groove 1662. A support alignment pin may be inserted into the alignment groove 1664 during a test process. In an exemplary embodiment, two alignment grooves 1664 may be provided to be spaced apart from each other in the second direction 14.

A test instrument (for example, test instrument 1670 in FIG. 18) may be connected to the socket 1660. The test instrument 1670 may apply a test signal to the array PCB 110 through the pad 1666 of the socket 1660 and receive a signal output from the array PCB 110 through the pad 1666. The test instrument 1670 determines whether the array PCB 110 is good or bad (that is, passes or fails the test), in response to the output signal. The test instrument 1670 may be electrically connected to a controller 800 and transmit a test result of the test instrument 1670 to the controller 800, for example. The test instrument 1670 may download firmware or a test program, for example, corresponding to the array PCB 110, which is a test target, from the controller 800. In an exemplary embodiment in accordance with principles of inventive concepts, the test instrument 1670 may also drive a controller among devices 115 provided to a unit substrate 111 using downloaded firmware.

Figure 22:
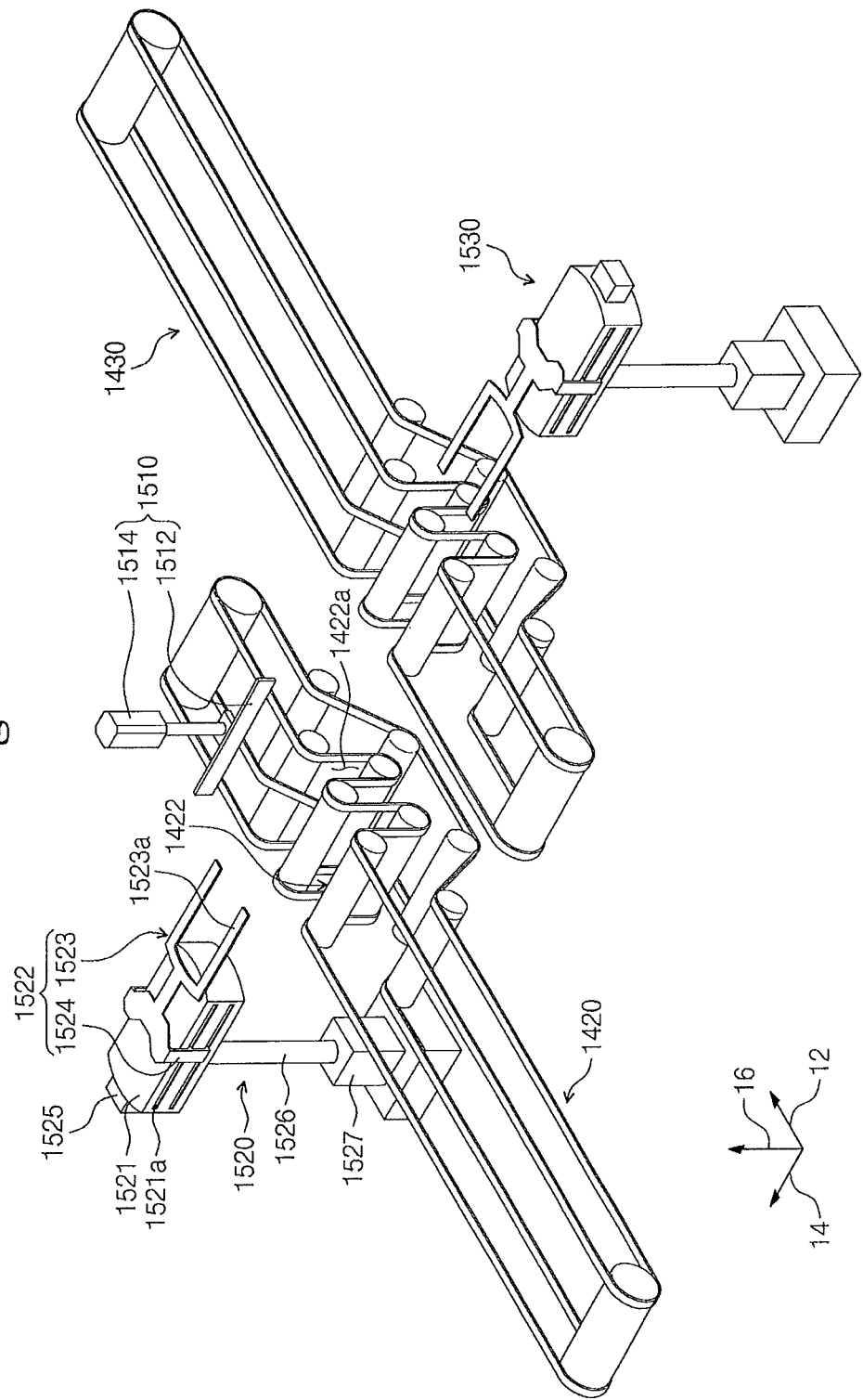
FIG. 22 illustrates a stopper member, a supply lift member, and an discharge lift member in FIG. 14.

In an exemplary embodiment in accordance with principles of inventive concepts, transfer unit 1500 includes a stopper member 1510, a feeding lift member 1520, a discharge lift member 1530, and a transfer robot 1540. FIG. 22 illustrates a stopper member, a feeding lift member, and a discharge lift member. In operation, stopper member 1510 stops an array PCB 110 that is being transferred in the feeding conveyor 1420. The stopper member 1510 may be disposed above the feeding conveyor 1420, for example. The stopper member 1510 may be disposed between the winding portion 1422 of the feeding conveyor 1420 and a handler unit 1600. The array PCB 1422 may be disposed on the winding portion 1422 while being stopped by the stopper member 1510.

The stopper member 1510 includes a blocking plate 1512 and a driver 1514. The blocking plate 1512 has a substantially rod-like shape. The blocking plate 1512 may extend parallel to the second direction 14. The driver 1514 moves the blocking plate 1512 between a standby position and a blocking position. The standby position is a position where the blocking plate 1512 does not interfere with the array PCB 110 that is being transferred by the feeding conveyor 1420, and the blocking position is a position where the blocking plate 1512 is in contact with the array PCB 110 that is being transferred by the feeding conveyor 1420. In an exemplary embodiment, the standby position may be higher than the blocking position, and the blocking position may be a position upwardly spaced from the feeding conveyor 1420. The driver 1514 may include a cylinder. The driver 1514 may move the blocking plate 1512 in a third direction 16.

The feed lift member 1520 and the discharge lift member 1530 are spaced apart from each other in the second direction 14. The feed conveyor 1420 and the discharge conveyor 1430 are provided to pass through between the feed lift member 1520 and the discharge lift member 1530. The feed lift member 1520 is disposed adjacent to the feed conveyor 1420. The feed lift member 1520 lifts the array PCB 110 from the feed conveyor 1420 and delivers the lifted array PCB 110 to the transfer robot 1540. The discharge lift member 1530 receives the array PCB 110 from the transfer robot 1540 and places the received array PCB 110 on the discharge conveyor 1430.

The feed lift member 1520 may have substantially the same structure as the discharge lift member 1530. The feed lift member 1520 includes a base 1521, a support 1522, a horizontal driver 1525, an elevation shaft 1526, and a vertical driver 1527. The base 1521 is of a substantially rectangular parallelepiped shape. Guide grooves 1521a are formed at both side faces of the base 1521. The guide groove 1521a extends parallel to the second direction 14. The support 1522 may engage with the guide groove 1521a.

The support 155 may be movable along the guide groove 1521a. The support 1522 includes a hand 1523 and a coupling rod 1524. In operation, hand 1523 supports the array PCB 110. The coupling rod 1524 extends from the hand 1523 to engage with the guide groove 1521a. The hand 1523 includes two support rods 1523a. The support rods 1523a are parallel to each other and spaced apart from each other in the first direction 12. The hand 1523 may be substantially in the form of fork.

As described above, in an exemplary embodiment in accordance with principles of inventive concepts, the feed lift member 1520 is disposed at a position opposite to the winding portion 1422, and the winding portion 1422 has two groove portions 1422a. When the hand 1523 travels in the second direction 14, a single support rod 1523a is inserted into the respective groove portions 1422a. The horizontal driver 1525, which may include a motor, provides a driving force to move the hand 1523 in the second direction 14. The elevation shaft 1526 is coupled to a bottom surface of the base 1521. The elevation shaft 1526 may extend parallel to the third direction 16. The vertical driver 1527, which may include a cylinder, moves the elevation shaft 1526 in the third direction.

In an exemplary embodiment in accordance with principles of inventive concepts, transfer robot 1540 receives the array PCB 110 from the feed lift member 1520 and transfers the received array PCB 110 to one of the test chambers 1620.

The transfer robot 1540 may pick out the array PCB 110 from the test chamber 1620 and delivers the picked-out array PCB 110 to the discharge lift member 1530.

Figure 23:
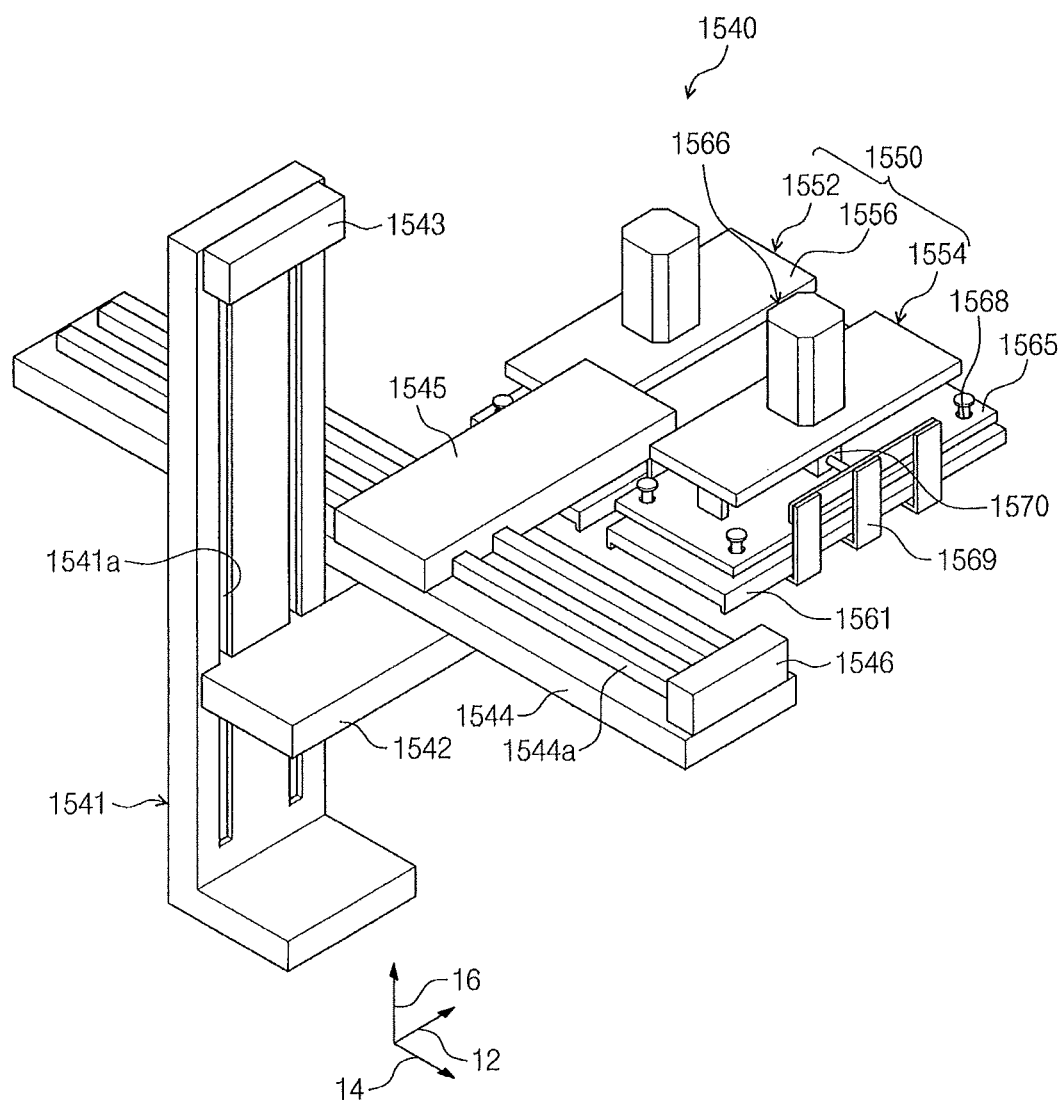
FIG. 23 is a perspective view of a transfer robot in FIG. 14.
Figure 24:
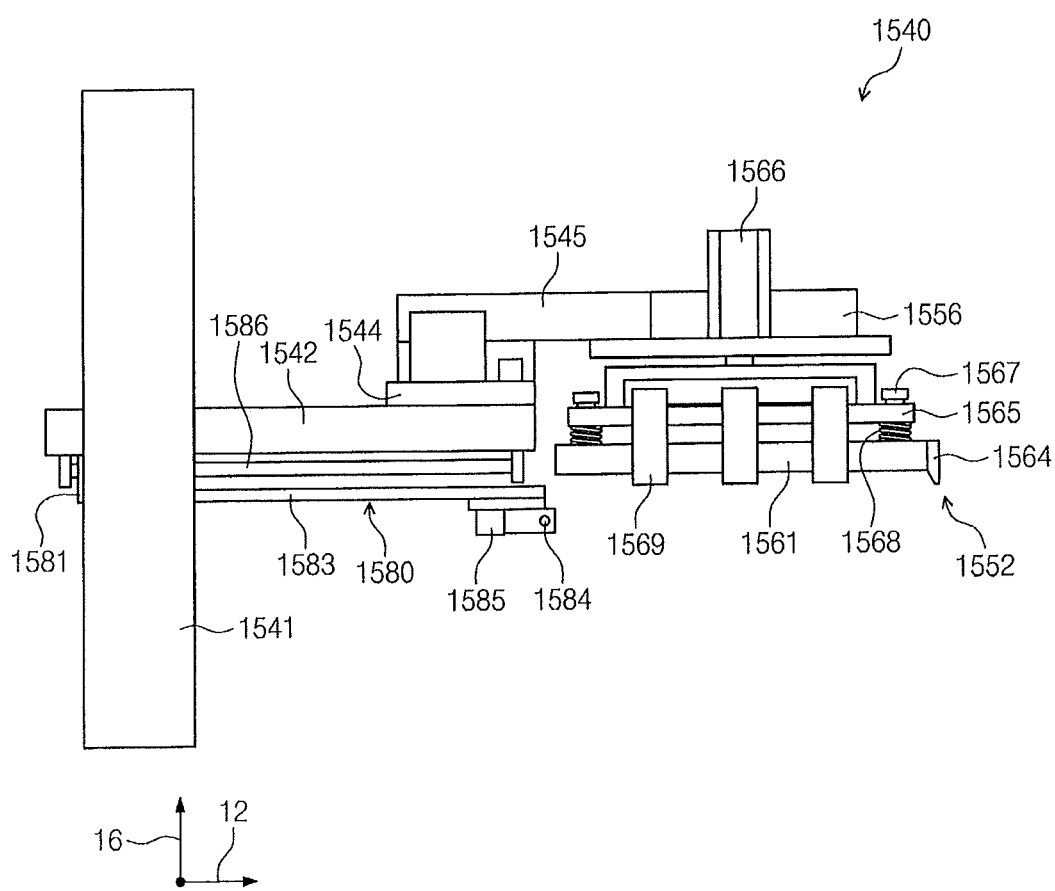
FIG. 24 is a side view of the transfer robot in FIG. 23.
Figure 25:
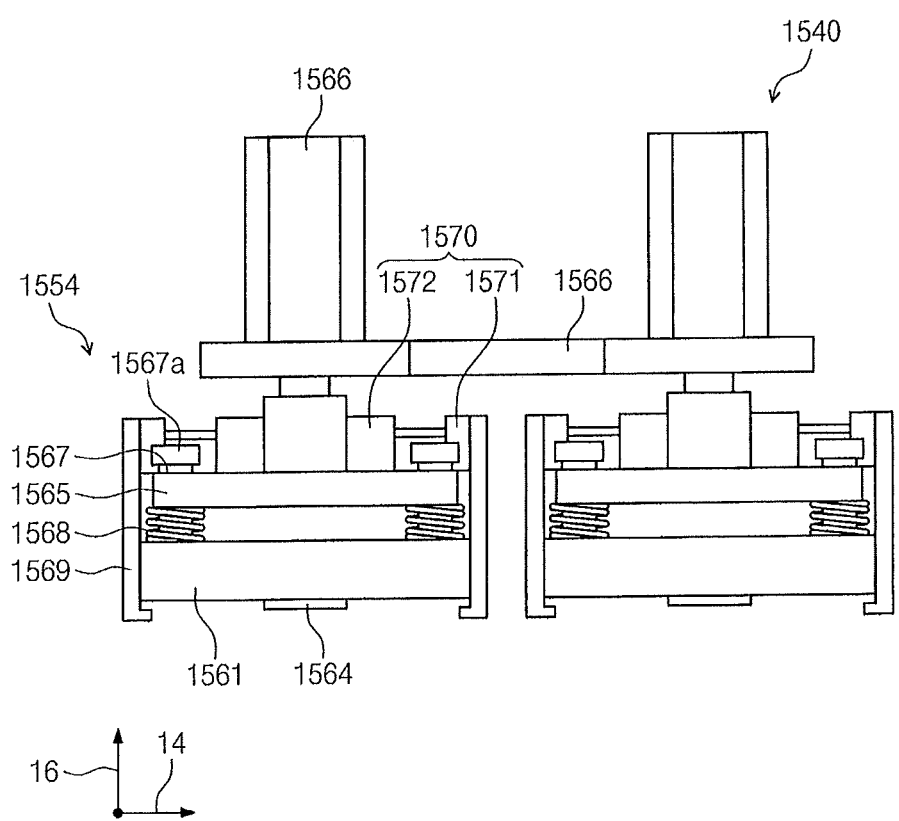
FIG. 25 is a front view of a holder member of the transfer robot in FIG. 23.
Figure 26:
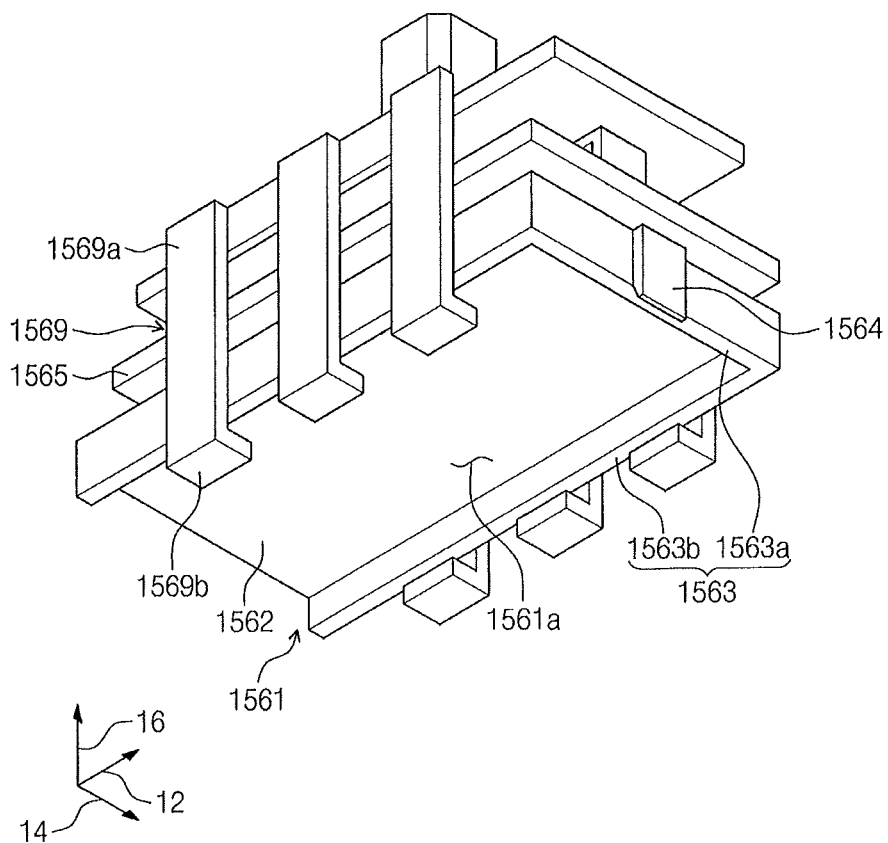
FIG. 26 is a bottom view of an unload arm of the transfer robot in FIG. 23.

FIG. 23 is a perspective view of a transfer robot, and FIG. 24 is a side view of the transfer robot. FIG. 25 is a front view of a holder member, and FIG. 26 is a bottom view of an unload arm.

Referring to FIGS. 23 to 26, a transfer robot 1540 includes a vertical base 1541, a vertical support 1542, a vertical driver 1543, a horizontal base 1544, a horizontal support 1545, a horizontal driver 1546, a holder member 1550, and a door opener 1580.

In an exemplary embodiment in accordance with principles of inventive concepts, vertical base 1541 is spaced apart from the feed conveyor 1420 in the second direction 14. The vertical base 1541 extends parallel to the third direction 16. A rail 1541a is formed at one side face of the vertical base 1541. The rail 1541a extends parallel to the third direction 16. The vertical support 1542 engages with the rail 1541a to be movable along the rail 1541a. In operation, vertical driver 1543, which may include a motor, moves the vertical support 1542 along the rail 1541a in the third direction 16.

In an exemplary embodiment in accordance with principles of inventive concepts, horizontal base 1544 is fixedly coupled on the vertical support 1542. The horizontal base 1544 extends parallel to the second direction 14. A rail 1544a is formed on a top surface of the horizontal base 1544 and extends parallel to the second direction 14. The horizontal support 1545 engages with the rail 1544a to be movable along the rail 1544a, extends parallel to the first direction 12, and protrudes from the vertical base 1544 in a direction toward the handler unit 1600. In operation, horizontal driver 1546 moves the horizontal support 1545 along the rail 1544a in the second direction 14.

In an exemplary embodiment in accordance with principles of inventive concepts, holder member 1550 is fixedly coupled to the horizontal support 1545. The holder member 1550 includes a load ram 1552, an unload arm 1554, and a fixed plate 1556. The fixed plate 1556 is fixedly coupled to the horizontal support 1545 and supports the load arm 1522 and the unload arm, 1554. The load arm 1552 and the unload arm 1554 are disposed opposite to each other on fixed plate 1556. The load arm 1552 and the unload arm 1554 are spaced apart from each other in the second direction 14. In operation, load min 1552 receives the array PCB 110 from the feed lift member 1520 and feeds the received array PCB 110 to a selected one of the test chambers 1620. The unload arm 1554 picks out the array PCB 110 from the test chamber 1620 and delivers the picked-out array PCB 110 to the discharge lift member 1530.

The load arm 1552 and the unload arm 1554 may have substantially the same structure. The unload arm 1552 includes a pickup head 1561, a head support 1565, a support driver 1566, a fixed pin 1567, an elastic member 1568, a clamp 1569, and a clamp driver 1570. The head support 1565 has the shape of a substantially rectangular plate. The head support 1565 is disposed below the fixed plate 1556 to be spaced apart from the fixed plate 1556. The support driver 1566 couples the head support 1565 to the fixed plate 1556 and moves the head support 1565 with respect to the fixed plate 1556 in the third direction 16. In an exemplary embodiment, the support driver 1566 may include a cylinder.

The pickup head 1561 supports the array PCB 110 and is disposed below the head support 1565, spaced apart from the head support 1565. The pickup head 1561 is of the shape of a substantially rectangular parallelepiped.

The pickup head 1561 includes a plate 1562 and a contact member 1563. The plate 1562 is of the shape of a substantially rectangular plate. The contact member 1563 protrudes downwardly from a bottom surface of the plate 1562. The contact member 1563 includes a front contact portion 1563a and a side contact portion 1563b. The front contact portion 1563a is located in the front edge area 112a among edge regions of the plate 1562. The front contact portion 1563a may be of a length that is equivalent that of a horizontal side of the array PCB 110. The side contact portion 1563b is located in the side edge region 112b among the edge regions of the plate 1562. An insert space 1561a, which is downwardly and backwardly open, is located at a lower portion of the plate 1562 by the front contact portion 1563a and the side contact portion 1563b.

Figure 27:
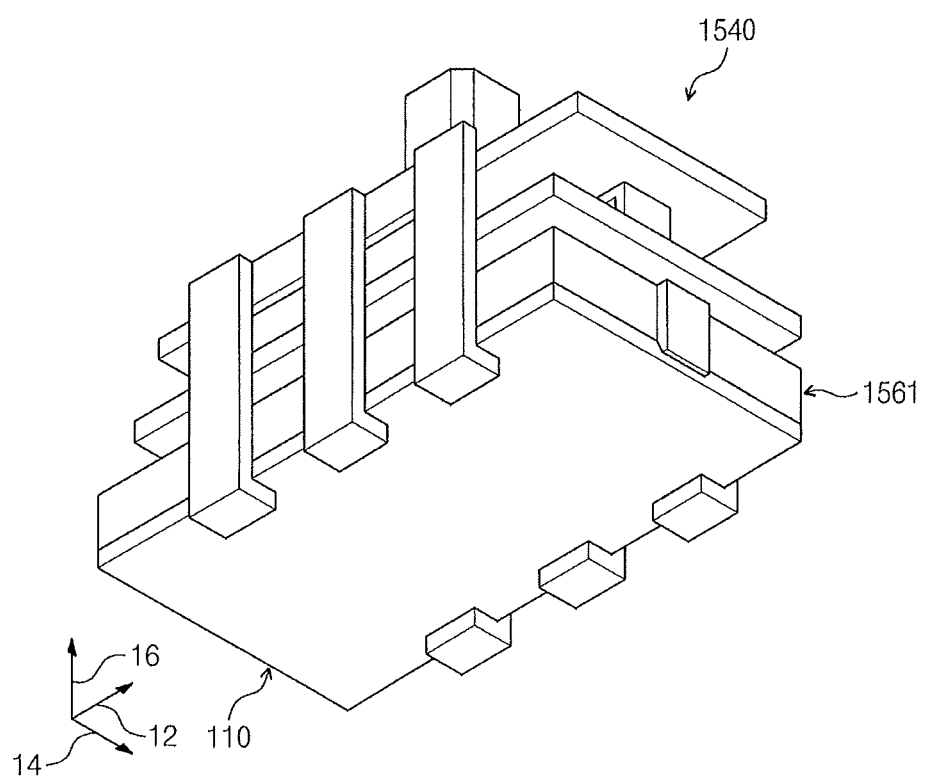
FIGS. 27 and 28 illustrate states where array printed boards having different lengths of vertical sides are supported by a pickup head, respectively.
Figure 28:
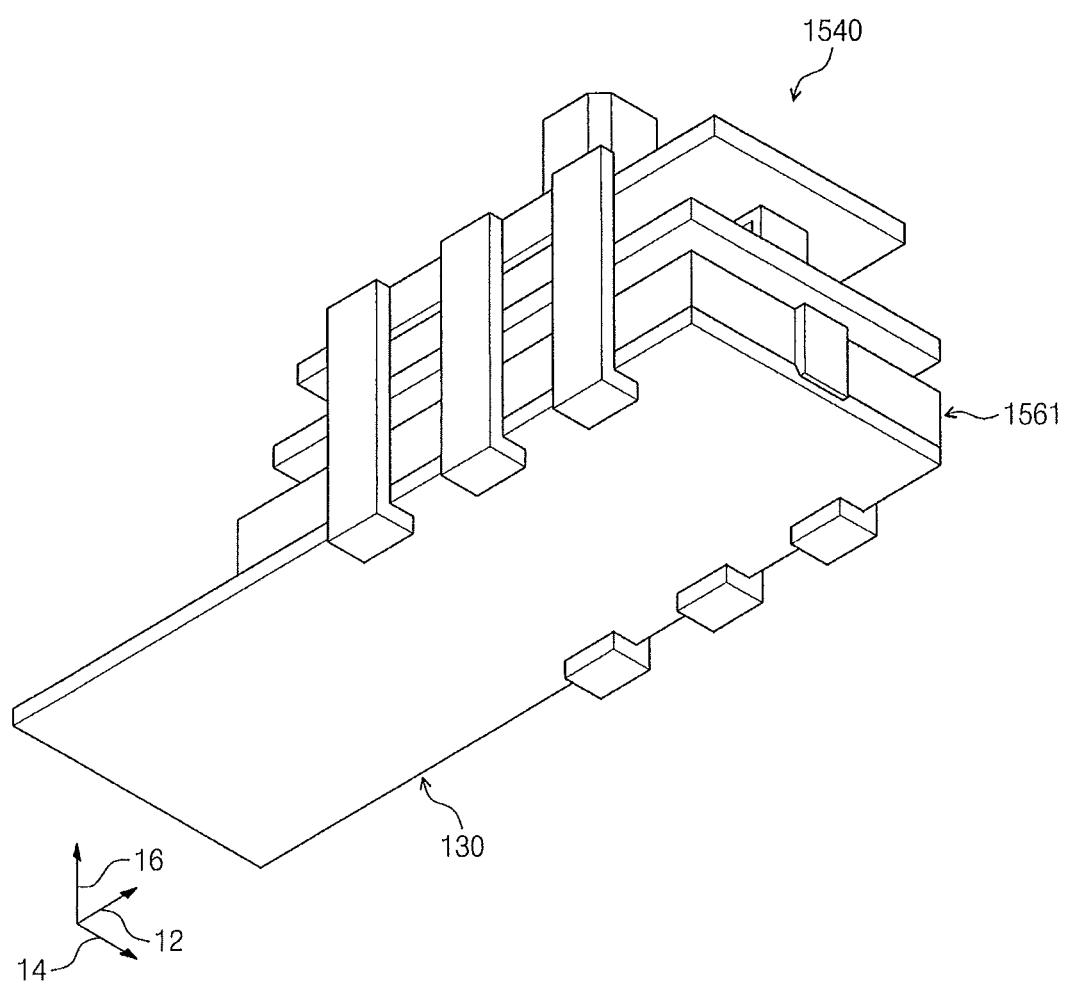

In an exemplary embodiment in accordance with principles of inventive concepts, when the array PCB 110 is transferred by the transfer robot 1540, the front edge region 112a of the array PCB 110 comes in contact with the bottom surface of the front contact portion 1563a and the side edge region 112b thereof comes in contact with the bottom surface of the side contact portion 1563b. The devices 115 provided to the array PCB 110 are disposed within the insert space 1561a. Because a back edge area 112c is opened, the insert space 1561a formed at the lower portion of the plate 1562 may allow the pickup head 1561 to support various types of array PCBs 110 having different vertical side lengths. Thus, the entire side edge region 112b of the array PCB 110 may come in contact with the side contact portion 1563b or a portion of the side edge regions 112b may come in contact with the side contact portion 1563b, according to the length of a vertical side of the array PCB 110. FIGS. 27 and 28 show states where array PCBs 110 and 130 having different length of vertical sides are supported on the pickup head 1561, for example.

The end of the pickup head 1561 may include a guide member 1564, which allows the front edge region 112a of the array PCB 110 to be aligned with the front contact portion 1563a of the pickup head 1561 when the array PCB 110 comes in contact with the pickup head 1561. The guide member 1564 protrudes to a position lower than the front contact portion 1563a from the front face of the plate 1562. A surface facing the front contact portion 1563a from the guide member 1564 may include inclination to go away from the front contact portion 1563a.

The pickup head 1561 is combined with the head support 1565 by the fixed pin 1567. The fixed pin 1567 extends parallel to the third direction 16. In an exemplary embodiment, fixed pin 1567 is fixed to the pickup head 1561 and may be inserted through a hole formed at the head supporter 1565. A locking portion 1567a is provided at an upper end of the fixed pin 1567 to prevent the fixed pin 1567 from coming out of the head support 1565. The pickup head 1561 and the head support 1565 are connected by the elastic member 1568. The elastic member 1568 may include a spring, for example. The elastic member 1568 is provided to surround the fixed pin 1567. The fixed pin 1567 may be provided to respective four corners of the head support 1565.

The clamp 1569 fixes the array PCB 110 to the head support 1565. The clamp 1569 is provided to both side portions of the head support 1565. In an exemplary embodiment, a plurality of clamps 1569 are included along the direction of the side contact portion 1563b of the head support 1565. The plurality of clamps 1569 are spaced apart from each other. The clamp 1569 includes a side plate 1569a and a lower plate 1569b. The side plate 1569a extends parallel to the third direction 16. The side plate 1569 is spaced apart from the head support 1565 and the pickup head 1561 in the second direction 14. The lower plate 1569b is provided orthogonal to the side plate 1569a and protrudes in a direction toward the head support 1565 from a lower end of the side plate 1569a. The lower plate 1569b is disposed lower than the pickup head 1561.

In operation, clamp driver 1570 moves the clamp 1569 between a fixed position and a standby position along the second direction 14. The standby position is a portion where there is no interference in movement of the array PCB 110 before the array PCB comes in contact with the pickup head 1561. For example, at the standby position, a lower plate of the clamp 1569 may be disposed not to overlap the pickup head 1561 when viewed from the top. The fixed position is a position where the lower plate of the clamp 1569 presses the edge of the array PCB 110 while the substrate 110 is in contact with the pickup head 1561.

The clamp driver 1570 may include a connection plate 1571 and a cylinder 1572, for example. The cylinder 1572 may be fixedly mounted on a top surface of the head support 1565. Clamps 1569 provided in the same column are combined with the connection plate 1571, and the connection plate 1571 may be driven by the cylinder 1572 in the second direction 14. In another exemplary embodiment in accordance with principles of inventive concepts, cylinders may be connected to clamps, respectively.

Figure 29:
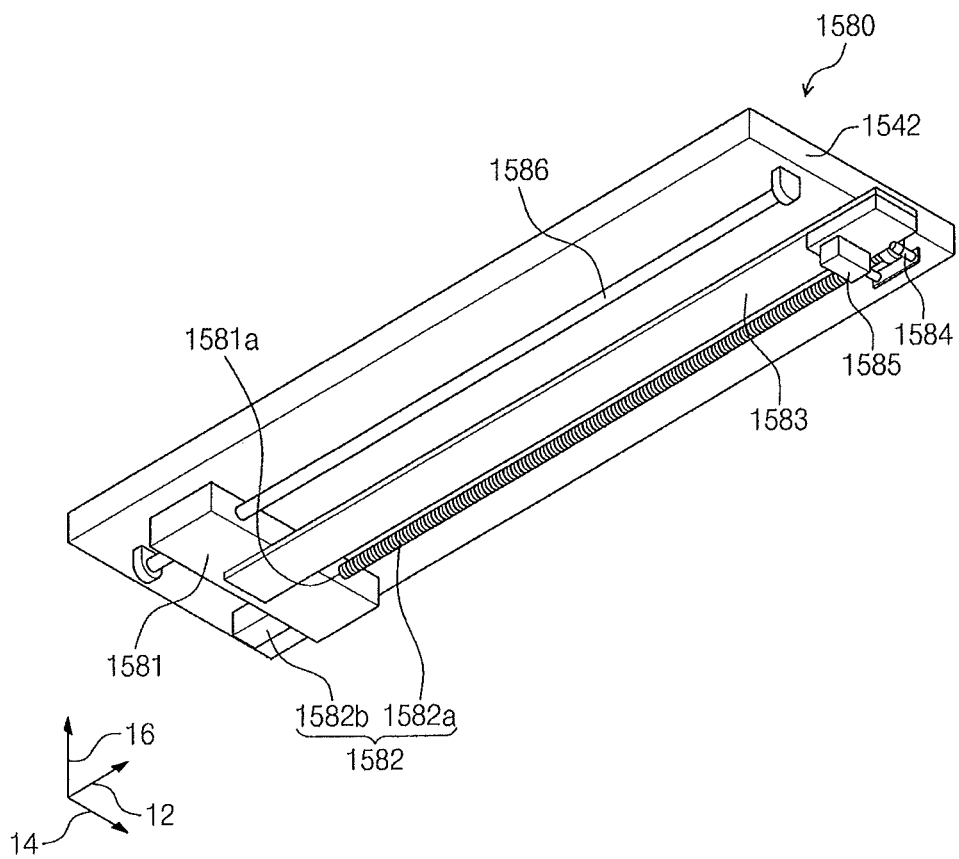
FIG. 29 illustrates a door opener of the transfer robot in FIG. 23.

The door opener 1580 opens and closes a door 1650 of the test chamber 1620. FIG. 29 illustrates a door opener. Door opener 1580 includes a movable block 1581, a block driver 1582, a latch support 1583, a latch 1584, and a latch driver 1585. The door opener 1580 may be mounted on a transfer robot 1540, for example. In an exemplary embodiment, the door opener 1580 is mounted on a vertical support 1542 of the transfer robot 1540.

The movable block 1581 is disposed on a bottom surface of the vertical support 1542. In operation, block driver 1582 moves the movable block 1581 in the first direction 12. In an exemplary embodiment, the block driver 1582 moves the movable block 1581 between a standby position and an operating position. The operating position is a position where the movable block 1581 moves toward the door 1650 such that the latch 1584 is disposed adjacent to a doorknob 1564 of the door 1650, and the standby position is a position where the latch 1584 moves back from the housing 1610 of the handler unit 1600.

In an exemplary embodiment in accordance with principles of inventive concepts, the block driver 1582 includes a screw 1582a and a motor 1582b for rotating the screw 1582a. A screw hole 1581a is formed at the movable block 1581, and the screw 1582a is inserted into the screw hole 1581a. The movable block 1581 is linearly moved by rotation of a screw 1582 that is inserted into the screw slot 1581. The vertical support 1542 is provided with a guide 1586. The guide 1586 guides the movable block 1581 to stably move in the first direction 123. The guide 1586 extends parallel to the screw 1582a and is spaced apart from the screw 1582a in the second direction 14. The movable block 1581 is mounted on the guide 1586 to be movable along the guide 1586 in the first direction 12.

The latch support 1583 is fixedly installed at the movable block 1581. The latch support 1583 is of a rod-like shape. The latch support 1583 extends parallel to the first direction 12. The latch driver 1585 is fixedly installed at the end of the latch support 1583. The latch driver 1585 allows the latch 1584 to linearly move in the second direction 14. The latch driver 1585 may include a cylinder, for example. The latch 1584 is insertable into the doorknob 1654 of the door 1650.

Figure 30:
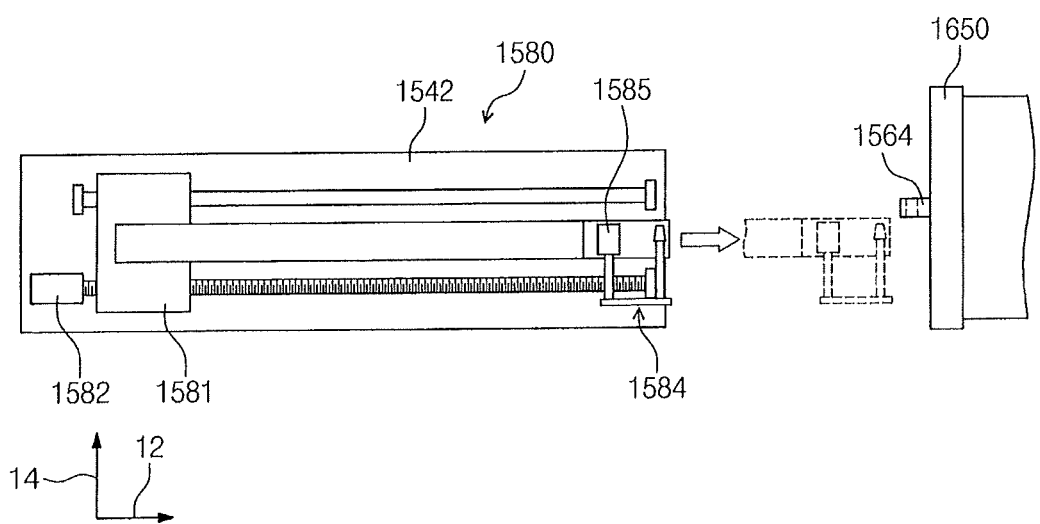
FIGS. 30 to 32 illustrate the procedure of opening a door by the door opener in FIG. 23.
Figure 31:
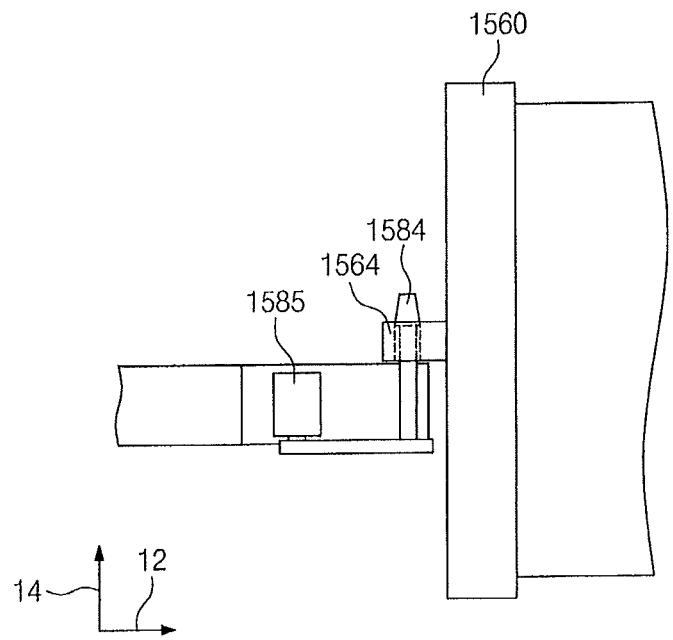
Figure 32:
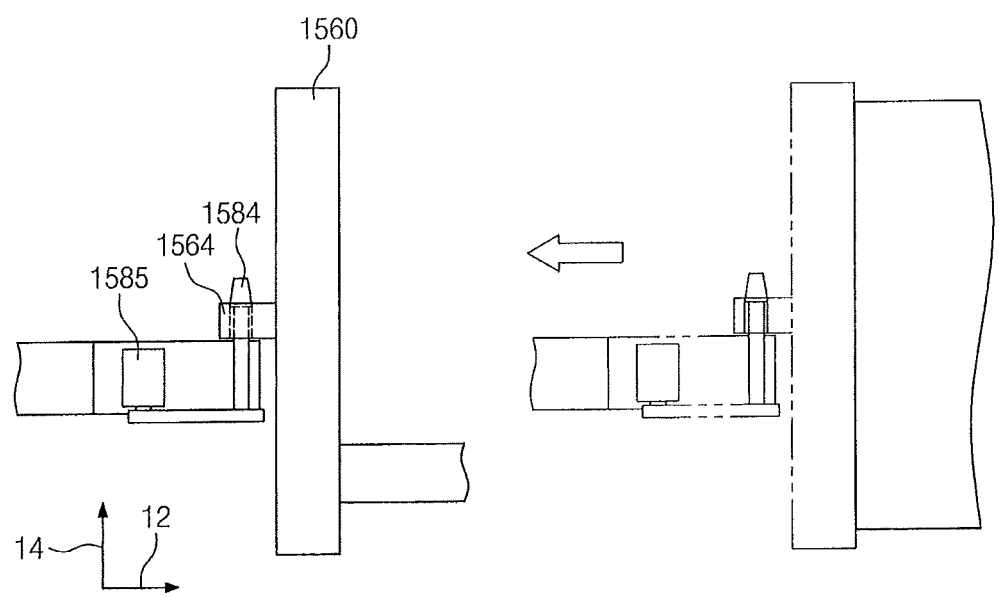

FIGS. 30 to 32 illustrate an exemplary process of opening a door by the door opener in FIG. 23 in accordance with principles of inventive concepts.

Referring to FIGS. 30 and 32, the door 1650 is opened by the transfer robot 1540 when the transfer robot 1540 transfers the array PCB 110 to the test chamber 1620 or takes out the array PCB 110 from the test chamber 1620. First, as shown in FIG. 30, the movable block 1581 is moved from the standby position to the operating position in the first direction 12 by the block driver 1582. Then, as shown in FIG. 31, the latch 1584 is moved in the second direction 14 by the latch driver 1585 to be fit in the doorknob 1564. Then, as shown in FIG. 32, the movable block 1581 is moved from the operating position to the standby position in the first direction 12 by the block driver 1582 and the door 1650 of the test chamber 1620 is opened. Then, the pickup head 1561 puts the array PCB 110 in the chamber 1620 or takes out the array PCB 110 from the test chamber 1620.

In the above description of an exemplary embodiment, the door opener 1580 is mounted on the transfer robot 1540. However, in accordance with principles of inventive concepts, the door opener 1580 may be provided independently of the transfer robot 1540.

Additionally, in the above description of an exemplary embodiment, the door 1650 is opened and closed by the latch 1584 and the doorknob 1564. However, the door 1650 may be opened and closed by various different mechanical mechanisms and, the door 1650 may be automatically opened and closed by an electrical signal, for example.

FIGS. 33 to 36 illustrate the steps of handing over an array PCB from a supply conveyor to a transfer robot in the test handler module in FIG. 14 in an exemplary embodiment in accordance with principles of inventive concepts.

Figure 33:
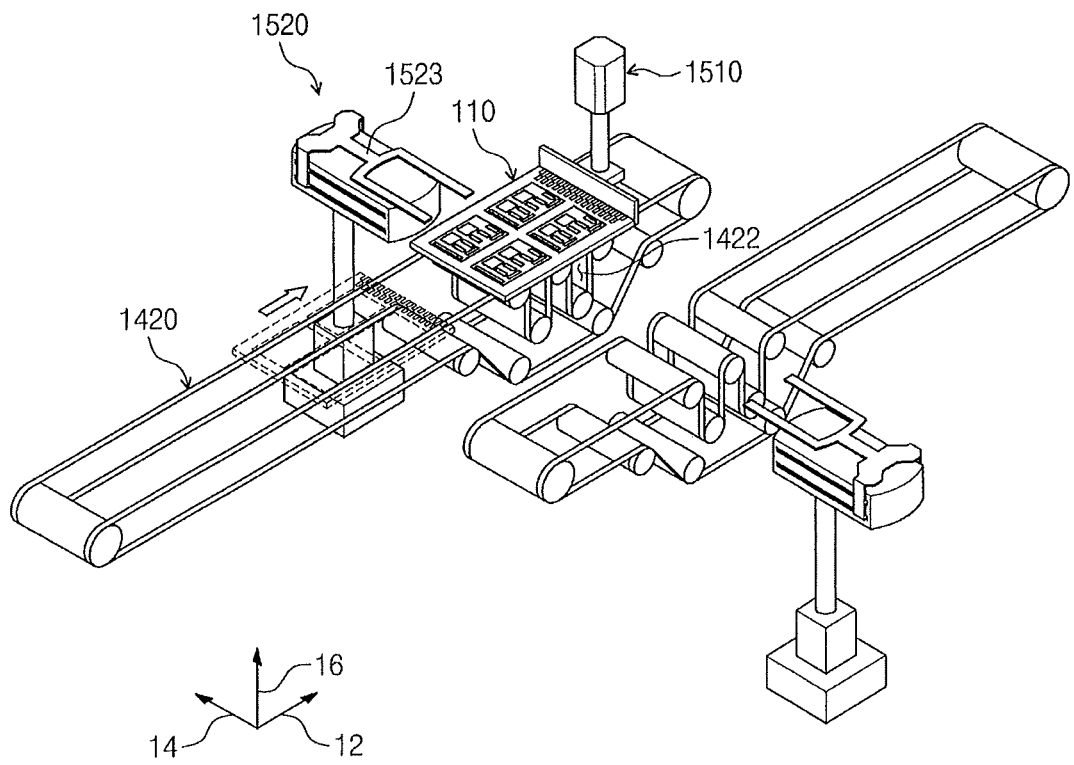
FIGS. 33 to 36 illustrate the steps of handing over an array printed circuit board from a supply conveyor to a transfer robot in the test handler module in FIG. 14.
Figure 34:
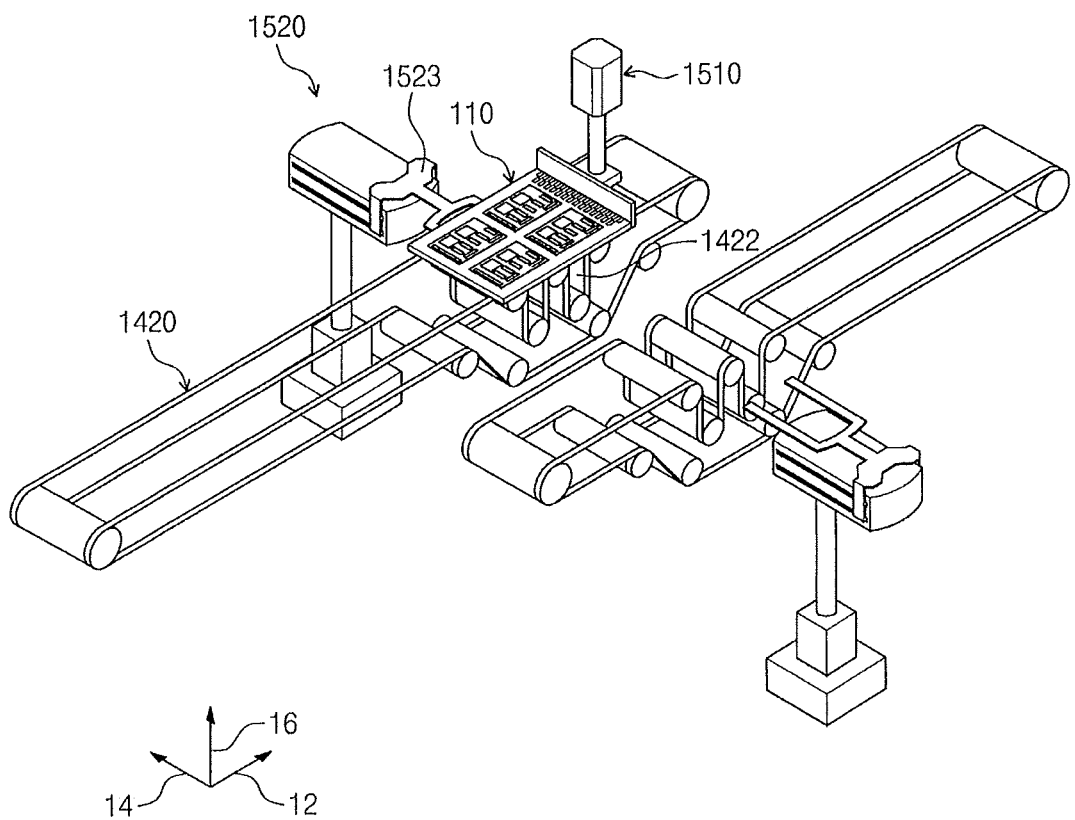
Figure 35:
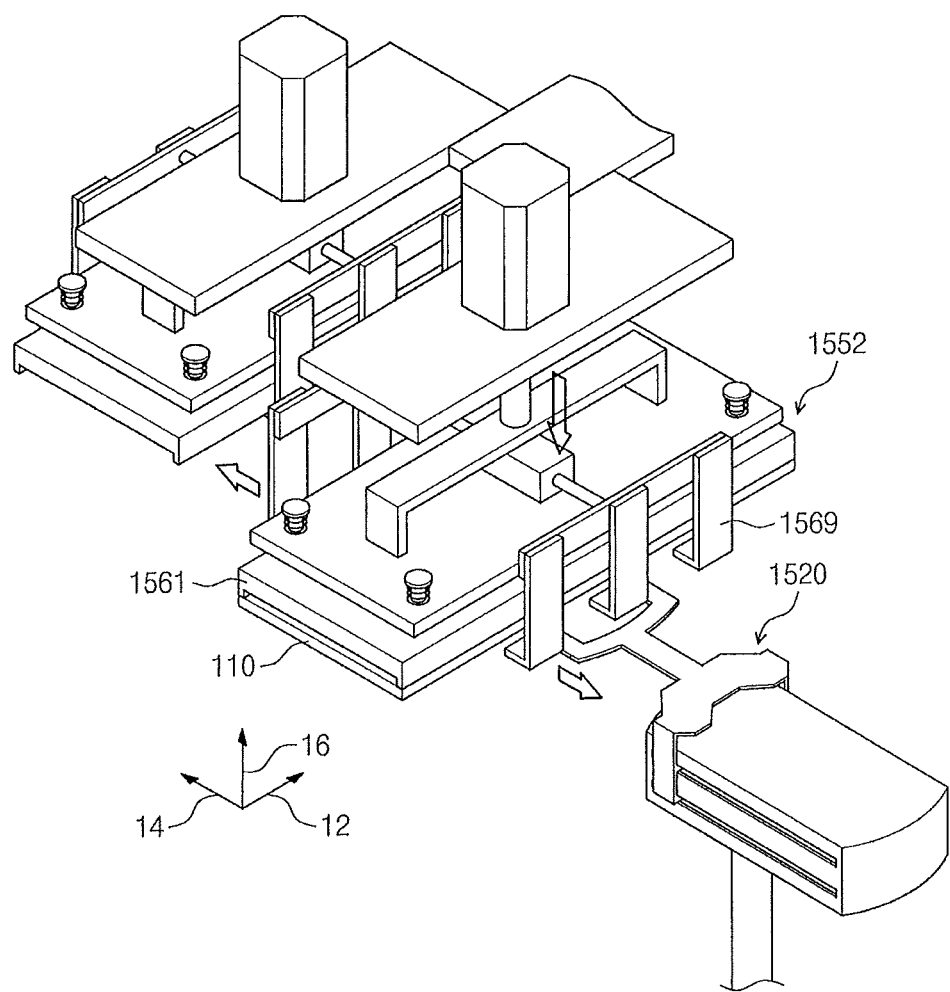

As shown in FIG. 33, the stopper member 1510 moves from a standby position to a blocking position and array PCB 110 is stopped by the stopper member 1510 at the feed conveyor 1420. Then, as shown in FIG. 34, the hand 1523 of the feed lift member 1520 is inserted into the winding portion 1422. As the hand 1523 is elevated, the array PCB 110 is lifted from the feed conveyor 1420. Then, as shown in FIG. 35, the array PCB 110 comes in contact with the pickup head 1561 while the clamp 1569 of the load arm 1552 moves to the standby position. Then, as shown in FIG. 36, the clamp 1569 moves to the fixed position and the feed lift member 1520 is lowered.

Figure 36:
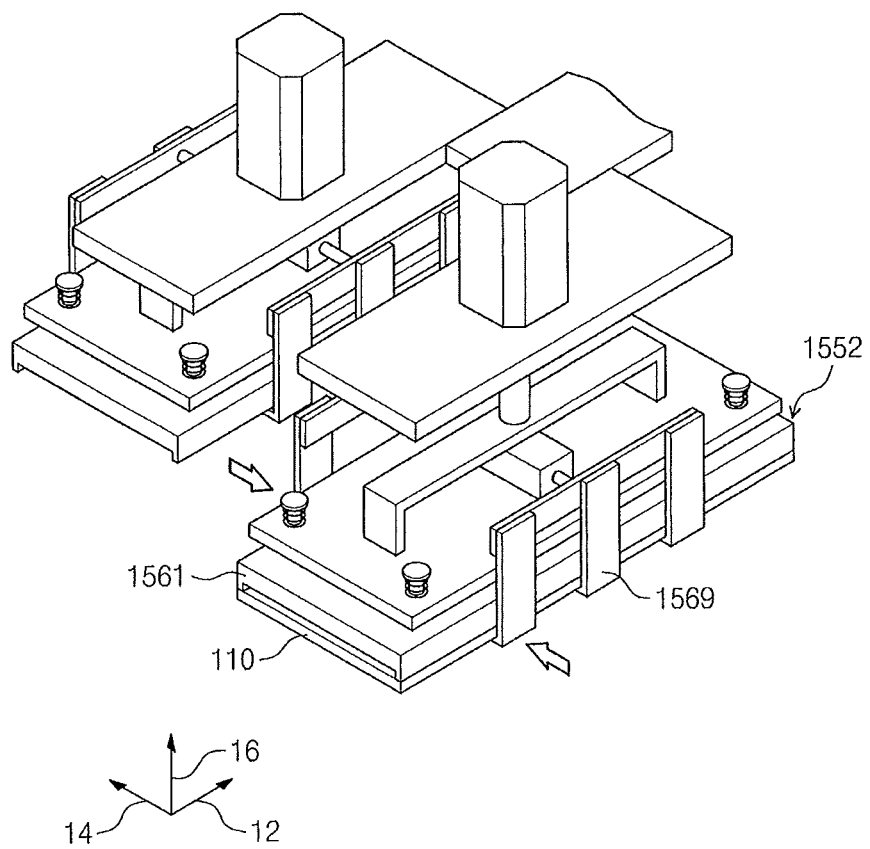

When the array PCB 110 is placed on the conveyor 1430 from the unload arm 1554, the steps of handing over the array PCB 110 in FIG. 36 follow the steps in FIG. 34. In an exemplary embodiment, the array PCB 110 may be placed on the discharge conveyor 1430 from the unload arm 1554 while being handed over to the discharge conveyor 1430 from the unload arm 1554.

Figure 37:
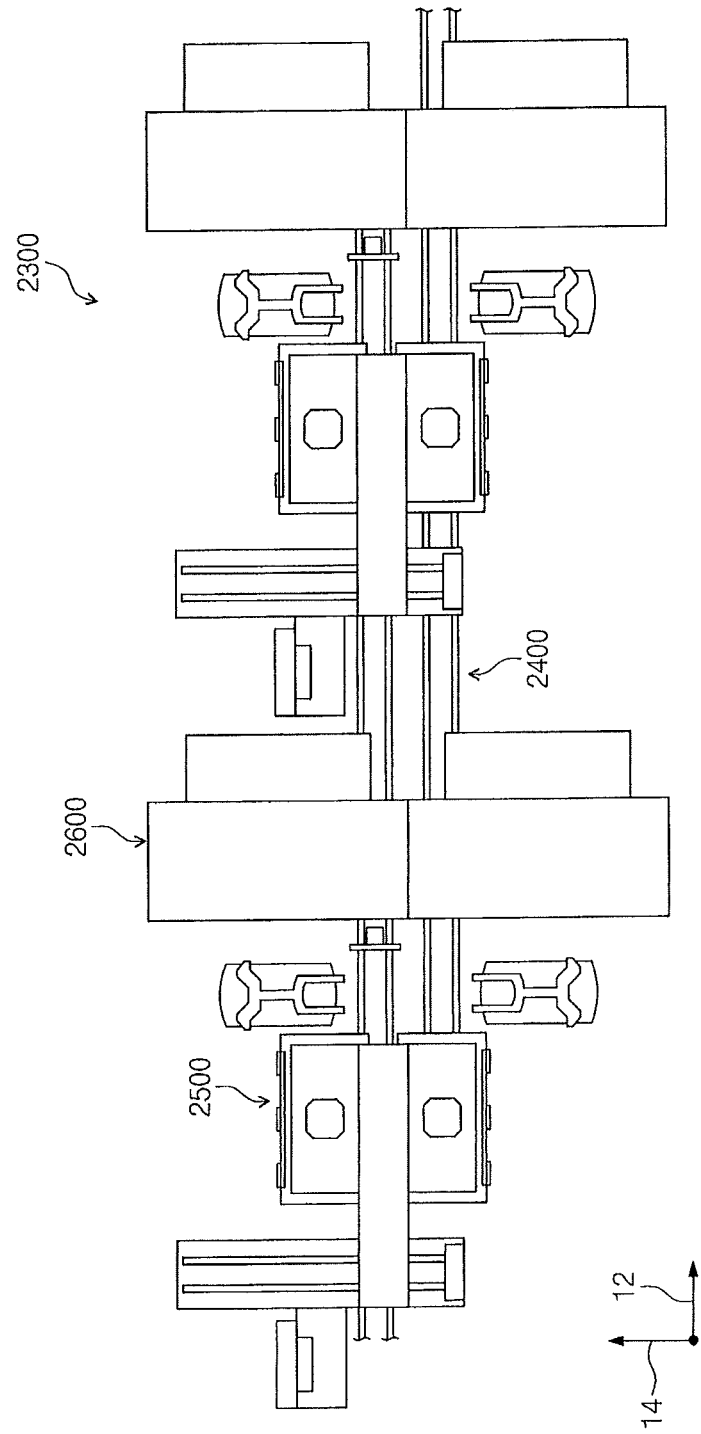
FIG. 37 illustrates another exemplary embodiment of the test handler module in FIG. 14.

FIG. 37 illustrates another exemplary embodiment of a test handler module in accordance with principles of inventive concepts. Test handler module 2300 includes a conveyor unit 2400, a transfer unit 2500, and a plurality of handler units 2600. The conveyor unit 2400 and the transfer unit 2500 may have substantially similar structures and disposition to the conveyor unit 1400 and the transfer unit 1500 in FIG. 14, respectively, for example. In addition, each of the handler units 2600 may have a structure substantially similar to that of the handler unit 1600 in FIG. 14. A plurality of handler units 2600 may extend in first direction 12 and second direction 14. For example, as shown in FIG. 36, two sets of handler units 2600 may be disposed in the first direction 12 and each of the sets may include two handler units 2600 disposed in the second direction 14. In such an embodiment, a transfer unit 2500 is mounted in front of the handler unit 2600 in each of the sets.

Figure 38:
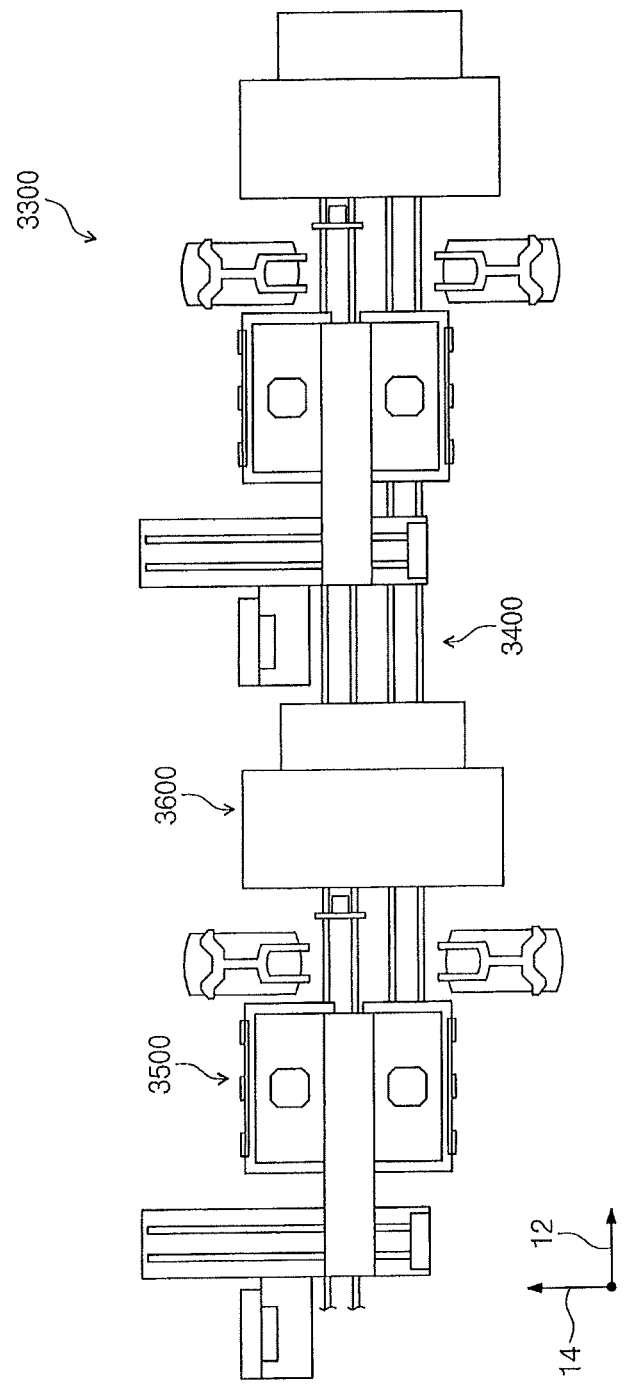
FIG. 38 illustrates another exemplary embodiment of the test handler module in FIG. 14.

FIG. 38 illustrates another exemplary embodiment of a test handler module in accordance with principles of inventive concepts. Test handler module 3300 may include a conveyor unit 3400, a transfer unit 3500, and a plurality of handler units 3600. The conveyor unit 3400 and the transfer unit 3500 may have substantially similar structures and dispositions as the conveyor unit 1400 and the transfer unit 1500 in FIG. 14, respectively, for example. In addition, each of the handler units 3600 may have a structure substantially similar to that of the handler unit 1600 in FIG. 14. A plurality of handler units 3600 are arranged in a row in a first direction. A transfer unit 3500 is mounted in front of each of the handler units 3600.

Figure 39:
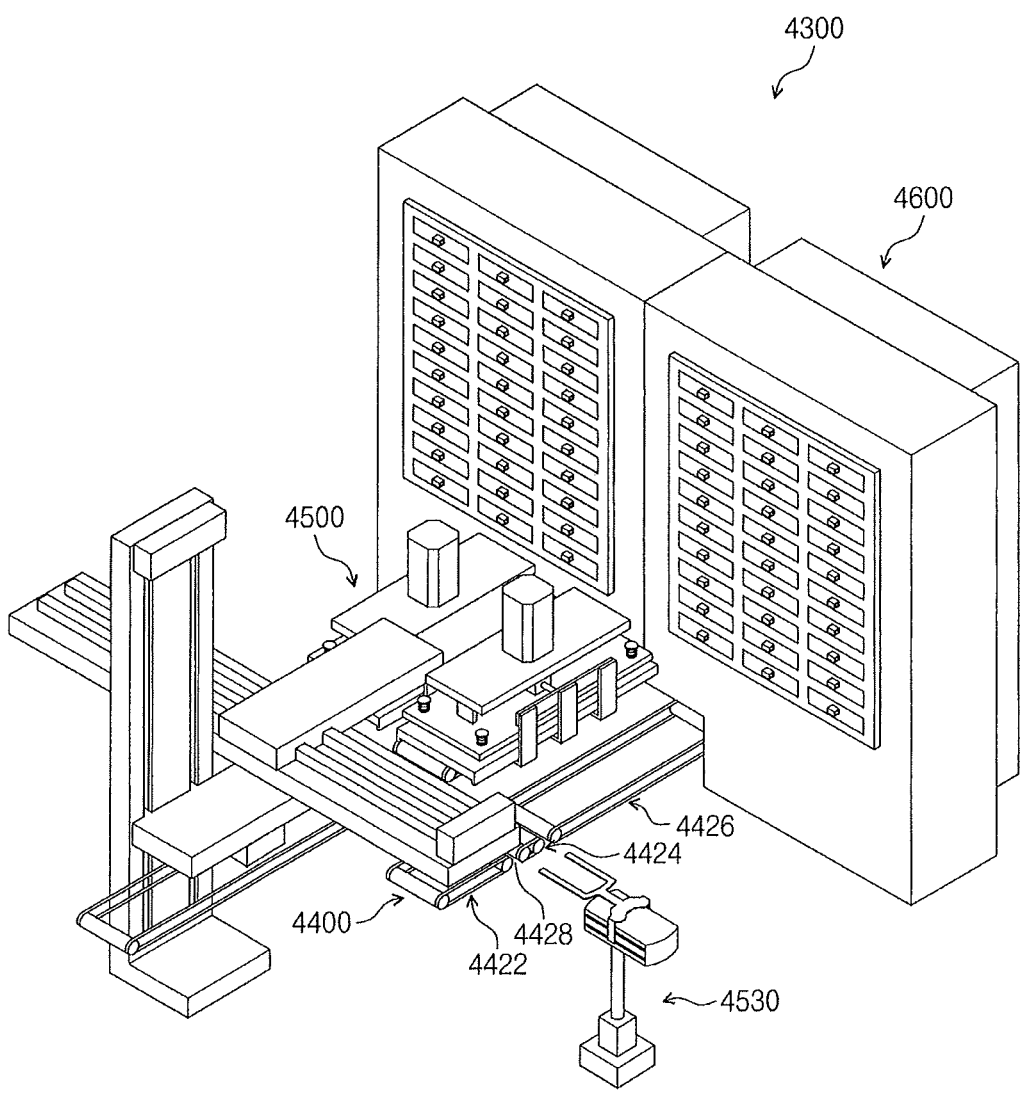
FIG. 39 illustrates another exemplary embodiment of the test handler module in FIG. 14.

FIG. 39 illustrates another exemplary embodiment of a test handler module in accordance with principles of inventive concepts. Test handler module 4300 includes a conveyor unit 4400, a transfer unit 4500, and a plurality of handler units 4600. The transfer unit 4500 and the handler unit 4600 may have substantially similar structures and dispositions as the transfer unit 1500 and the handler unit 1600, respectively. The conveyor unit 4400 includes a feed conveyor 4420 and a discharge conveyor 4430. The feed conveyor 4420 and the discharge conveyor 4430 have a substantially similar structure. The discharge conveyor 4420 includes a front conveyor 4422, an intermediate conveyor 4424, and a back conveyor 4426. The front conveyor 4422, the intermediate conveyor 4424, and the back conveyor 4426 are aligned with each other. Intervals 4428 are formed between the front conveyor 4422 and the intermediate conveyor 4424 and between the intermediate conveyor 4424 and the back conveyor 4426. The space 4428 may be provided as a moving path along which a discharge lift member 1530 moves in the third direction 16, for example.

Figure 40:
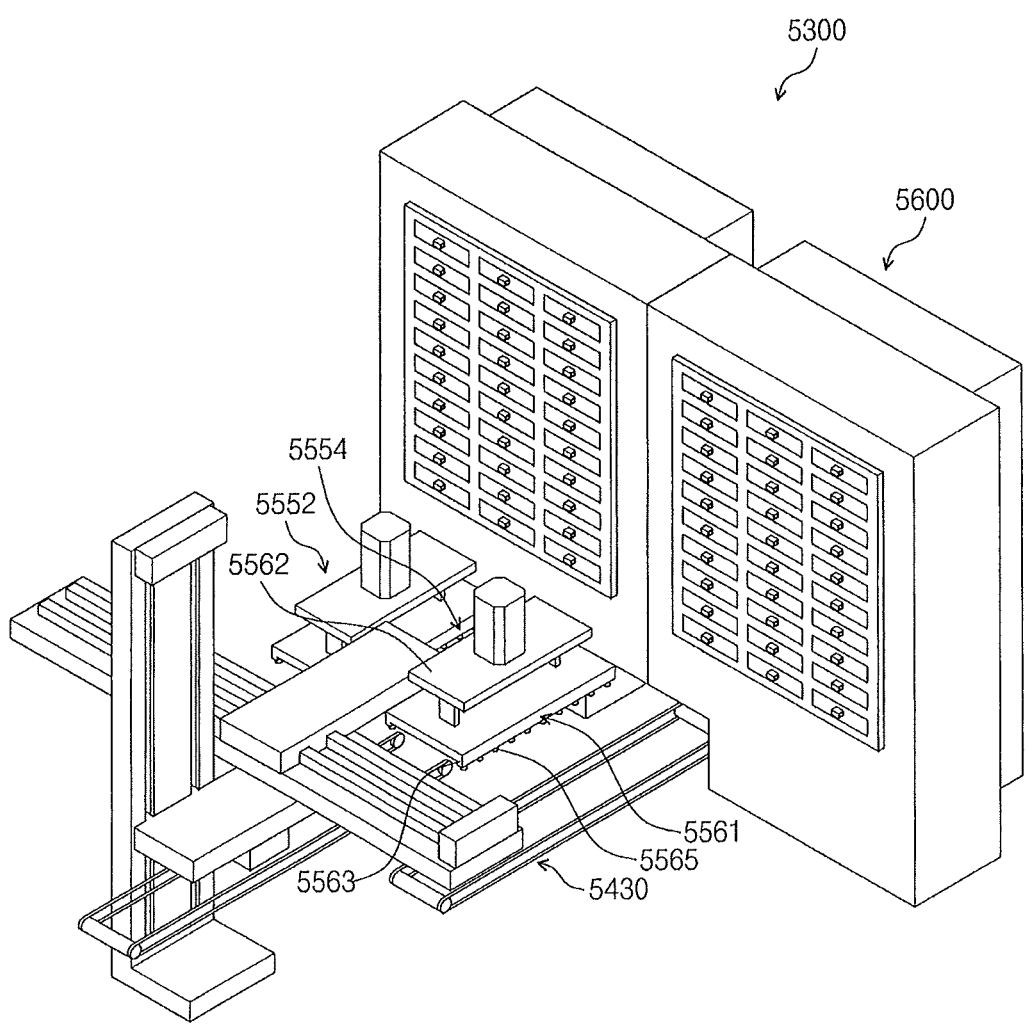
FIG. 40 illustrates another exemplary embodiment of the test handler module in FIG. 14.

FIG. 40 illustrates another exemplary embodiment of a test handler module in accordance with principles of inventive concepts. Test handler module 5300 includes a conveyor unit 5400, a transfer unit 5500, and a plurality of handler units 5600. The handler unit 5600 has a structure substantially similar to that of the handler unit 1600 in FIG. 14. The transfer unit 5500 includes a stopper member 5510 and a transfer robot 5540. The stopper member 5510 may have a similar structure to that of the stopper member 1510 in FIG. 14.

The conveyor unit 5400 includes a feed conveyor 5420 and a discharge conveyor 5430. The feed conveyor 5420 and the discharge conveyor 5430 may have substantially similar structures and dispositions as the feed conveyor 1420 and the discharge conveyor 1430 in FIG. 14, respectively. However, an exemplary embodiment in accordance with principles of inventive concepts, the feed conveyor 5420 and the discharge conveyor 5430 may be provided without the winding portion 1422 in FIG. 14

The transfer robot 5540 supports the array PCB 110 using vacuum. The transfer robot 5540 includes a vertical base 5541, a vertical support 5542, a vertical driver 5543, a horizontal base 5544, a horizontal support 5545, a horizontal driver 5546, a holder member 5550, and a door opener 5580. The vertical base 5541, the vertical support 5542, the vertical driver 5543, the horizontal base 5544, the horizontal support 5545, the horizontal driver 5546, and the door opener 5580 may have substantially similar structures and dispositions as the vertical base 1541, the vertical support 1542, the vertical driver 1543, the horizontal base 1544, the horizontal support 1545, the horizontal driver 1546, and the door opener 1580, respectively. The holder member 5550 includes a load arm 5552 and an unload arm 5554. The load arm 5552 has a structure substantially similar to that of the unload arm 5554. The unload arm 5554 includes a pickup head 5561, a head driver 5562, and a vacuum pad 5563. The pickup head 5561 and the head driver 5562 may have a structure that is substantially similar to those of the pickup head 1561 and the support driver 1566 in FIG. 14, respectively. The head driver 5562 is combined with the pickup head 5561 to move the pickup head 5561 in a third direction 16.

The vacuum pad 5565 is fixedly mounted on a contact member 5563 of the pickup head 5561. In operation, load arm 5552 applies vacuum to the vacuum pad 5563 to directly lift the array PCB 110 from the feed conveyor 5420. The unload arm 5554 removes the vacuum from the vacuum pad 5563 to directly place the array PCB 110 on the discharge conveyor 5430.

Figure 41:
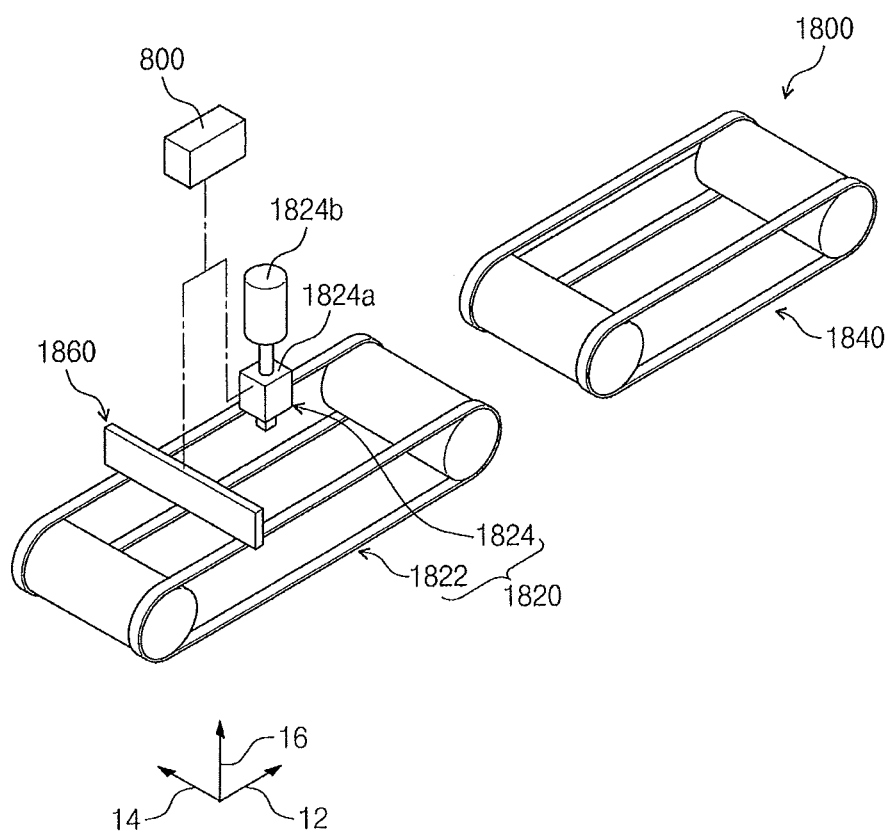
FIG. 41 illustrates an exemplary embodiment of an unloader module in FIG. 3.

FIG. 41 illustrates another exemplary embodiment of an unloader module in accordance with principles of inventive concepts. An unloader module 1800 includes a marking unit 1820 and an output conveyor 1840 extending in a first direction 12.

The marking unit 1820 is disposed between a test handler module 1300 and the output conveyor 1840. The marking unit 1820 may form a test mark, corresponding to a good (passed) PCB or a bad (failed) PCB, at an array PCB 110 according to results of a test conducted at the test handler module 1300. The marking unit 1820 includes an unload conveyor 1822 and a making member 1824.

The unload conveyor 1822 is aligned with the discharge conveyor 1430 of the test handler module 1300 and directly receives the array PCB 110 from the discharge conveyor 1430. The marking member 1824 is disposed over the unload conveyor 1822 and forms a test mark on the array PCB 110. The marking member 1824 includes a marker 1824a and a driver 1824b. The marker 1824a prints a mark on the array PCB 110. The driver 1824b moves the marker 1824a in a third direction. The driver 1824b may include a cylinder, for example.

A reader 1860 may be disposed between the marking unit 1820 and the test handler module 1300, for example. The reader 1860 obtains test data on the array PCB 110 discharged through an unload conveyor 1824 and transmits the test data to a controller 800. The marking member 1824 is electrically connected to the controller 800 and receives, from the controller 800, test data indicating whether a corresponding array PCB 110 passed a test.

The output conveyor 1840 is aligned with the unload conveyor 1822. The output conveyor 1840 receives the array PCB 110 from the unload conveyor 1822 and directly conveys the array PCB 110 to a second apparatus 600.

Unlike the above-described example, in another exemplary embodiment in accordance with principles of inventive concepts, the output conveyor 1840 and the unload conveyor 1822 may be integrally provided as a single conveyor at the unloader module 1800.

Figure 42:
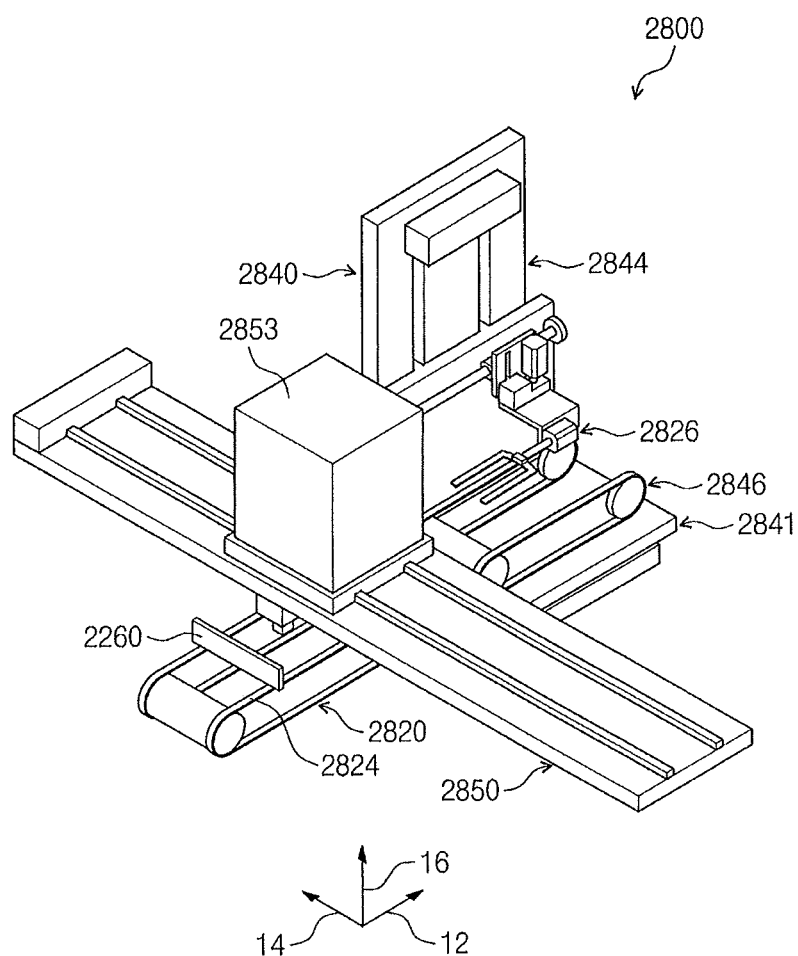
FIG. 42 illustrates another exemplary embodiment of an unloader module in FIG. 3.

FIG. 42 illustrates another exemplary embodiment of an unloader module in accordance with principles of inventive concepts. Unloader module 2800 includes a marking unit 2820, an output unit 2840, and a buffer magazine unit 2850. The marking unit 2820 and the output unit 2840 are sequentially provided in a first direction. The marking unit 2820 may have a structure substantially similar to that of the marking unit 1820 in FIG. 40. The output unit 2840 includes a holder 2841, an elevation member 2844, an output conveyor 2846, and a gripper member 2826. The holder 2841, the elevation member 2844, the output conveyor 2846, and the gripper member 2826 may have structures and dispositions similar to that of the input holder 1221, the input elevation member 1224, the carry-in conveyor 1225, and the gripper member 1226, respectively.

When viewed from the top, an output conveyor 2846 is aligned with the unload conveyor 2824. The buffer magazine unit 2850 may have a structure similar to that of the buffer magazine unit 1250 in FIG. 4. The buffer magazine unit 2850 is disposed adjacent to the output unit 2840. The buffer magazine unit 2850 may be located over the unload conveyor 2824, for example. In operation, gripper member 2826 loads an array PCB 110 determined to have failed (to be bad) at the test handler module 1300 into a buffer magazine 2853.

In the above-described examples, an unloader module is provided with a marking unit. However, the unloader module in accordance with principles of inventive concepts may be provided without a marking unit and, optionally, a second apparatus 600 may include a marking unit, for example.

Figure 43:
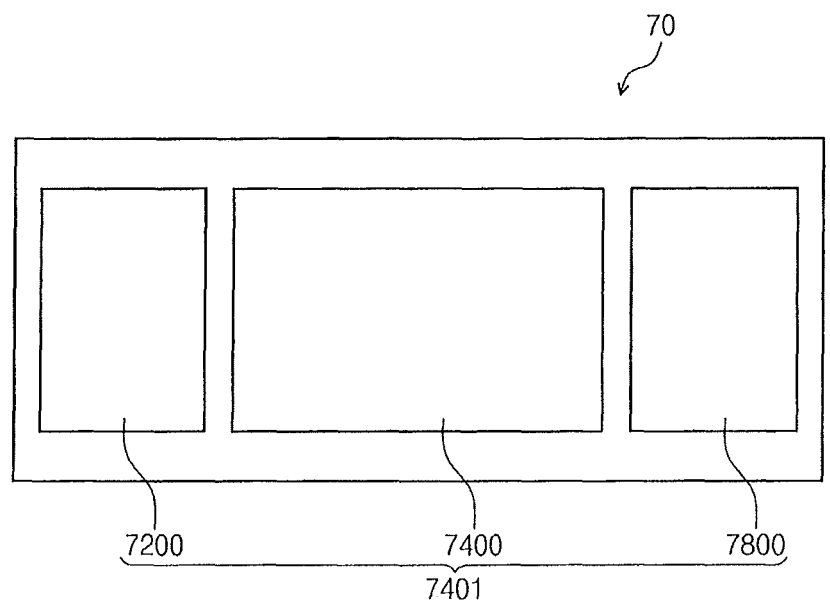
FIG. 43 illustrates another exemplary embodiment of a substrate manufacturing apparatus.
Figure 44:
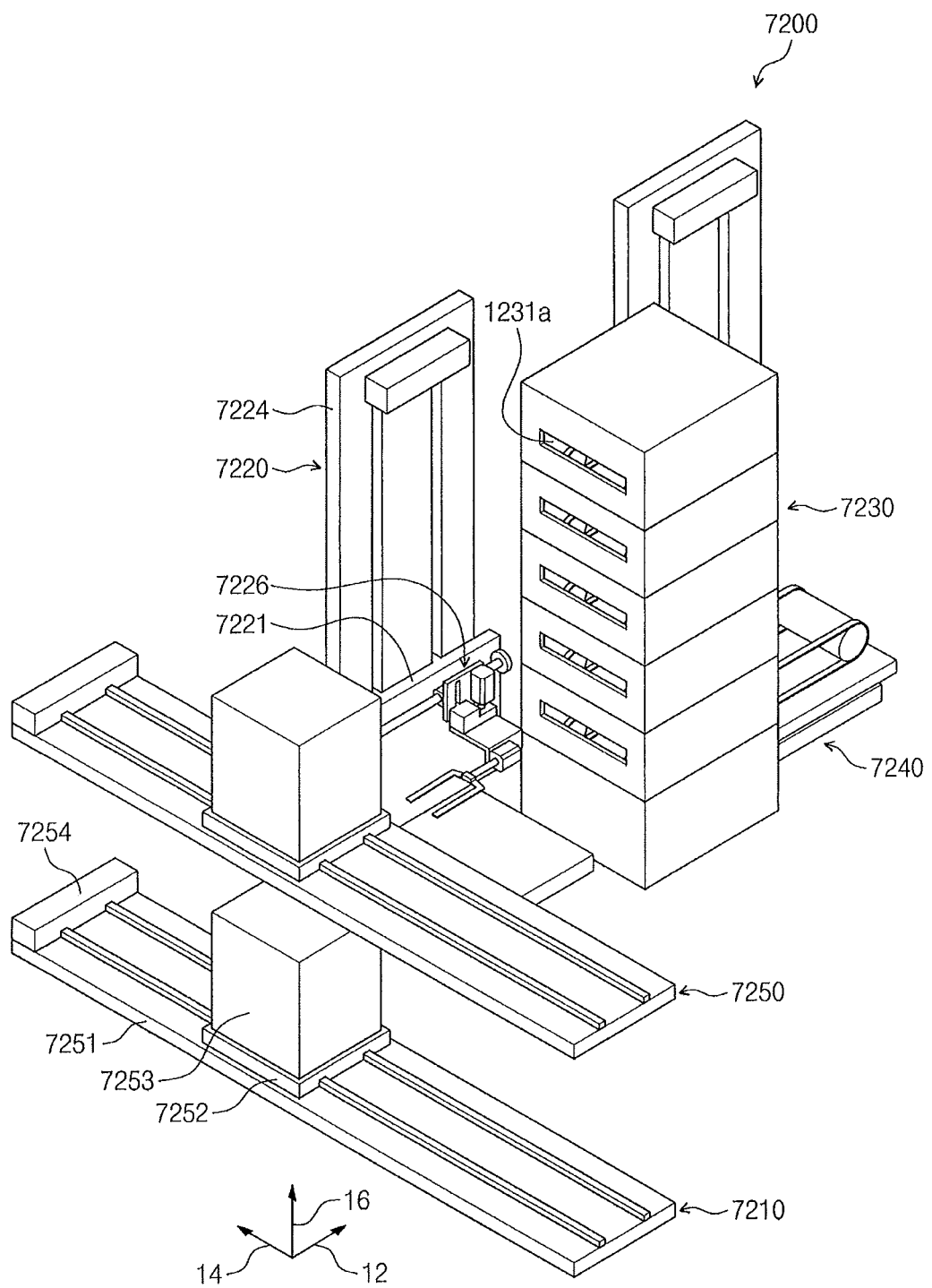
FIG. 44 illustrates an exemplary embodiment of a loader module in FIG. 43.
Figure 45:
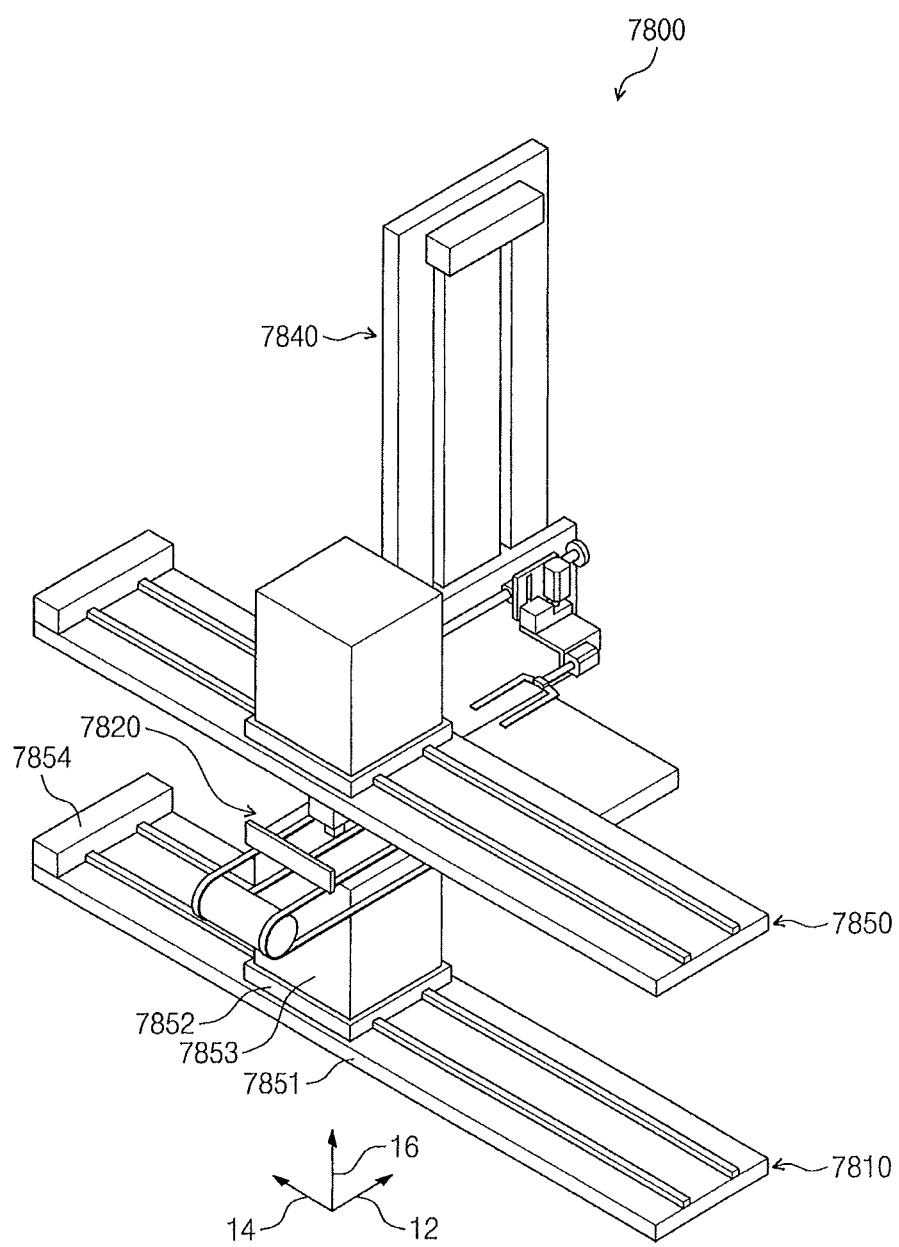
FIG. 45 illustrates an exemplary embodiment of an unloader module in FIG. 43.

FIG. 43 illustrates another example of another exemplary embodiment of a substrate manufacturing facility, or apparatus, in accordance with principles of inventive concepts. FIG. 44 illustrates an exemplary embodiment of a loader module in FIG. 43, and FIG. 45 illustrates an exemplary embodiment of an unloader module in FIG. 43.

Referring to FIG. 43, a substrate manufacturing apparatus 70 includes a test apparatus 7401 which, in turn, includes a loader module 7200, a test handler module 7400, and an unloader module 7800. The test handler module 7400 may have a structure that is substantially similar to that of the test handler module 1300 in FIG. 14.

Referring to FIG. 44, the loader module 7200 includes an input magazine unit 7201, an input unit 7220, an electric test unit 7230, an output unit 7240, and a buffer magazine unit 7250. The electric test unit 7230, the output unit 7240, and the buffer magazine unit 7250 may have structures and dispositions substantially similar to those of electric test unit 1230, the output unit 1420, and the buffer magazine unit 1250 in FIG. 4, respectively, for example.

The input magazine unit 7210 stores an array PCB 110 to be tested by the test apparatus 7401. The input magazine unit 7210 includes a base 7251, a support block 7252, an input magazine 7253, and a driver 7254. The base 7251, the support block 7252, the input magazine 7253, and the driver 7254 may have structures substantially similar to those of the base 1251, the support block 1252, the buffer magazine 1253, and the driver 1254 of the buffer magazine unit 1250 in FIG. 9, respectively. The input magazine unit 7210 may be vertically stacked with the buffer magazine unit 7250, for example.

An input unit 7220 includes an input holder 7221, an input elevation member 7224, and a gripper member 7226. The input holder 7221, the input elevation member 7224, and the gripper member 7226 may have structures and dispositions substantially similar to those of side plate 1223 of the input holder 1221, the input elevation member 1224, and the gripper member 1226 in FIG. 10, respectively. The gripper member 7226 is provided to place an array PCB 110 into, or remove it from, the input magazine 7253 and the buffer magazine 7253.

Referring to FIG. 45, the unloader module 7800 includes an output magazine unit 7810, a marking unit 7820, an output unit 7840, and a buffer magazine unit 7850. The marking unit 7820, the output unit 7840, the buffer magazine unit 7850 may have structures substantially similar to those of the marking unit 2820, the output unit 2840, and the buffer magazine unit 2850 in FIG. 42, respectively.

The output magazine unit 7810 stores an array PCB 110 determined to be good (to have passed) at the test handler module 7400. The output magazine unit 7810 includes a base 7851, a support block 7852, an output magazine 7853, and a driver 7854. The base 7851, the support block 7852, the output magazine 7853, and the driver 7854 may have structures and dispositions substantially similar to those of the base 7251, the support block 7252, the input magazine 7253, and the driver 7254 of the input magazine unit 7210 in FIG. 43, respectively. The output magazine unit 7810 may be vertically stacked with the buffer magazine unit 7250, for example.

The output unit 7840 may operate to place an array PCB 110 into, or remove it from, the buffer magazine of the buffer magazine unit 7850 and the output magazine 7853 of the output magazine unit 7810.

Figure 46:
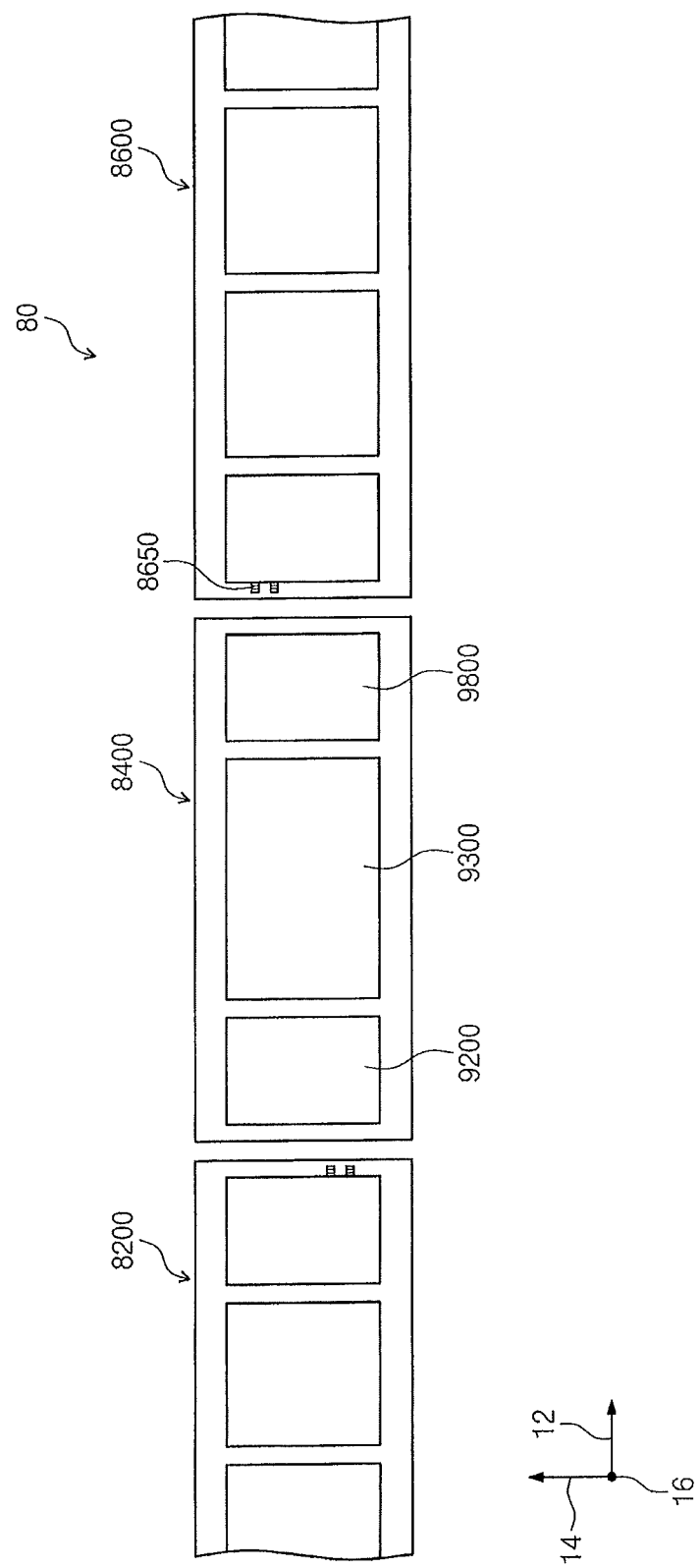
FIG. 46 illustrates another exemplary embodiment of a substrate manufacturing apparatus.
Figure 47:
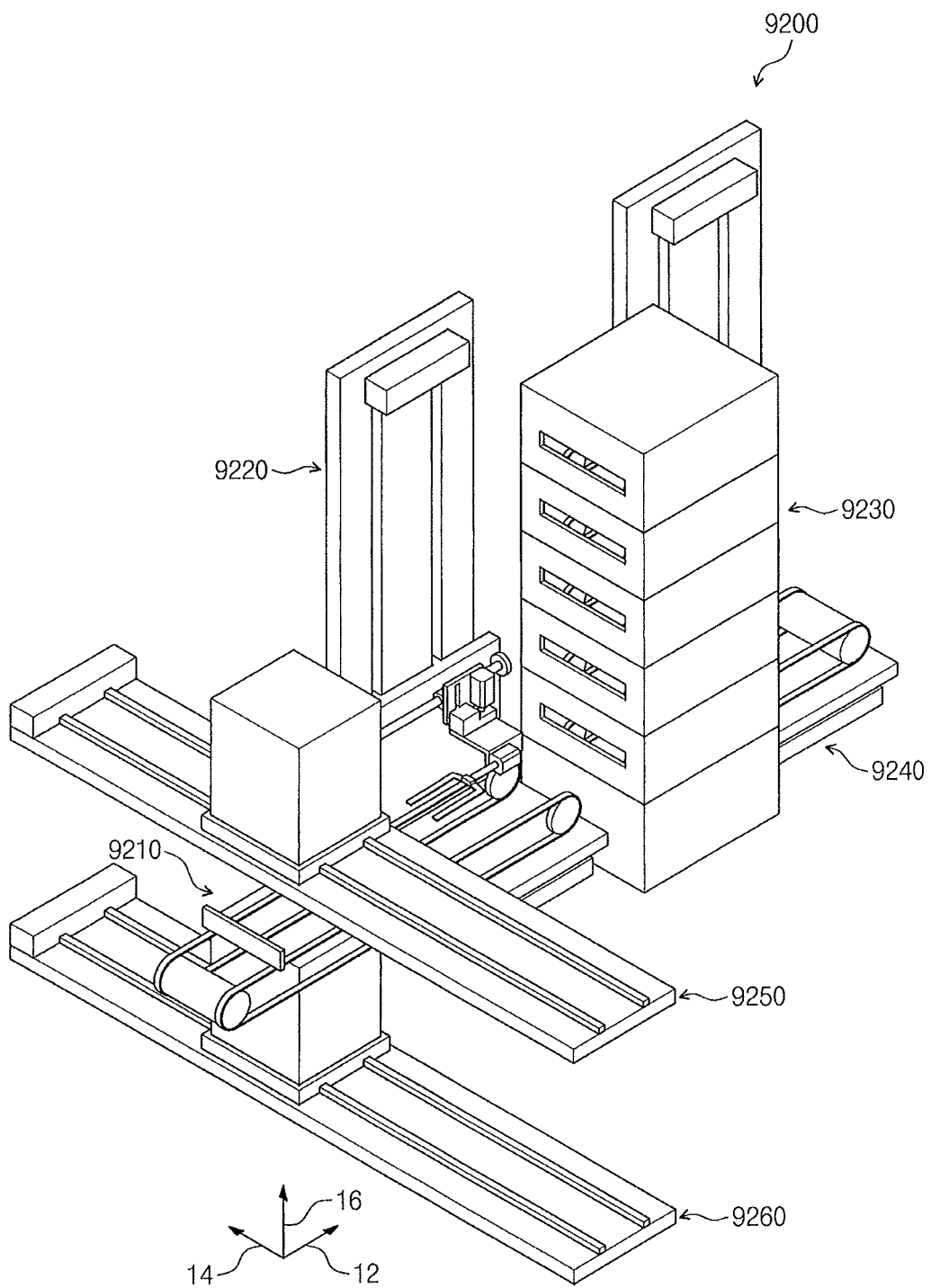
FIG. 47 illustrates an exemplary embodiment of a loader module in FIG. 46.
Figure 48:
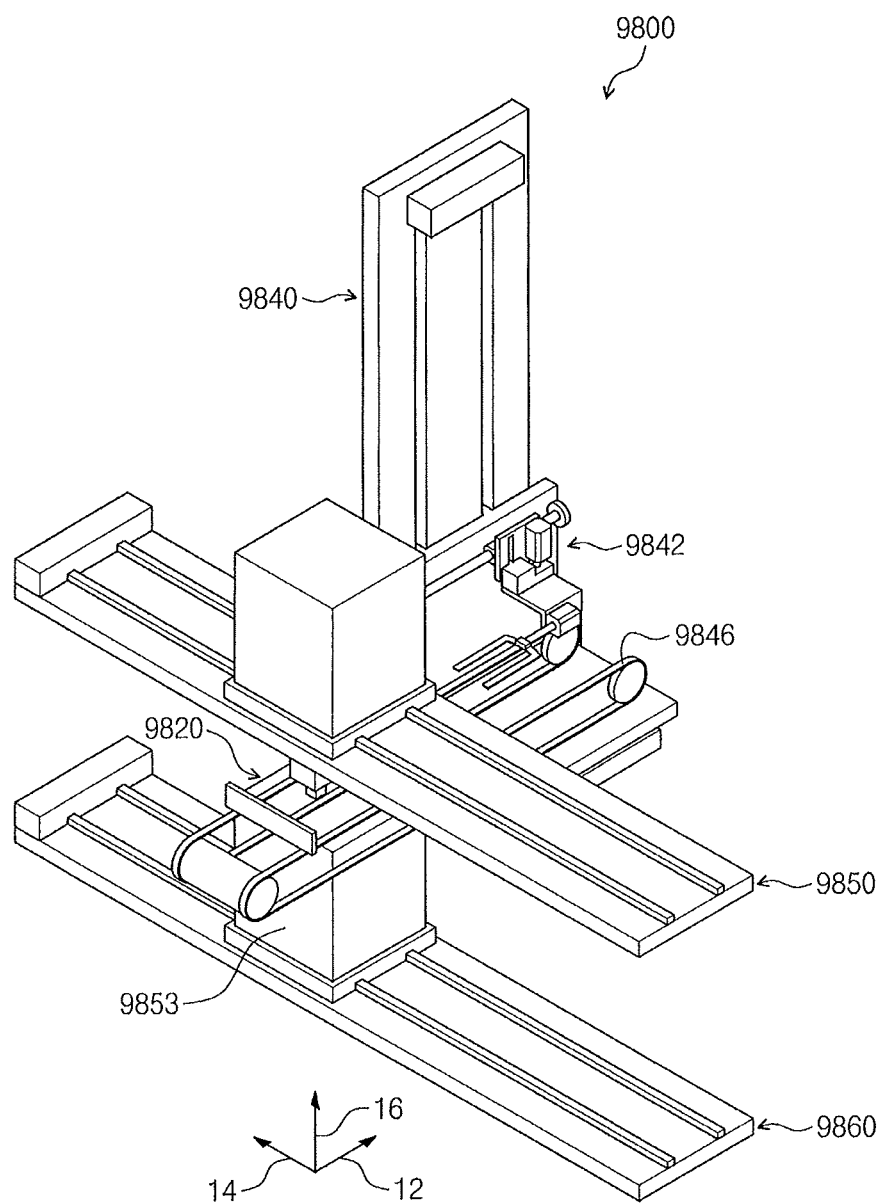
FIG. 48 illustrates an exemplary embodiment of an unloader module in FIG. 46

FIG. 46 illustrates another exemplary embodiment of a substrate manufacturing apparatus in accordance with principles of inventive concepts. FIG. 47 illustrates an exemplary embodiment of a loader module in FIG. 46, and FIG. 48 illustrates an exemplary embodiment of an unloader module in FIG. 46

Referring to FIG. 46, a substrate manufacturing apparatus 80 includes a first apparatus 8200, a test apparatus 8400, and a second apparatus 8600. The first apparatus 8200 and the second apparatus 8600 may have structures that are substantially similar to those of the first apparatus 200 and the second apparatus 600 in FIG. 3, respectively. The test apparatus 8400 includes a loader module 9200, a test handler module 9300, and an unloader module 9800. The test handler module 9300 may have a structure substantially similar to that of the test handler module 1300 in FIG. 14.

Referring to FIG. 47, the loader module 9200 includes an input conveyor 9210, an input unit 9220, an electric test unit 9230, an output unit 9240, a buffer magazine unit 9250, and an input magazine unit 9260. The input conveyor 9210, the input unit 9220, the electric test unit 9230, the output unit 9240, and the buffer magazine unit 9250 may have structures and dispositions substantially similar to those of the input conveyor 1210, the input unit 1220, the electric test unit 1230, the output unit 1240, and the buffer magazine unit 1250 in FIG. 4, respectively, for example.

In operation, input magazine unit 9260 stores an array PCB 110 that has not yet been subjected to a test process. Thus, the array PCB 110 may be fed into the test apparatus 8400 from the first apparatus 8200 through an input conveyor 9210 or fed into the test apparatus 8400 by the input magazine unit 9260, for example. The input magazine unit 9260 may include a structure substantially similar to that of the input magazine unit 7210 in FIG. 43, for example.

Referring to FIG. 48, the unloader module 9800 includes a marking unit 9820, an output unit 9840, a buffer magazine unit 9850, and an output magazine unit 9860. The marking unit 9820 and the buffer magazine unit 9850 may include structures and dispositions substantially similar to those of the marking unit 2820 and the buffer magazine unit 2850 in FIG. 42, respectively. The output unit 9840 may include a structure substantially similar to that of the input unit 1220 in FIG. 4. The output magazine unit 9860 may include a structure substantially similar to that of the output magazine unit 7810 in FIG. 45. The buffer magazine unit 9850 and the output magazine unit 9860 may be vertically stacked. An array PCB 110 determined to be good (to have passed the electronic test) at the test handler unit 9300 may be discharged to the second apparatus 8600 through the output conveyor 9846 or stored in the output magazine 9853 by a gripper member 9842, for example.

In foregoing embodiments, a substrate manufacturing apparatus 10 includes a loader module provided with an electric test unit 1230. However, independently of a test handler module 1300, the electric test unit 1230 may not be provided and a contact test may be performed at the test handler module 1300, together with the electric test unit 1230. Optionally, the contact test may not be performed in the substrate manufacturing apparatus 10. In such an embodiment, a loader module may be provided without the electric test unit 1230, an input unit 1220, and an output unit 1240 and an array PCB 110 may be directly conveyed to a substrate test unit from an input conveyor 1210.

In foregoing embodiments, a conveyor unit includes a feed conveyor and a discharge conveyor. However, a handler conveyor member may include a feed conveyor and the feed conveyor may be provided to be aligned with a discharge conveyor and an unload conveyor, for example.

In foregoing embodiments, a substrate is an array printed circuit board (array PCB). However, inventive concepts are not limited thereto and the substrate may be a unit substrate. Additionally, in foregoing embodiments, it the unit substrate is a solid-state drive (SSD). However, inventive concepts are not limited thereto and the unit substrate may be a memory module on which nonvolatile memory devices are mounted, a graphic card, an audio card, a LAN card or a main board such as a mobile device, for example.

What is claimed is:

1. A substrate manufacturing method comprising:
   assembling a plurality of integral unit substrates on a substrate comprising a test terminal in a front edge region of the substrate, wherein each of the plurality of integral unit substrates is electrically connected to the test terminal;
   moving the substrate such that the substrate is loaded into a test chamber;
   performing a test upon the plurality of integral unit substrates on the substrate in the test chamber, wherein the plurality of integral unit substrates is tested concurrently;
   unloading the substrate tested inside the test chamber; and
   separating the plurality of integral unit substrates from one another after performing the test,
   wherein the plurality of integral unit substrates is arranged in one or more rows of at least two.

2. The substrate manufacturing method of claim 1, wherein the assembling includes mounting an electronic component on each of the plurality of integral unit substrates, and reflowing the electronic component on each of the plurality of integral unit substrates.

3. The substrate manufacturing method of claim 1, wherein the substrate is an array printed circuit board where the plurality of integral unit substrates is formed, and
   wherein each of the plurality of integral unit substrates is electrically connected to the test terminal through lines formed on the array printed circuit board.

4. The substrate manufacturing method of claim 1, wherein moving the substrate into the test chamber includes lifting the substrate such that the substrate is disposed inside a test chamber to insert the test terminal into a socket of the test chamber.

5. The substrate manufacturing method of claim 1, further comprising the step of marking each of the plurality of integral unit substrates to indicate whether it passed the test.

6. The substrate manufacturing method of claim 1, wherein the moving the substrate into the test chamber is carried out through a feed conveyor, and
wherein the unloading the substrate is carried out through a discharge conveyor.

7. The substrate manufacturing method of claim 6, wherein the feed conveyor and the discharge conveyor are provided such that they extend parallel to a first direction, and
wherein the feed conveyor and the discharge conveyor are spaced apart from each other in a second direction orthogonal to the first direction when viewed from the top.

8. The substrate manufacturing method of claim 1, wherein the step of assembling the plurality of integral unit substrates includes the step of loading a controller on each of the plurality of integral unit substrates,
wherein the step of assembling the plurality of integral unit substrates includes the step of loading non-volatile memory on each of the plurality of integral unit substrates.

9. The substrate manufacturing method of claim 1, wherein some of the integral unit substrates have a different type than others of the integral unit substrates, and
wherein the integral unit substrates belonging to one row have a same type.

10. A substrate manufacturing method, comprising:
providing a plurality of substrates comprising a test terminal,
forming a plurality of integral unit substrates onto each of the plurality of substrates, wherein the plurality of integral unit substrates is arranged in one or more rows of at least two;
placing each of the plurality of substrates inside a plurality of test chambers to concurrently perform a test process on the plurality of substrates inside each of the plurality of test chambers;
moving the plurality of substrates away from the plurality of test chambers; and
separating the plurality of integral unit substrates from one another after performing the test,
wherein the plurality of integral unit substrates on one of the plurality of substrate disposed are concurrently tested at the performing the test process.

11. The substrate manufacturing method of claim 10, wherein the plurality of integral unit substrates are electrically connecting to the test terminal.

12. The substrate manufacturing method of claim 11, wherein the plurality of integral unit substrates is connected to a socket of the test chamber through the test terminal in performing the test process.

13. The substrate manufacturing method of claim 10, wherein each of the plurality of substrates is an array printed circuit board where the plurality of integral unit substrates is formed,
wherein the test terminal is formed in a front edge region of the array printed circuit board, and
wherein each of the plurality of integral unit substrates is electrically connected to the test terminal through lines formed on the array printed circuit board.

14. The substrate manufacturing method of claim 10, wherein the placing each of the plurality of substrates inside the plurality of test chamber is carried out through a feed conveyor, and the moving the plurality of substrates away from the plurality of test chamber is carried out through a discharge conveyor,
wherein the feed conveyor and the discharge conveyor are provided such that they extend parallel to a first direction, and
wherein the feed conveyor and the discharge conveyor are spaced apart from each other in a second direction orthogonal to the first direction when viewed from the top.

15. The substrate manufacturing method of claim 14, wherein each of the test chambers has an opening in a front face,
wherein the placing each of the plurality of substrates includes:
lifting one of the plurality of substrates at the feed conveyor;
completely disposing the lifted one of the plurality of substrates in one of the test chambers through the opening of the one of the test chambers;
inserting the test terminal of the one of the plurality of substrates disposed in the one of the test chambers into a socket of the one of the test chambers; and
closing the opening of the one of the test chambers after placing the one of the plurality of substrates in the one of the test chambers.

16. A substrate manufacturing method, comprising:
assembling a plurality of integral unit substrates on a substrate, each of the plurality of integral unit substrates comprising an electronic component and electrically connecting to a test terminal in an edge region of the substrate, and wherein the plurality of integral unit substrates is arranged in one or more rows of at least two;
conveying the substrate into a test chamber to insert the test terminal into a socket of the test chamber;
performing a test process on the substrate inside the test chamber;
conveying the substrate away from the test chamber after performing the test process; and
separating the plurality of integral unit substrates from one another after performing the test,
wherein the plurality of integral unit substrates is tested concurrently through the test terminal in performing the test process.

17. The substrate manufacturing method of claim 16, wherein the edge region of the substrate providing the test terminal is a front edge region of the substrate, and
wherein each of the plurality of integral unit substrates is electrically connected to the test terminal through lines formed on the substrate.

18. The substrate manufacturing method of claim 16, wherein the substrate is provided in plurality,
wherein the substrates have the same length of horizontal sides, and
wherein some of the substrates have different lengths of vertical sides.

19. The substrate manufacturing method of claim 16, wherein the substrate is conveyed into the test chamber by a feed conveyor, and is conveyed away from the test chamber by a discharge conveyor,
wherein the feed conveyor and the discharge conveyor are provided such that they extend parallel to a first direction, and
wherein the feed conveyor and the discharge conveyor are spaced apart from each other in a second direction orthogonal to the first direction when viewed from the top.

20. The substrate manufacturing method of claim 19, wherein some of the integral unit substrates have a different type than others of the integral unit substrates, and
wherein the integral unit substrates belonging to one row have a same type.

\* \* \* \* \*